US012763112B2

(12) United States Patent
Kim et al.

(10) Patent No.: US 12,763,112 B2
(45) Date of Patent: Oct. 13, 2026

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Junsuk Kim, Suwon-si (KR); Kihoon Jang, Suwon-si (KR); Changsun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 18/753,159

(22) Filed: Jun. 25, 2024

(65) Prior Publication Data

US 2025/0201280 A1 Jun. 19, 2025

(30) Foreign Application Priority Data

Dec. 14, 2023 (KR) ........................ 10-2023-0181989

(51) Int. Cl.
*G11C 5/06* (2006.01)
*G11C 5/02* (2006.01)
(Continued)

(52) U.S. Cl.
CPC .............. *G11C 5/063* (2013.01); *G11C 5/025* (2013.01); *G11C 16/0483* (2013.01);
(Continued)

(58) Field of Classification Search
CPC ..... G11C 5/063; G11C 5/025; G11C 16/0483; H01L 25/0657; H01L 2225/06506; H01L 23/5226; H01L 23/5283; H10B 43/10; H10B 43/40; H10B 80/00; H10B 43/50; H10B 43/27; H10B 41/20; H10B 41/35; H10B 41/41; H10B 43/20; H10B 43/35
(Continued)

(56) References Cited

U.S. PATENT DOCUMENTS

| | | | |
|---|---|---|---|
| 9,230,904 | B2 | 1/2016 | Eun et al. |
| 10,991,714 | B2 | 4/2021 | Kim et al. |

(Continued)

OTHER PUBLICATIONS

Extended European Search Report dated May 27, 2025 issued in corresponding European Patent Application No. 24218464.6.

*Primary Examiner* — Tha-O H Bui
(74) *Attorney, Agent, or Firm* — Morgan, Lewis & Bockius LLP

(57) ABSTRACT

A semiconductor device includes first structure including first and second memory blocks. The first memory block has a first connection region, a first memory cell array region, and a second connection region. The second memory block has a third connection region, a second memory cell array region, and a fourth connection region. First gate electrodes of the first memory block include first word lines having first word line pads disposed in the second connection region, and a first upper gate line having a first upper gate pad disposed in the first connection region and disposed on the first word lines. Second gate electrodes of the second memory block include second word lines having second word line pads disposed in the third connection region, and a second upper gate line having a second upper gate pad disposed in the fourth connection region and disposed on the second word lines.

20 Claims, 32 Drawing Sheets

(51) Int. Cl.

| | |
|---|---|
| ***G11C 16/04*** | (2006.01) |
| ***H10B 43/10*** | (2023.01) |
| ***H10B 43/40*** | (2023.01) |
| ***H10B 80/00*** | (2023.01) |
| ***H10W 90/00*** | (2026.01) |

(52) U.S. Cl.
CPC ............. *H10B 43/10* (2023.02); *H10B 43/40* (2023.02); *H10B 80/00* (2023.02); *H10W 90/00* (2026.01); *H10W 90/752* (2026.01)

(58) Field of Classification Search
USPC ........................................................... 365/63
See application file for complete search history.

(56) References Cited

U.S. PATENT DOCUMENTS

| | | | |
|---|---|---|---|
| 10,998,334 | B2 | 5/2021 | Lee et al. |
| 11,201,166 | B2 | 12/2021 | Choi et al. |
| 11,211,399 | B2 | 12/2021 | Russo et al. |
| 12,075,624 | B2 * | 8/2024 | Baek ...................... H10B 43/35 |
| 2019/0371382 | A1 * | 12/2019 | Futatsuyama ............ G11C 8/08 |
| 2020/0194448 | A1 | 6/2020 | Kim et al. |
| 2021/0091003 | A1 | 3/2021 | Oike |
| 2022/0005826 | A1 | 1/2022 | Lim et al. |
| 2022/0157831 | A1 | 5/2022 | Baek et al. |
| 2022/0181349 | A1 | 6/2022 | Yuan et al. |
| 2022/0231038 | A1 | 7/2022 | Baek et al. |
| 2022/0406612 | A1 | 12/2022 | Zhou |

* cited by examiner

SEMICONDUCTOR DEVICE AND DATA STORAGE SYSTEM INCLUDING THE SAME

CROSS-REFERENCE TO RELATED APPLICATION

This application claims priority under 35 U.S.C. 119 to Korean Patent Application No. 10-2023-0181989 filed on Dec. 14, 2023 in the Korean Intellectual Property Office, the disclosure of which is incorporated by reference herein in its entirety.

TECHNICAL FIELD

Example embodiments of the present inventive concept relate to a semiconductor device and a data storage system including the same.

DISCUSSION OF THE RELATED ART

A semiconductor device that is able to store high-capacity data in a data storage system requiring data storage has been under development. Accordingly, a method for increasing data storage capacity of a semiconductor device has been under development. For example, as a method for increasing data storage capacity of a semiconductor device, a semiconductor device including memory cells disposed three-dimensionally, instead of memory cells disposed two-dimensionally, has been under development.

SUMMARY

According to example embodiments of the present inventive concept, a semiconductor device includes: a first structure having a first side surface and a second side surface opposing each other, and including a first memory block and a second memory block sequentially arranged in a first direction from the first side surface to the second side surface; and a second structure including a peripheral circuit and overlapping the first structure, wherein the first memory block has a first connection region, a first memory cell array region, and a second connection region sequentially arranged in the first direction, wherein the second memory block has a third connection region, a second memory cell array region, and a fourth connection region sequentially arranged in the first direction, wherein the first memory block includes first gate electrodes that are spaced apart from each other and extend from the first connection region to the second connection region, wherein the second memory block includes second gate electrodes that are spaced apart from each other and extend from the third connection region to the fourth connection region, wherein the first gate electrodes of the first memory block include: first word lines having first word line pads that are disposed in the second connection region; and a first upper gate line having a first upper gate pad that is disposed in the first connection region and disposed on the first word lines, wherein the second gate electrodes of the second memory block include: second word lines having second word line pads that are disposed in the third connection region; and a second upper gate line having a second upper gate pad that is disposed in the fourth connection region and disposed on the second word lines, and wherein the first structure includes: first word line contact plugs connected to the first word line pads; a first upper gate contact plug connected to the first upper gate pad; second word line contact plugs connected to the second word line pads; and a second upper gate contact plug connected to the second upper gate pad.

According to example embodiments of the present inventive concept, a semiconductor device includes: a first structure having a first side surface and a second side surface opposing each other, and including a first connection region, a first memory cell array region, a second connection region, a third connection region, a second memory cell array region, and a fourth connection region sequentially arranged from the first side surface in a first direction toward the second side surface; and a second structure including a peripheral circuit and overlapping the first structure, wherein the first structure includes: first-side conductive layers disposed in the first connection region, the first memory cell array region, and the second connection region; a first vertical memory structure penetrating the first-side conductive layers in the first memory cell array region; second-side conductive layers disposed in the third connection region, the second memory cell array region, and the fourth connection region; and a second vertical memory structure penetrating the second-side conductive layers in the second memory cell array region, wherein the first-side conductive layers include: a first lower conductive group having first lower pads that are arranged in a staircase shape in the second connection region; and a first upper conductive group disposed on a level higher than a level of the first lower conductive group and having first upper pads that are arranged in a staircase shape in the first connection region, wherein the second-side conductive layers include: a second lower conductive group disposed at a same level as the first lower conductive group and having second lower pads that are arranged in a staircase shape in the third connection region; and a second upper conductive group disposed at a same level as the first upper conductive group and having second upper pads that are arranged in a staircase shape in the fourth connection region.

According to example embodiments of the present inventive concept, a data storage system includes: a semiconductor device including an input/output pad; and a controller electrically connected to the semiconductor device through the input/output pad and controlling the semiconductor device, wherein the semiconductor device includes: a first structure having a first side surface and a second side surface opposing each other, and including a first memory block and a second memory block sequentially arranged in a first direction; and a second structure including a peripheral circuit and overlapping the first structure, wherein the first memory block has a first connection region, a first memory cell array region, and a second connection region sequentially arranged in the first direction, wherein the second memory block has a third connection region, a second memory cell array region, and a fourth connection region sequentially arranged in the first direction, wherein the first memory block includes first gate electrodes that are spaced apart from each other in a vertical direction and extend from the first connection region to the second connection region, wherein the second memory block includes second gate electrodes that are spaced apart from each other in the vertical direction and extend from the third connection region to the fourth connection region, wherein the first gate electrodes of the first memory block include: first word lines having first word line pads that are disposed in the second connection region; and a first upper gate line having a first upper gate pad that is disposed in the first connection region and disposed on the first word lines, wherein the second gate electrodes of the second memory block includes: a second word lines having second word line pads that are disposed in the third connection region; and a second upper gate line having a second upper gate pad that is disposed in the fourth connection region and disposed on the second word lines, wherein the first structure includes: first word line contact plugs connected to the first word line pads; a first upper gate contact plug connected to the first upper gate pad; second word line contact plugs connected to the second word line pads; and a second upper gate contact plug connected to the second upper gate pad.

BRIEF DESCRIPTION OF DRAWINGS

The above and other aspects of the present inventive concept will become more apparent by describing in detail example embodiments thereof, with reference to the accompanying drawings, in which.

DETAILED DESCRIPTION OF THE EMBODIMENTS

Hereinafter, terms such as "upper", "intermediate, "middle", "lower" and the like may be replaced with other terms, such as "first", "second", "third" and the like to describe the elements of the specification. Terms such as "first", "second" and "third" may be used to describe various elements, but the elements are not limited by the terms. These terms are only used to distinguish one element from another element. Thus, a "first element" may be referred to as a "second element" without departing from the spirit and scope of the present inventive concept.

A semiconductor device according to example embodiments of the present inventive concept will be described with reference to FIGS. 1A, 1B, 1C and 1D. In FIGS. 1A to 1D, FIG. 1A is a perspective diagram illustrating a data storage system including a semiconductor device according to example embodiments of the present inventive concept. FIG. 1B is a perspective diagram illustrating a semiconductor device according to example embodiments of the present inventive concept. FIG. 1C is a block diagram illustrating a data storage system including a semiconductor device according to example embodiments of the present inventive concept, and FIG. 1D is a block diagram illustrating a semiconductor device according to example embodiments of the present inventive concept.

Figure 1A:
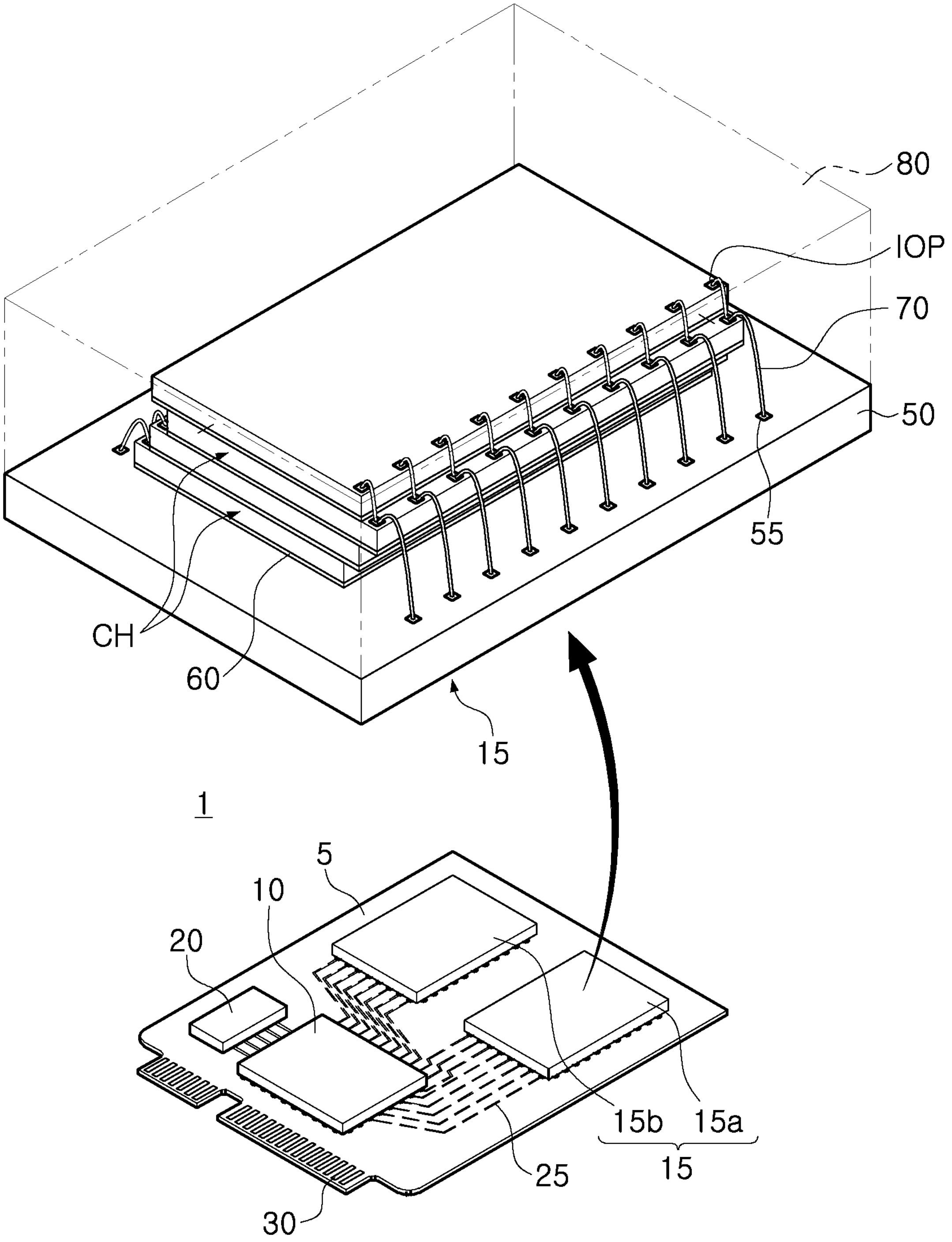
FIGS. 1A, 1B, 1C, and 1D are diagrams illustrating a semiconductor device according to an example embodiment of the present inventive concept.
Figure 1B:
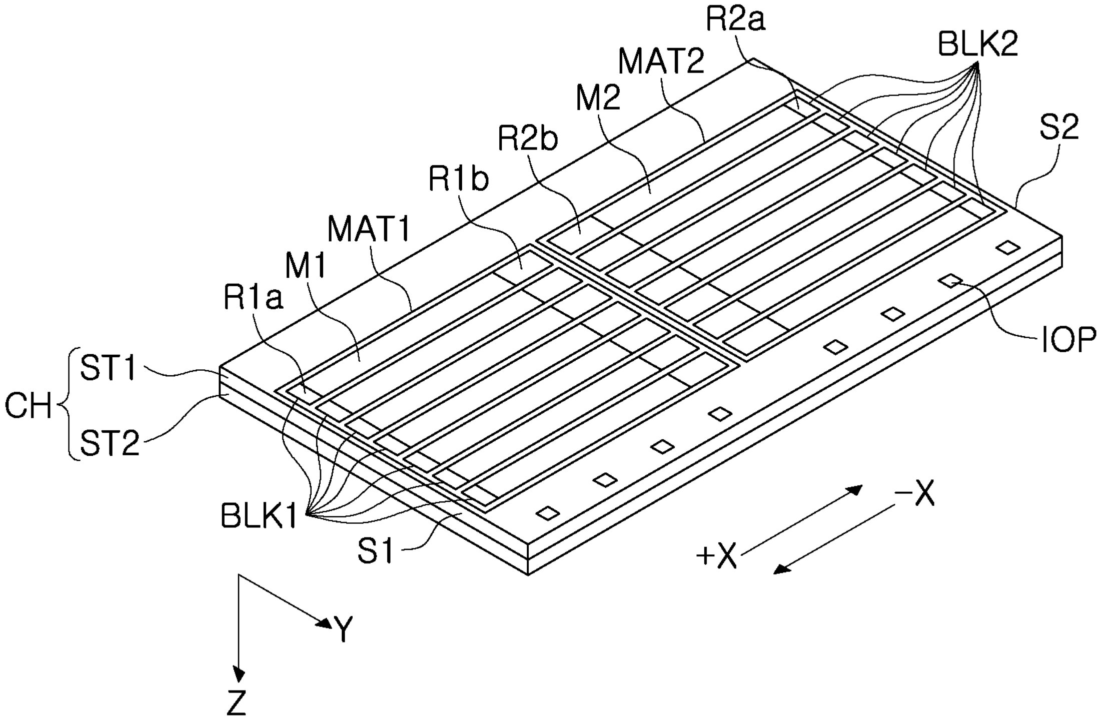
Figure 1C:
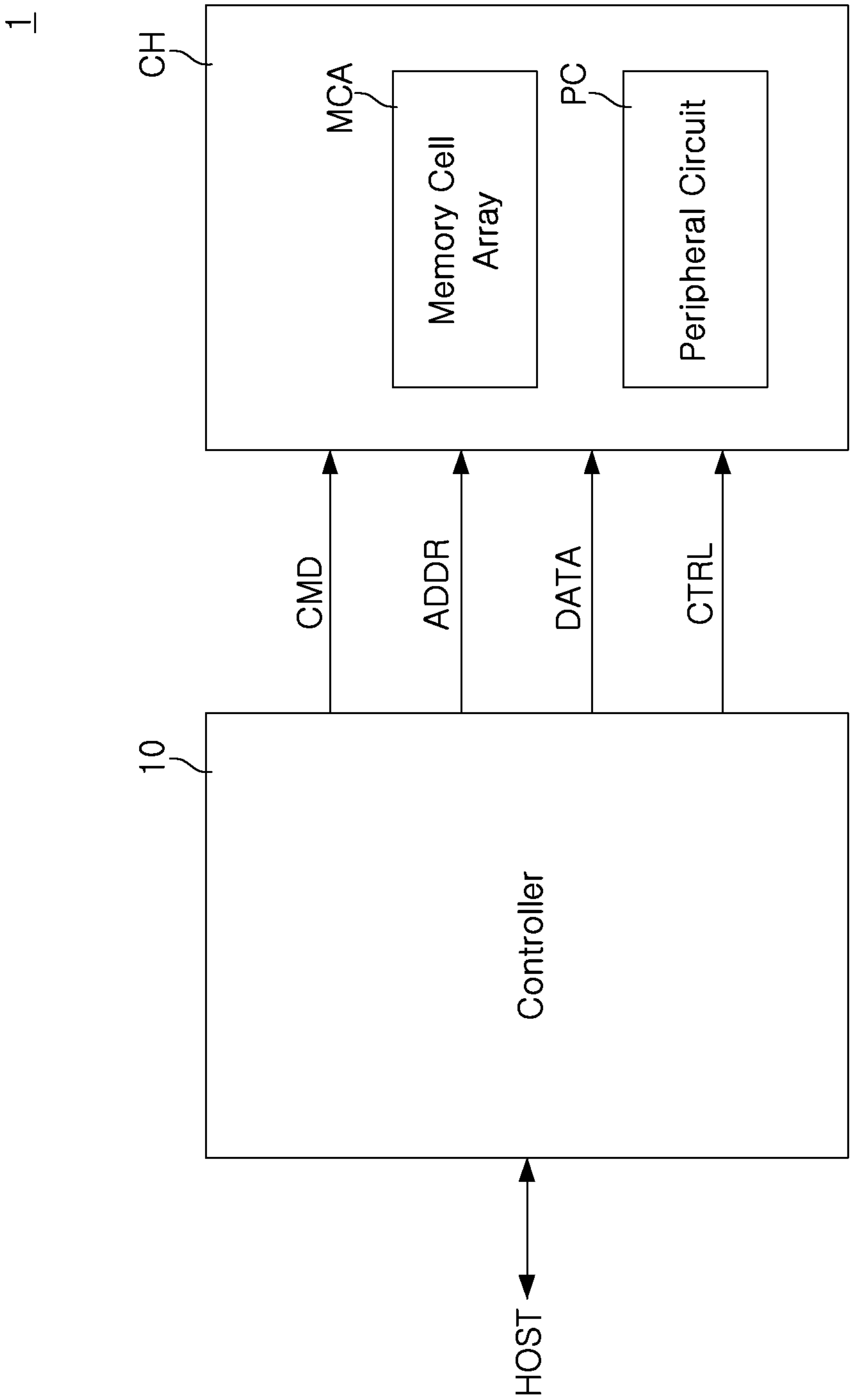
Figure 1D:
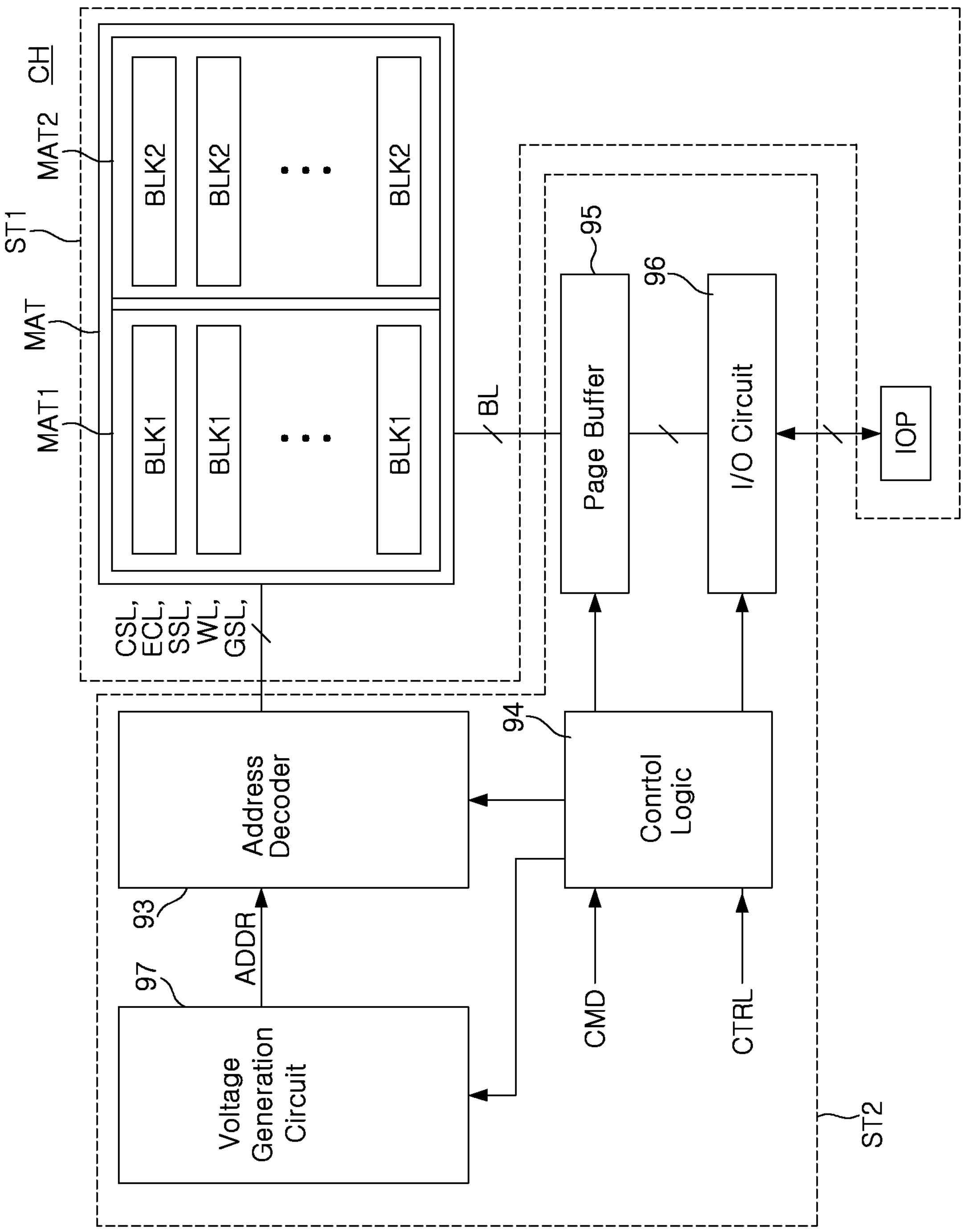

Referring to FIG. 1A, a data storage system 1 according to an example embodiment of the present inventive concept may include a main board 5, a controller 10 mounted on the main board 5, one or more semiconductor packages 15, and a DRAM 20. The semiconductor package 15 and the DRAM 20 may be connected to the controller 10 by wiring patterns 25 that are formed on the main board 5.

The main board 5 may include a connector 30 including a plurality of pins coupled to an external host (HOST in FIG. 1C). The number of the plurality of pins in the connector 30 and arrangement thereof may vary depending on a communication interface between the data storage system 1 and the external host HOST.

In example embodiments of the present inventive concept, the data storage system 1 may communicate with an external host according to an interface such as M-Phy for universal serial bus (USB), peripheral component interconnect express (PCI-Express), serial advanced technology attachment (SATA), and universal flash storage (UFS).

In example embodiments of the present inventive concept, the data storage system 1 may operate by power supplied from the external host (HOST in FIG. 1C) through the connector 30.

The data storage system 1 may include, for example, a power management integrated circuit (PMIC) distributing power supplied from the external host HOST to the controller 10 and the semiconductor package 15.

The controller 10 may write data in the semiconductor package 15 or may read data from the semiconductor package 15, and may increase an operation speed of the data storage system 1.

The DRAM 20 may be configured as a buffer memory to alleviate a difference in speeds between the semiconductor package 15, which is a data storage space, and an external host. The DRAM 20 included in the data storage system 1 may operate as a cache memory and may also provide a space for temporarily storing data during a control operation performed on the semiconductor package 15. When the data storage system 1 includes the DRAM 20, the controller 10 may further include a NAND controller for controlling the semiconductor package 15 (in addition to 1220 in FIG. 2), and also a DRAM controller for controlling the DRAM 20.

The semiconductor package 15 may include first and second semiconductor packages 15*a* and 15*b* that are spaced apart from each other. Each of the first and second semiconductor packages 15*a* and 15*b* may be configured as a semiconductor package including a plurality of semiconductor devices CH. The semiconductor devices CH may also be referred to as semiconductor chips.

Each of the first and second semiconductor packages 15*a* and 15*b* may include a package substrate 50, semiconductor devices CH on the package substrate 50, adhesive layers 60 disposed on lower surfaces of the semiconductor devices CH, respectively, a connection structure 70 configured to electrically connect the semiconductor devices CH and the package substrate 50 to each other, and a molding layer 80 covering the semiconductor devices CH and the connection structure 70 on the package substrate 50.

The package substrate 50 may be configured as a printed circuit board including package upper pads 55. Each of the semiconductor devices CH may include input/output pads IOP.

In example embodiments of the present inventive concept, the connection structure 70 may be a bonding wire electrically connecting the input/output pads IOP to the package upper pads 55. Accordingly, in each of the first and second semiconductor packages 15*a* and 15*b*, the semiconductor devices CH may be electrically connected to each other by using a bonding wire method and may be electrically connected to the package upper pads 55 of the package substrate 50. In example embodiments of the present inventive concept, in each of the first and second semiconductor packages 15*a* and 15*b*, the semiconductor devices CH may be electrically connected to each other by a connection structure including a through silicon via (TSV), instead of the connection structure 70 of the bonding wire method.

In example embodiments of the present inventive concept, the controller 10 and the semiconductor devices CH may be included in a package. For example, the controller 10 and the semiconductor devices CH may be mounted on an interposer substrate different from the main board 5, and the controller 10 and the semiconductor devices CH may be connected to each other by a wiring formed on the interposer substrate.

In example embodiments of the present inventive concept, in each of the semiconductor devices CH, the first structure ST1 may include input/output pads IOP. In example embodiments of the present inventive concept, the input/output pads IOP may be disposed in the second structure ST2.

Thereafter, referring to FIGS. 1B, IC and 1D along with FIG. 1A, each of the semiconductor devices CH may have a first structure ST1 and a second structure ST2 vertically overlapping the first structure ST1 in the vertical direction Z.

In each of the semiconductor devices CH, the first structure ST1 may include a plurality of memory mats MAT1 and MAT2 that are spaced apart from each other.

In the description below, example embodiments will be described based on the semiconductor device CH.

The first structure ST1 may have a first side surface S1 and a second side surface S2 opposing each other. In the first structure ST1, the plurality of memory mats MAT1 and MAT2 may be disposed between the first side surface S1 and the second side surface S2.

The plurality of memory mats MAT1 and MAT2 may include a first memory mat MAT1 adjacent to the first side surface S1 and a second memory mat MAT2 adjacent to the second side surface S2.

In example embodiments of the present inventive concept, the direction from the first side surface S1 toward the second side surface S2 may be defined as an +X-direction, and the direction from the second side surface S2 toward the first side surface S1 may be defined as an −X-direction. The +X-direction may be referred to as the first horizontal direction or the first direction, and the −X-direction may be referred to as the second horizontal direction or the second direction.

The +X-direction and the −X-direction may be perpendicular to the vertical direction Z.

The first memory mat MAT1 and the second memory mat MAT2 may be arranged sequentially in the +X-direction.

The first memory mat MAT1 and the second memory mat MAT2 may have a mirror symmetrical structure.

The first memory mat MAT1 may include a plurality of first memory blocks BLK1, and the second memory mat MAT2 may include a plurality of second memory blocks BLK2.

Each of the plurality of first memory blocks BLK1 may have a line shape or a bar shape extending in the +X-direction. For example, each of the plurality of first memory blocks BLK1 may have a rectangular shape. Each of the plurality of second memory blocks BLK2 may have a line shape or a bar shape extending in the +X-direction. For example, each of the plurality of second memory blocks BLK2 may have a rectangular shape.

The plurality of first memory blocks BLK1 may be spaced apart from each other in the Y-direction. The plurality of second memory blocks BLK2 may be spaced apart from each other in the Y-direction.

The Y-direction may be perpendicular to the +X-direction, the −X-direction, and the vertical direction Z. The Y-direction may also be referred to as the third horizontal direction or the third direction.

Each of the plurality of first memory blocks BLK1 may include a first connection region R1*a*, a first memory cell array region M1, and a second connection region R1*b* arranged sequentially in the +X-direction. Each of the plurality of second memory blocks BLK2 may include a third connection region R2*b*, a second memory cell array region M2, and a fourth connection region R2*a* arranged sequentially in the +X-direction. The second connection regions R1*b* of the first memory blocks BLKlamong the plurality of first memory blocks BLK1, may be adjacent to the third connection regions R2*b* of the second memory blocks BLK2 among the plurality of second memory blocks BLK2. The second connection regions R1*b* may be adjacent to each other, and the third connection regions R2*b* may be adjacent to each other.

Since the first structure ST1 may include the first and second memory blocks BLK1 and BLK2, the first structure ST1 may include the first connection region R1*a*, the first memory cell array region M1, the second connection region R1*b*, the third connection region R2*b*, the second memory cell array region M2, and the fourth connection region R2*a* arranged sequentially in the +X-direction.

The first connection region R1*a* may be referred to as a first external connection region, and the fourth connection region R2*a* may be referred to as a second external connection region.

The second and third connection regions R1*b* and R2*b* may be referred to as first and second intermediate connection regions, respectively.

In example embodiments of the present inventive concept, the first and second memory cell array regions M1 and M2 may have the same length as each other in the +X-direction.

In example embodiments of the present inventive concept, each of the first and second memory cell array regions M1 and M2 may have a length greater than a length of each of the first and fourth connection regions R1*a*, R1*b*, R2*a*, and R2*b* in the +X-direction.

In example embodiments of the present inventive concept, the first and fourth connection regions R1*a* and R2*a* may have the same length in the +X-direction.

In example embodiments of the present inventive concept, in the +X-direction, the second and third connection regions R1*b* and R2*b* may be adjacent to each other and may have the same length as each other.

In example embodiments of the present inventive concept, a length of each of the second and third connection regions R1*b* and R2*b* may be greater than a length of each of the first and fourth connection regions R1*a* and R2*a* in the +X-direction.

In example embodiments of the present inventive concept, the first to fourth connection regions R1*a*, R1*b*, R2*a*, and R2*b* may have substantially the same width in the Y direction as each other.

In example embodiments of the present inventive concept, a width of each of the first to fourth connection regions R1*a*, R1*b*, R2*a*, and R2*b* may be substantially the same as a width of each of the first and second memory cell array regions M1 and M2 in the Y direction.

In example embodiments of the present inventive concept, "length" in the +X-direction may be referred to as "width" in the +X-direction.

The controller 10 may write data DATA to the semiconductor device CH or may read data DATA stored in the semiconductor device CH. The controller 10 may transmit a command CMD, an address ADDR, a control signal CTRL and data DATA to the semiconductor device CH to write the data DATA to the semiconductor device CH. The controller 10 may transmit the command CMD, the address ADDR and the control signal CTRL to the semiconductor device CH to read the data DATA that is stored in the semiconductor device CH.

The semiconductor device CH may include nonvolatile memory devices such as NAND flash memory, phase change memory (PRAM), resistive memory (ReRAM), magneto-resistive memory (MRAM), or ferroelectric memory (FRAM). The semiconductor device CH may perform operations of writing, reading, and erasing the data DATA in response to signals received from the controller 10.

Each of the first and second memory mats MAT1 and MAT2 may include a memory cell array MCA including memory cells that are arranged three-dimensionally. For example, in the first structure ST1, each of the first memory cell array regions M1 of the first memory blocks BLK1 and the second memory cell array regions M2 of the second memory blocks BLK2 may include memory cells that are arranged three-dimensionally and storing data.

Memory cells may be arranged three-dimensionally in the first memory cell array region M1 of the first memory mat MAT1, and memory cells may be arranged three-dimensionally in the second memory cell array region M2 of the second memory mat MAT2.

The second structure ST2 may include a peripheral circuit PC. The peripheral circuit PC may include an address decoder 93, a control 1100F 94, a page buffer 95, an input/output circuit 96, and a voltage generation circuit 97. Accordingly, in the semiconductor device CH, the first structure ST1 may include the memory cell array MCA, and the second structure ST2 may include the peripheral circuit PC.

The first structure ST1 may further include word lines WL, string select lines SSL, ground select lines GSL, bit lines BL, erase control lines ECL, and a common source CSL.

The memory cell array MCA of the first and second memory mats MAT1 and MAT2 may be electrically connected to the address decoder 93 of the peripheral circuit PC through the word lines WL, the string select lines SSL, the ground select lines GSL and the common source CSL, and may be electrically connected to the page buffer 95 of the peripheral circuit PC through the bit lines BL.

The address decoder 93 may select one of the first and second memory blocks BLK1 and BLK2. The address decoder 93 may select one of the word lines WL of the selected memory block. The address decoder 93 may transmit voltages that are provided by the voltage generation circuit 97 to the word line WL or select lines SSL and gate select line GSL of the selected memory block. The address decoder 93 may transfer a positive (+) high voltage program voltage to the select word line during a program operation, and may transfer an erase voltage of positive (+) high voltage to a bulk of the selected memory block during an erase operation.

The control 1100F 94 may receive the command CMD and the control signal CTRL from the controller 10, and may control the address decoder 93, the page buffer 95, and the input/output circuit 96 in response to the received signals. The control 1100F 94 may control the voltage generation circuit 97 that is configured to generate various voltages required for operation of the semiconductor device CH. For example, the control 1100F 94 may adjust a voltage level that is provided by word lines WL and bit lines BL when performing memory operations such as a program operation or an erase operation.

The voltage generation circuit 97 may generates voltage of various levels, such as a plurality of select read voltages, a plurality of unselected read voltages, a plurality of program pulses, a plurality of pass voltages, and a plurality of erase pulses, under control of the control 1100F 94. In addition, the voltage generation circuit 97 may provide the voltages to the address decoder 93 and the first and second memory blocks BLK1 and BLK2. For example, the voltage generation circuit 97 may generate a positive (+) high voltage corresponding to a plurality of program pulses or a plurality of erase pulses. The voltage generation circuit 97 may include a charge pump including at least one pumping capacitor to generate voltages of various levels as described above.

The page buffer 95 may operate as a write driver or a sense amplifier depending on an operation mode. During a read operation, the page buffer 95 may sense a bit line BL of a selected memory cell among memory cells arranged three-dimensionally in the first and second memory blocks BLK1 and BLK2 under control of the control 1100F 94. The sensed data may be stored in latches provided in the page buffer 95. The page buffer 95 may dump data stored in latches to the input/output circuit 96 under control of the control 1100F 94.

The input/output circuit 96 may temporarily store a command CMD, an address ADDR, a control signal CTRL and data DATA provided through the input/output pads IOP from an external entity of the semiconductor devices CH. The input/output circuit 96 may temporarily store read data of the semiconductor device CH and output the data to an external entity or device through the input/output pads IOP at a designated time.

Figure 2:
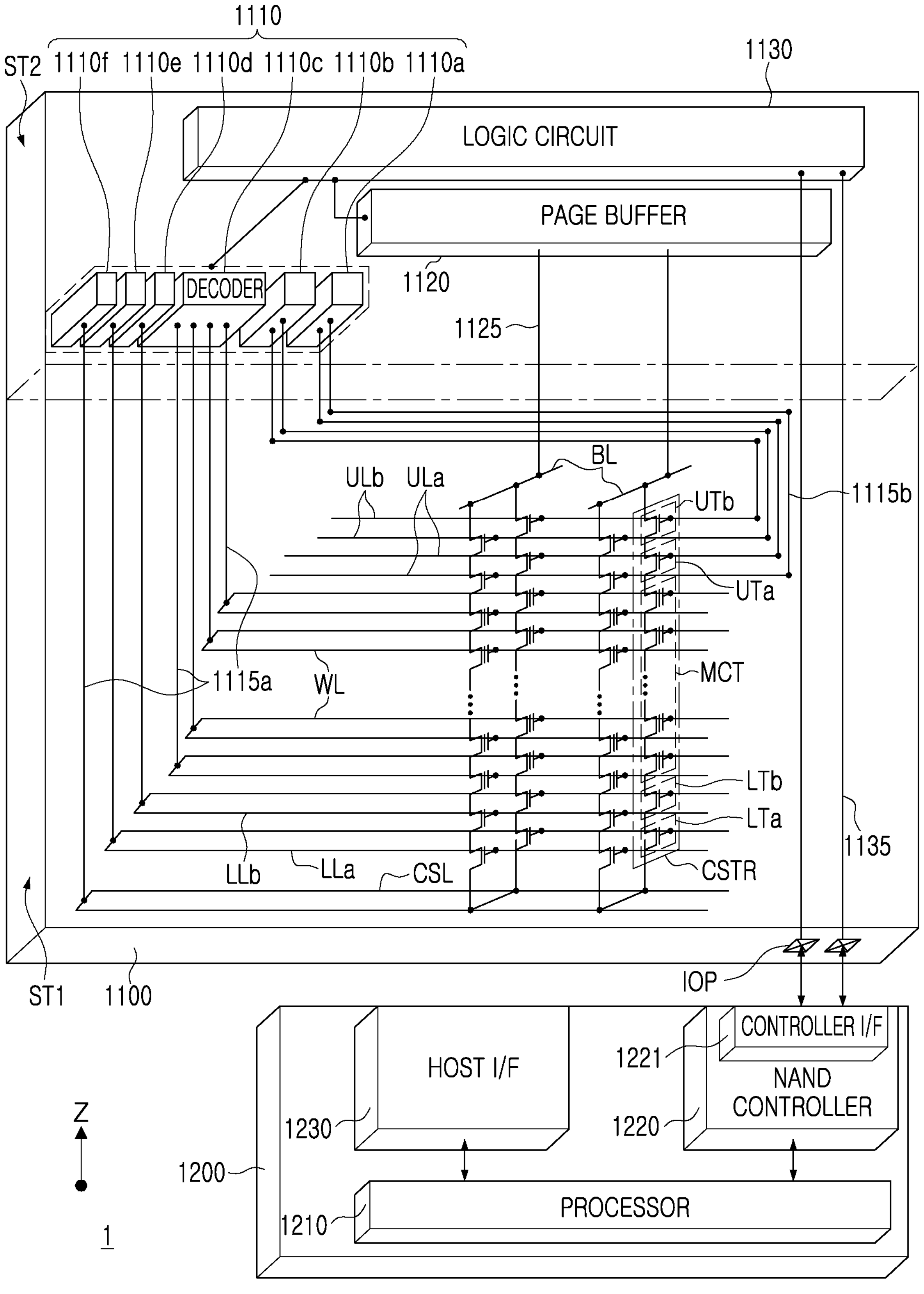
FIG. 2 is a diagram illustrating a semiconductor device according to an example embodiment of the present inventive concept.

An example of the data storage system 1 described above will be described with reference to FIG. 2 along with FIGS. 1A to 1D described above. FIG. 2 is a diagram illustrating a data system including a semiconductor device according to an example embodiment of the present inventive concept.

Referring to FIG. 2 together with FIGS. 1A to 1D, a data storage system 1 may include a semiconductor device CH and a controller 1200 electrically connected to the semiconductor device CH. The data storage system 1 may be implemented as a storage device including one or a plurality of semiconductor devices 1100 or an electronic device including a storage device. For example, the data storage system 1 may be implemented as a solid state drive device (SSD) including one or a plurality of semiconductor devices 1100, a universal serial bus (USB), a computing system, a medical device, or a communication device.

The second structure ST2 may be configured as a peripheral circuit structure including a decoder circuit 1110, a page buffer 95, and a logic circuit 1130.

The first structure ST1 may include a bit line BL, a common source CSL, word lines WL, first and second upper gate lines ULa and ULb, first and second lower gate lines LLa and LLb, and memory cell strings CSTR between the bit line BL and the common source CSL.

In the first chip structure ST1 illustrated in FIG. 2, the bit line BL, the common source CSL, the word lines WL, the first and second upper gate lines ULa and ULb, the first and second lower gate lines LLa and LLb, and the memory cell strings CSTR may be included in one of the memory blocks in one of the plurality of memory mats MAT1 and MAT2. For example, the bit line BL, the common source CSL, the word lines WL, the first and second upper gate lines ULa and ULb, the first and second lower gate lines LLa and LLb, and the memory cell strings CSTR, illustrated in FIG. 2, may be included in one second memory block of the second memory blocks BLK2 in the second memory mat MAT2. Since the first and second memory mats MAT1 and MAT2 may be mirror symmetrical with each other, the bit line BL, the common source CSL, the word lines WL, the first and second upper gate lines ULa and ULb, the first and second lower gate lines LLa and LLb, and the memory cell strings CSTR, illustrated in FIG. 2, may be included in one of the first memory block BLK1 and the second memory block BLK2.

The first lower gate line LLa may be disposed on a level higher than a level of the common source CSL. The second lower gate line LLb may be disposed on a level higher than a level of the first lower gate line LLa. The word lines WL may be disposed on a level higher than a level of the second lower gate line LLb. The first gate upper line ULa may be disposed on a level higher than a level of the word lines WL. The second gate upper line ULb may be disposed on a level higher than a level of the first gate upper line ULa.

In the first structure ST1, each memory cell string CSTR may include lower transistors LTa and LTb that are adjacent to the common source CSL, upper transistors UTa and UTb that are adjacent to the bit line BL, and a plurality of memory cell transistors MCT that are disposed between the lower transistors LTa and LTb and the upper transistors UTa and UTb.

The number of lower transistors LTa and LTb and the number of upper transistors UTa and UTb may vary in example embodiments of the present inventive concept. The plurality of memory cell transistors MCT may include data storage regions for storing data DATA.

In example embodiments of the present inventive concept, the upper transistors UTa and UTb may include a string select transistor, and the lower transistors LTa and LTb may include a ground select transistor. The lower gate lines LLa and LLb may be gate electrodes of the lower transistors LTa and LTb, respectively. The word lines WL may be gate electrodes of the memory cell transistors MCT, and the upper gate lines ULa and ULb may be gate electrodes of the upper transistors UTa and UTb, respectively.

In example embodiments of the present inventive concept, the lower transistors LTa and LTb may include a first lower transistor LTa and a second lower transistor LTb on the first lower transistor LTa. The first and second lower transistors LTa and LTb may be connected to each other in series. The first lower transistor LTa may be a lower erase control transistor, and the second lower transistor LTb may be a lower select transistor, for example, a ground select transistor. The first lower gate line LLa may be a lower erase control gate electrode of the lower erase control transistor LTa, and the second lower gate line LLb may be a lower select gate electrode of the lower select transistor LTb.

The first and second lower gate lines LLa and LLb, the word lines WL, and the first and second upper gate lines ULa and ULb may be gate electrodes.

In example embodiments of the present inventive concept, the upper transistors UTa and UTb may include a first upper transistor UTa and a second upper transistor UTb on the first upper transistor UTa. The first and second upper transistors UTa and UTb may be connected to each other in series.

In an example embodiment of the present inventive concept, the first upper transistor Uta may be an upper erase control transistor, and the second upper transistor Utb may be an upper select transistor, for example, a string select transistor. In this case, the first upper gate line Ula may be an upper erase control gate electrode of the upper erase control transistor Uta, and the second upper gate line Ulb may be a string select gate electrode of the string select transistor Utb. At least one of the lower erase control transistor Lta and the upper erase control transistor Uta may be used in an erase operation to erase data that is stored in the memory cell transistors MCT by using a gate induced drain leakage (GIDL) phenomenon.

In an example embodiment of the present inventive concept, the first upper transistor UTa may be an upper select transistor, for example, a string select transistor, and the second upper transistor UTb may be an upper erase control transistor. In this case, the first upper gate line ULa may be a string select gate electrode of the string select transistor UTa, and the second upper gate line ULb may be an upper erase control gate electrode of the upper erase control transistor UTb.

In example embodiments of the present inventive concept, the common source CSL, the first and second lower gate lines LLa and LLb, the word lines WL, and the first and second upper gate lines ULa and ULb may be electrically connected to the decoder circuit 1110 through routing wiring structures 1115*a* and 1115*b* extending from the first structure ST1 to the second structure ST2.

In example embodiments of the present inventive concept, the routing wiring structures 1115*a* and 1115*b* may be connected to pad regions of the first and second lower gate lines LLa and LLb, pad regions of the word lines WL, and pad regions of the first and second upper gate lines ULa and ULb.

The decoder circuit 1110 may include a first circuit 1110*a* electrically connected to the second upper gate line ULb, a second circuit 1110*b* electrically connected to the first upper gate line ULa, a third circuit 1110*c* electrically connected to the word lines WL, a fourth circuit 1110*d* electrically connected to the second lower gate line LLb, a fifth circuit 1110*e* electrically connected to the first lower gate line LLa, and a sixth circuit 1110*f* electrically connected to the common source CSL.

In an example embodiment of the present inventive concept, the routing wiring structures 1115*a* and 1115*b* may include a first routing wiring structure 115*a*, which is electrically connected to the common source CSL, the first and second lower gate lines LLa and LLb, and the word lines WL, and a second routing wiring structure 115*b*, which is electrically connected to the first and second upper gate lines ULa and ULb.

In an example embodiment of the present inventive concept, the common source CSL, the first and second lower gate lines LLa and LLb, and the word lines WL may be electrically connected to the decoder circuit 1110 through the first routing wiring structure 1115*a*, and the first and second upper gate lines ULa and ULb may be electrically connected to the decoder circuit 1110 through the second routing wiring structure 1115*b*.

In an example embodiment of the present inventive concept, the second upper gate line ULb may be electrically connected to the first circuit 1110*a* of the decoder circuit 1110 through the first routing wiring structure 1115*a*.

In an example embodiment of the present inventive concept, the second upper gate line ULb may be electrically connected to the first circuit 1110*a* of the decoder circuit 1110 through the first and second routing wiring structures 1115*a* and 1115*b*.

In an example embodiment, the first upper gate line ULa may be electrically connected to the second circuit 1110*b* of the decoder circuit 1110 through the first and second routing wiring structures 1115*a* and 1115*b*.

In an example embodiment of the present inventive concept, the word lines WL may include lower word lines and upper word lines that are disposed on a level higher than a level of the lower word lines. The lower word lines may be connected to the decoder circuit 1110 through the first routing structure 1115*a*, and the upper word lines may be electrically connected to the third circuit 1110*c* of the decoder circuit 1110 through the second routing structure 1115*b*.

The bit lines BL may be electrically connected to the page buffer 1120 through the second routing wiring structure 1125 extending from the second structure ST2 to the first structure ST1.

In the second structure ST2, the decoder circuit 1110 and the page buffer 95 may execute a control operation on at least one select memory cell transistor among the plurality of memory cell transistors MCT. The decoder circuit 1110 and the page buffer 95 may be controlled by the logic circuit 1130.

The semiconductor device 1000 may communicate with controller 10 through the input/output pad IOP electrically connected to the logic circuit 1130. The input/output pads IOP may be electrically connected to the logic circuit 1130 through an input/output connection line 1135 extending from the first structure 1100F to the second structure 1100S.

The controller 10 may include a processor 1210, a NAND controller 1220, and a host interface 1230.

The processor 1210 may control overall operations of the data storage system 1 including controller 10. The processor 1210 may operate according to a predetermined firmware, and may access the semiconductor device CH by controlling the NAND controller 1220. The NAND controller 1220 may include a controller interface 1221 processing communication with the semiconductor device CH. Through the controller interface 1221, a control command for controlling the semiconductor device CH, data to be written to the memory cell transistors MCT of the semiconductor device CH, and data to be read from the memory cell transistors MCT of the semiconductor device CH may be transmitted. The host interface 1230 may provide a communication function between the data storage system 1 and an external host. When a control command is received from an external host through the host interface 1230, the processor 1210 may control the semiconductor device CH in response to the control command.

As described above, each of the plurality of first memory blocks (BLK1 in FIG. 1B) of the first memory mat MAT1 may include the first connection region R1*a*, the first memory cell array region M1 and the second connection region R1*b* arranged sequentially in the +X-direction, and each of the plurality of second memory blocks (BLK2 in FIG. 1B) of the second memory mat MAT2 may include the third connection region R2*b*, the second memory cell array region M2 and the fourth connection region R2*a* arranged sequentially in the +X-direction. The peripheral circuit PC of the second structure ST2 described above may include a first peripheral circuit configured to be electrically connected to the first memory mat MAT1 (PC1 in FIG. 3A), and a second peripheral circuit configured to be electrically connected to the second memory mat MAT2 (PC2 in FIG. 3A).

Figure 3A:
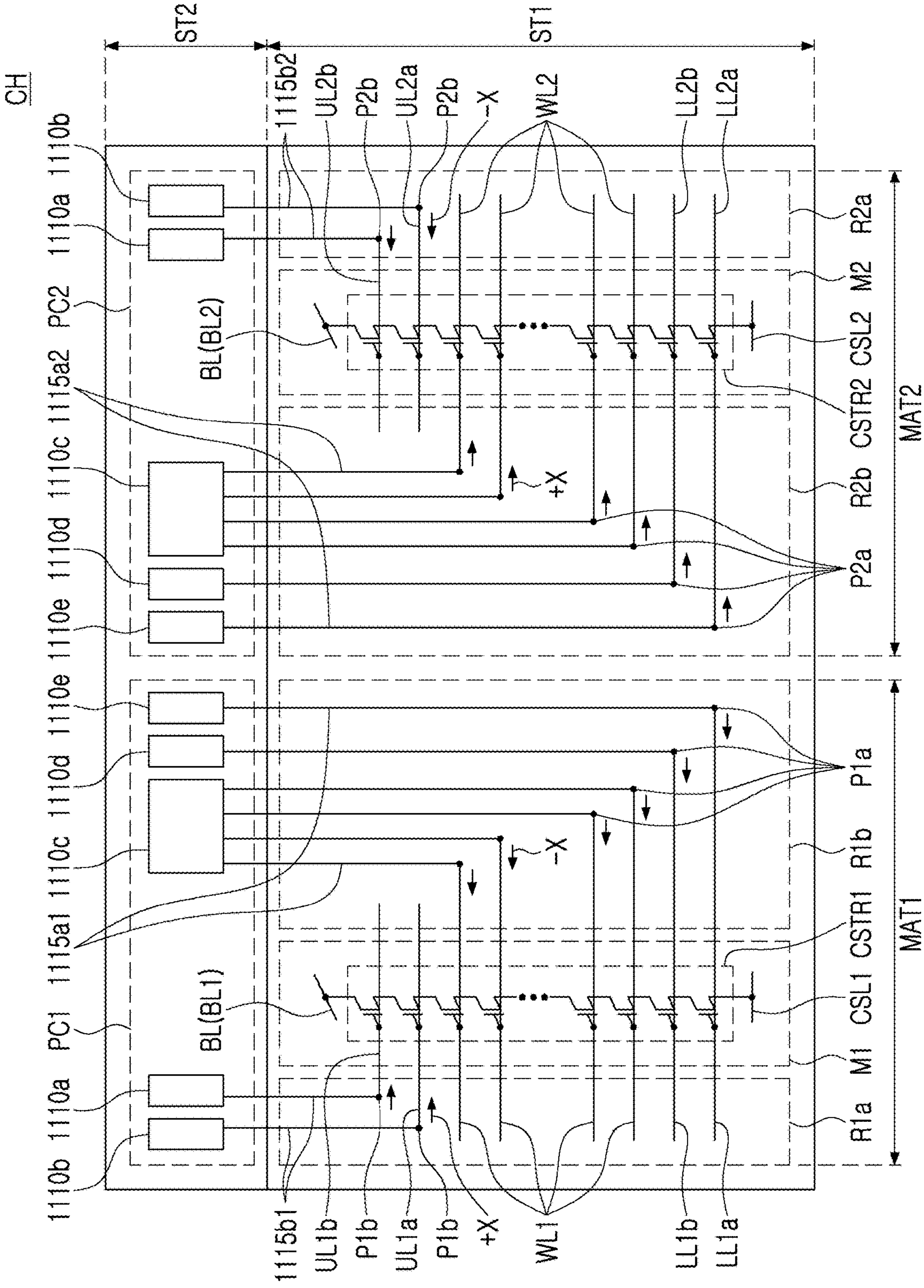
FIGS. 3A and 3B are diagrams illustrating a semiconductor device according to an example embodiment of the present inventive concept.

In the description below, with reference to FIGS. 3A and 3B, an electrical connection relationship between one of the plurality of first memory blocks (BLK1 in FIG. 1B) will be described, and the first memory block (BLK) and the first peripheral circuit (PC1 in FIG. 3A) will be described, and an electrical connection relationship between one of the plurality of second memory blocks (BLK2 in FIG. 1B), and the second memory block BLK2 and the second peripheral circuit (PC2 in FIG. 3A). FIG. 3A is a diagram illustrating an example of the semiconductor device CH including the first structure ST1 and the second structure ST2 described above, and FIG. 3B is a diagram illustrating a circuit in the first memory cell array region M1 of the first memory mat MAT1 and a circuit in the second memory cell array region M1 of the second memory mat MAT2 in FIG. 3A.

Figure 3B:
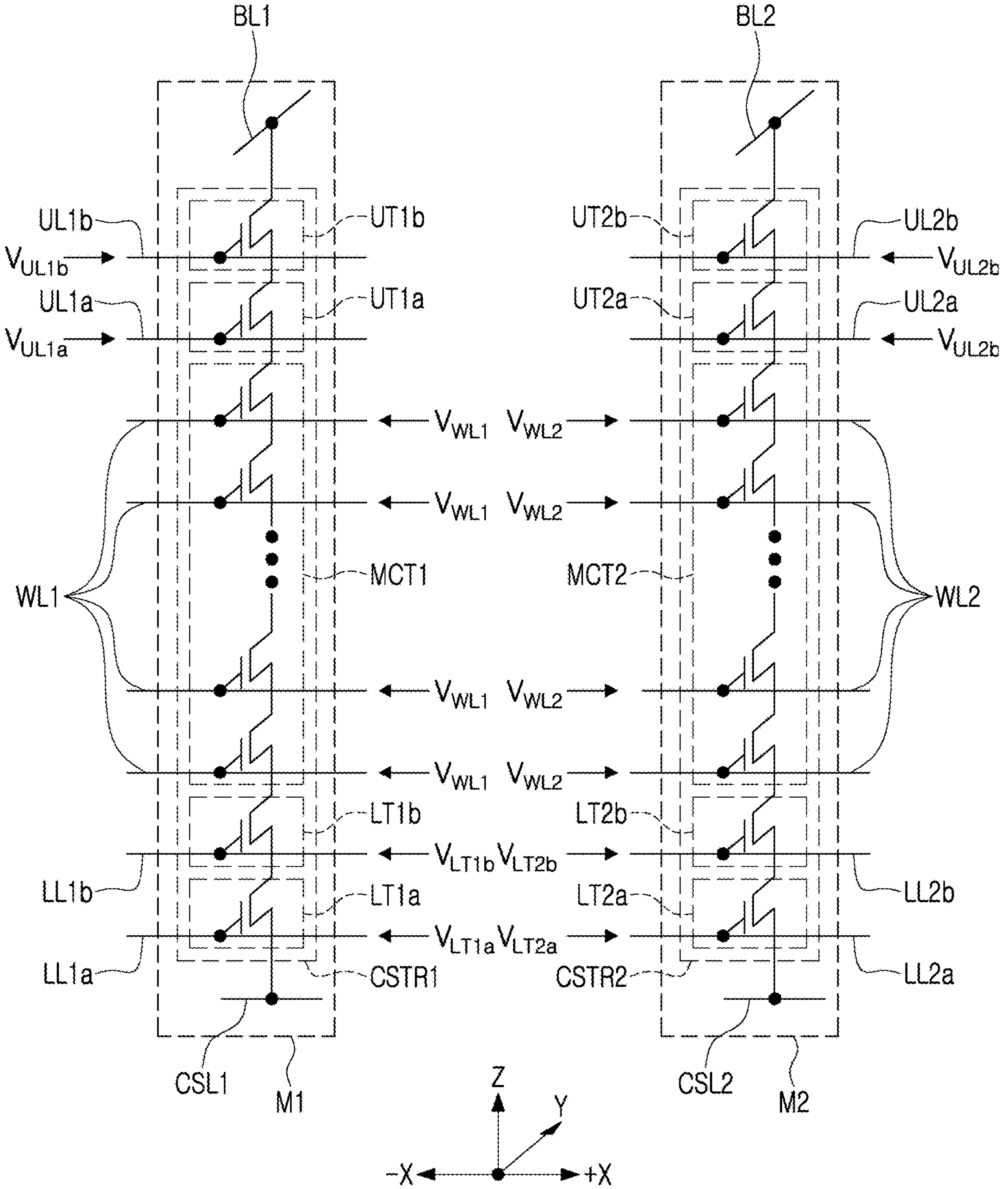

Referring to FIGS. 3A and 3B along with FIGS. 1A to 1D and FIG. 2, as described above, the first connection region R1*a*, the first memory cell array region M1, the second connection region R1*b*, the third connection region R2*b*, the second memory cell array region M2 and the fourth connection region R2*a* may be arranged sequentially in the +X-direction.

The first memory mat MAT1 of the first structure ST1 may include a first common source CSL1 corresponding to the common source CSL described in FIG. 2, first and second lower gate lines LL1*a* and LL1*b* corresponding to the first and second lower gate lines LLa and LLb described in FIG. 2A, respectively, first word lines WL1 corresponding to the word lines WL described in FIG. 2A, first and second upper gate lines UL1*a* and UL1*b* corresponding to the first and second upper gate lines ULa and ULb described in FIG. 2A, respectively, and first bit lines BL1 corresponding to the bit lines BL described in FIG. 2A.

The first gate electrodes of the first memory mat MAT1 of the first structure ST1 may include the first and second lower gate lines LL1*a* and LL1*b*, the first word lines WL1, and the first and second upper gate lines UL1*a* and UL1*b*.

The second memory mat MAT1 of the first structure ST1 may include a second common source CSL2 corresponding to the common source CSL illustrated in FIG. 2, and third and fourth lower gate lines LL2*a* and LL2*b* corresponding to the first and second lower gate lines LLa and LLb described in FIG. 2A, respectively. The second memory mat MAT1 of the first structure ST1 may further include second word lines WL2 corresponding to the word lines WL described in FIG. 2A, third and fourth upper gate lines UL2*a*, UL2*b* corresponding to the first and second upper gate lines ULa and ULb described in FIG. 2A, and second bit lines BL2 corresponding to the bit lines BL described in FIG. 2A.

The second gate electrodes of the second memory mat MAT1 of the first structure ST1 may include the third and fourth lower gate lines LL2*a* and LL2*b*, the second word lines WL2, and the third and fourth upper gate lines UL2*a* and UL2*b*.

The first memory mat MAT1 may include first memory cell strings CSTR1 corresponding to the memory cell strings CSTR described in FIG. 2, and the second memory mat MAT2 may include second memory cell strings CSTR2 corresponding to the memory cell strings CSTR described in FIG. 2.

The first memory cell strings CSTR1 may be disposed in the first memory cell array region M1, and the second memory cell strings CSTR2 may be disposed in the second memory cell array region M2.

In the description below, example embodiments of the present inventive concept will be described based on one of the first memory cell strings CSTR1 and one of the second memory cell strings CSTR2.

Each of the first memory cell string CSTR1 and the second memory cell string CSTR2 may be substantially the same as the memory cell strings CSTR described in FIG. 2.

The first memory cell string CSTR1 may include first and second lower transistors LT1*a* and LT1*b*, which may correspond to the first and second lower transistors (LTa and LTb in FIG. 2), first memory cell transistors MCT1, which may correspond to the plurality of memory cell transistors (MCT in FIG. 2), and first and second upper transistors UT1*a* and UT1*b* corresponding to the first and second upper transistors (UTa and UTb in FIG. 2).

The second memory cell string CSTR2 may include third and fourth lower transistors LT2*a* and LT2*b*, which may correspond to the first and second lower transistors (LTa and LTb in FIG. 2), second memory cell transistors MCT2, which may correspond to the plurality of memory cell transistors (MCT in FIG. 2), and third and fourth upper transistors UT2*a* and UT2*b* corresponding to the first and second upper transistors (UTa and UTb in FIG. 2).

The second structure ST2 may include a first peripheral circuit PC1 electrically connected to the first memory mat MAT1 and a second peripheral circuit PC2 electrically connected to the second memory mat MAT2.

For example, each of the first and second peripheral circuits PC1 and PC2 may include the first circuit 1110*a*, the second circuit 1110*b*, the third circuit 1110*c*, the fourth circuit 1110*d*, and the fifth circuit 1110*e* as described in FIG. 2.

In the first peripheral circuit PC1, the first circuit 1110*a* may be electrically connected to the second upper gate line UL1*b*. Further, the second circuit 1110*b* may be electrically connected to the first upper gate line UL1*a*, and the third circuit 1110*c* may be electrically connected to the first word lines WL1. In addition, the fourth circuit 1110*d* may be electrically connected to the second lower gate line LL1*b*, and the fifth circuit 1110*e* may be electrically connected to the first lower gate line LL1*a*.

In the second peripheral circuit PC2, the first circuit 1110*a* may be electrically connected to the fourth upper gate line UL2*b*, and the second circuit 1110*b* may be electrically connected to the third upper gate line UL2*a*. In addition, the third circuit 1110*c* may be electrically connected to the second word lines WL2, and the fourth circuit 1110*d* may be electrically connected to the fourth lower gate line LL2*b*. Further, the fifth circuit 1110*e* may be electrically connected to the third lower gate line LL2*a*.

The semiconductor device CH may include routing wiring structures 1115*a*1, 1115*a*2, 1115*b*1, and 1115*b*2 corresponding to the routing wiring structures 1115*a* and 1115*b* described in FIG. 2. For example, the routing wiring structures 1115*a*1, 1115*a*2, 1115*b*1, and 1115*b*2 may include a first routing wiring structure 1115*a*1, a second routing wiring structure 1115*b*1, a third routing wiring structure 1115*a*2, and a fourth routing wiring structure 1115*b*2.

The first and second routing wiring structures 1115*a*1 and 1115*b*1 may be configured to electrically connect the first memory mat MAT1 to the first peripheral circuit PC1. The third and fourth routing wiring structures 1115*a*2 and 1115*b*2 may be configured to electrically connect the second memory mat MAT2 to the second peripheral circuit PC2.

The first routing wiring structure 1115*a*1 may be in contact with and electrically connected to the first and second lower gate lines LL1*a* and LL1*b*, and the gate pads P1*a* of the first word lines WL1. For example, the first routing wiring structure 1115*a*1 are connected to the gate pads P1*a* of the first and second lower gate lines LL1*a* and LL1*b*. The second routing wiring structure 1115*b*1 may be in contact with and electrically connected to the gate pads P1*b* of the first and second upper gate lines UL1*a* and UL1*b*. The third routing wiring structure 1115*a*2 may be in contact with and electrically connected to the third and fourth lower gate lines LL2*a* and LL2*b*, and the gate pads P2*a* of the second word lines WL2. The fourth routing wiring structure 1115*b*2 may be in contact with and electrically connected to gate pads P2*b* of the third and fourth upper gate lines UL2*a* and UL2*b*.

The gate pads P1*a* of the first and second lower gate lines LL1*a* and LL1*b* and the first word lines WL1 may be disposed in the second connection region R1*b*. The gate pads P1*b* of the first and second upper gate lines UL1*a* and UL1*b* may be disposed in the first connection region R1*a*. The gate pads P2*a* of the third and fourth lower gate lines LL2*a* and LL2*b* and the second word lines WL2 may be disposed in the third connection region R2*b*. The gate pads P2*b* of the third and fourth upper gate lines UL2*a* and UL2*b* may be disposed in the fourth connection region R2*a*.

For a program operation, a read operation, and an erase operation for the first and second memory cell transistors MCT1 and MCT2 of the first and second memory cell strings CSTR1 and CSTR2, voltages of various conditions may be applied to the first and second bit lines BL1 and BL2, the first and second common source CSL1 and CS2, the first gate lines LL1*a*, LL1*b*, WL1, UL1*a*, and UL1*b*, and the second gate lines LL2*a*, LL2*b*, WL2, UL2*a*, and UL2*b*.

For example, when data is programmed in a selected memory cell among the memory cells of the first memory cell transistors MCT1 or data stored in a selected memory cell is read, to turn on the second upper transistor UT1*b*, which may be a string select transistor, and the second lower transistor LT1*b*, which may be a ground select transistor, a first operation voltage may be applied to the second upper gate line UL1*b*, and a second operation voltage may be applied to the second lower gate line LL1*b*. Accordingly, a current flow may occur between the first bit line BL1 and the first common source CSL1.

Each of the first memory cell transistors MCT1 may be controlled by the first word lines WL1. For example, a program voltage may be applied to selected word line among the first word lines WL1, and a pass voltage may be applied to unselected word line.

During an erase operation to erase data that is stored in memory cells of the first memory cell transistors MCT1, an erase voltage may be applied to the first upper gate line UL1*a* and/or the first lower gate line LL1*a* of the first upper transistor UT1*a* and/or the first lower transistor LT1*a*, which may be an erase control transistor.

Operation of the first lower transistor LT1*a* of the first memory cell string CSTR1, for example, to turn on the first lower transistor LT1*a*, the first voltage VLT1*a* may be applied to the first lower gate line LL1*a* in the –X-direction through the gate pad P1*a* of the first lower gate line LL1*a*.

For operation of the second lower transistor LT1*b* of the first memory cell string CSTR1, a second voltage $V_{LT1b}$ may be applied to the second lower gate line LL1*b* in the –X-direction through the gate pad P1*a* of the second lower gate line LL1*b*.

For operation of the first memory cell transistors MCT1 of the first memory cell string CSTR1, a third voltage $V_{WL1}$ may be applied to the first word lines WL1 in the –X-direction through the gate pads P1*a* of the first word lines WL1. For example, the applying of the third voltage $V_{WL1}$ may include applying a program voltage to the selected word line among the first word lines WL1 and applying a pass voltage to the unselected word line or word lines among the first word lines WL1.

For operation of the first upper transistor UT1*a* of the first memory cell string CSTR1, the fourth voltage $V_{UL1a}$ may be applied to the first upper gate line UL1*a* in the +X-direction through the gate pad P1*b* of the first upper gate line UL1*a*.

For operation of the second upper transistor UT1*b* of the first memory cell string CSTR1, the fifth voltage $V_{UL1b}$ may be applied to the second upper gate line UL1*b* in the +X-direction through the gate pad P1*b* of the second upper gate line UL1*b*.

For operation of the third lower transistor LT2*a* of the second memory cell string CSTR2, a sixth voltage $V_{LT2a}$ may be applied to the third lower gate line LL2*a* in the +X-direction through the gate pad P2*a* of the third lower gate line LL2*a*. An amount of the sixth voltage $V_{LT2a}$ may be substantially the same as an amount of the first voltage $V_{LT1a}$.

For operation of the fourth lower transistor LT2*b* of the second memory cell string CSTR2, a seventh voltage VLT2*b* may be applied to the fourth lower gate line LL2*b* in the +X-direction through the gate pad P2*a* of the fourth lower gate line LL2*b*. An amount of the seventh voltage VLT26 may be substantially the same as an amount of the second voltage $V_{LT1b}$.

For operation of the second memory cell transistors MCT2 of the second memory cell string CSTR2, an eighth voltage $V_{WL2}$ may be applied to the second word lines WL2 in the +X-direction through the gate pads P2*a* of the second word lines WL2. An amount of the eighth voltage $V_{WL2}$ may be substantially the same as an amount of the third voltage $V_{WL1}$.

For operation of the third upper transistor UT2*a* of the second memory cell string CSTR2, a ninth voltage $V_{UL2a}$ may be applied to the third upper gate line UL2*a* in the –X-direction through the gate pad P2*b* of the third upper gate line UL2*a*. An amount of the ninth voltage $V_{UL2a}$ may be substantially the same as An amount of the fourth voltage $V_{UL1a}$.

For operation of the fourth upper transistor UT2*b* of the second memory cell string CSTR2, the tenth voltage $V_{UL2b}$ may be applied to the fourth upper gate line UL2*b* in the –X-direction through the gate pad P2*b* of the fourth upper gate line UL2*b*. An amount of the tenth voltage $V_{UL2b}$ may be substantially the same as an amount of the fifth voltage VUL1*b*.

In the first memory mat MAT1, an erase voltage may be applied to the first upper gate line UL1*a* in the +X-direction such that gate induce drain leakage may occur in the first upper transistor UT1*a*, which may be an upper erase transistor, and an erase voltage may be applied to the first lower gate line LL1*a* in the –X-direction such that gate induce leakage may occur in the first lower transistor LT1*a*, which may be a lower erase transistor.

In the second memory mat MAT2, an erase voltage may be applied to the third upper gate line UL2*a* in the –X-direction such that gate induce drain leakage may occur in the third upper transistor UT2*a*, which may be an upper erase transistor, and an erase voltage may be applied to the third lower gate line LL2*a* in the +X-direction such that gate induce leakage may occur in the third lower transistor LT2*a*, which may be a lower erase transistor.

In the description below, the elements referred to as a "gate contact plug" may be a portion of the routing wiring structures 1115*a*1, 1115*a*2, 1115*b*1, and 1115*b*2, and may be in contact with and may be electrically connected to the gate pads P1*a*, P1*b*, P2*a*, and P2*b*. Accordingly, a voltage may be applied to the gate pads P1*a*, P1*b*, P2*a*, and P2*b* through the elements referred to as a "gate contact plug."

The first and second lower gate lines LL1*a* and LL1*b*, the first word lines WL1, the first and second upper gate lines UL1*a* and UL1*b* described above may be first-side conductive layers LL1*a*, LL1*b*, WL1, UL1*a*, and UL1*b* that are disposed in the first connection region R1*a*, the first memory cell array region M1, and the second connection region R1*b*. The third and fourth lower gate lines LL2*a* and LL2*b*, the second word lines WL2, the third and fourth upper gate lines UL2*a* and UL2*b* may be second-side conductive layers LL2*a*, LL2*b*, WL2, UL2*a*, and UL2*b* that are disposed in the third connection region R2*a*, the second memory cell array region M2, and the fourth connection region R2*b*.

The first-side conductive layers LL1*a*, LL1*b*, WL1, UL1*a*, and UL1*b* may extend from the first connection region R1*a* to the second connection region R1*b*. The first-side conductive layers LL1*a*, LL1*b*, WL1, UL1*a*, and UL1*b* may include first lower conductive groups LL1*a*, LL1*b*, and WL1, which have first lower pads P1*a* that are arranged in a staircase shape in the second connection region R1*b*, and first upper conductive groups UL1*a* and UL1*b*, which are disposed on a level higher than a level of the first lower conductive groups LL1*a*, LL1*b*, and WL1 and have first upper pads P1*b* that are arranged in a staircase shape in the first connection region R1*a*.

Among the first-side conductive layers LL1*a*, LL1*b*, WL1, UL1*a*, and UL1*b*, the number of first-side conductive layers of the first lower conductive groups LL1*a*, LL1*b*, and WL1 may be greater than the number of first-side conductive layers of first upper conductive groups UL1*a* and UL1*b*.

The second-side conductive layers LL2*a*, LL2*b*, WL2, UL2*a*, and UL2*b* may extend from the third connection region R2*a* to the fourth connection region R2*b*. The second-side conductive layers LL2*a*, LL2*b*, WL2, UL2*a*, and UL2*b* may include second lower conductive groups LL2*a*, LL2*b*, and WL2, which have second lower pads P2*a* that are disposed at the same level as the first lower conductive group LL1*a*, LL1*b*, and WL1 and arranged in a staircase shape in the third connection region R2*b*, and second upper conductive groups UL2*a*, UL2*b*, which are disposed at the same level as the first upper conductive group UL1*a* and UL1*b* and have second upper pads P2*b* that are arranged in a staircase shape in the fourth connection region R2*a*.

Figure 5:
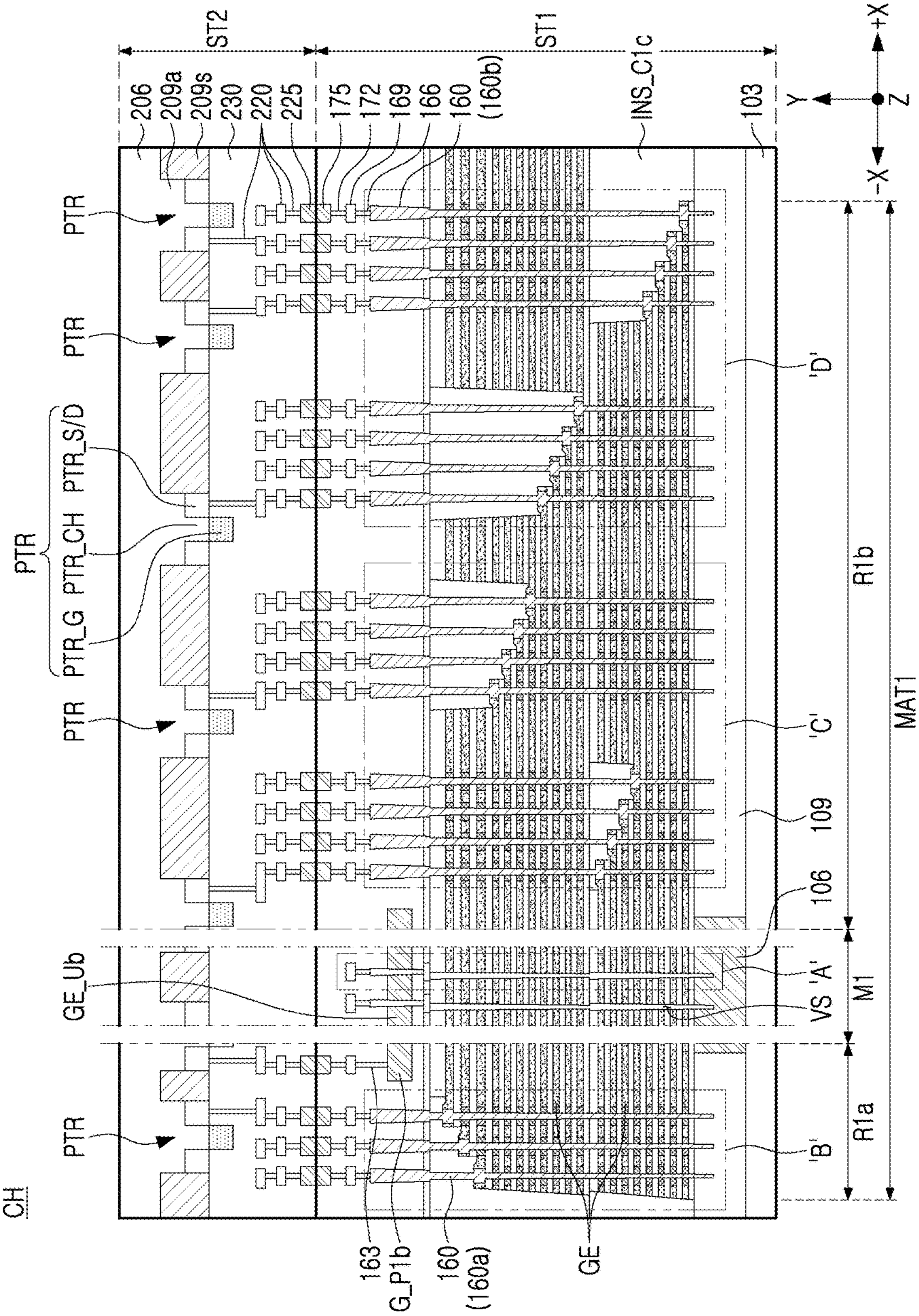
Figure 6A:
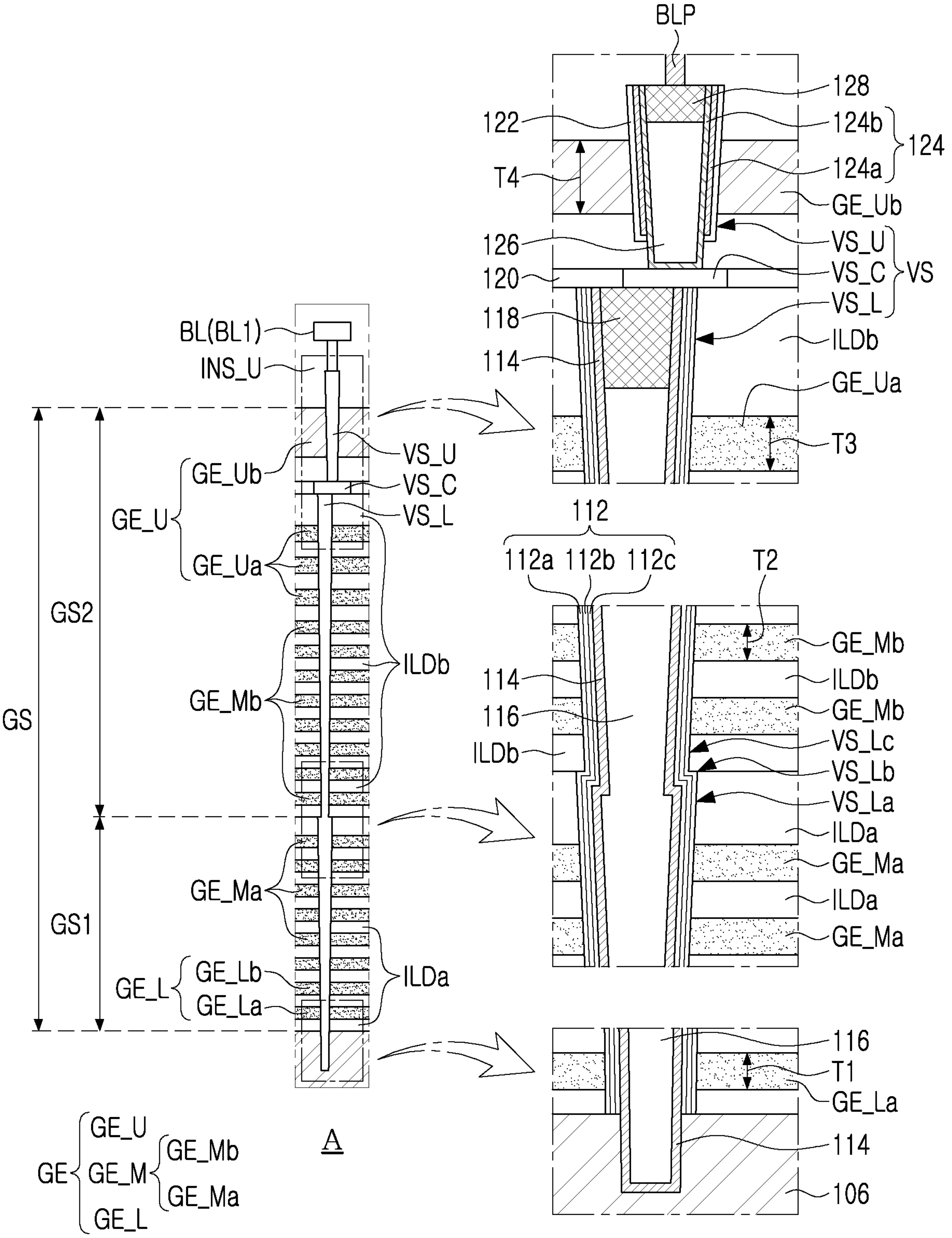
Figure 6B:
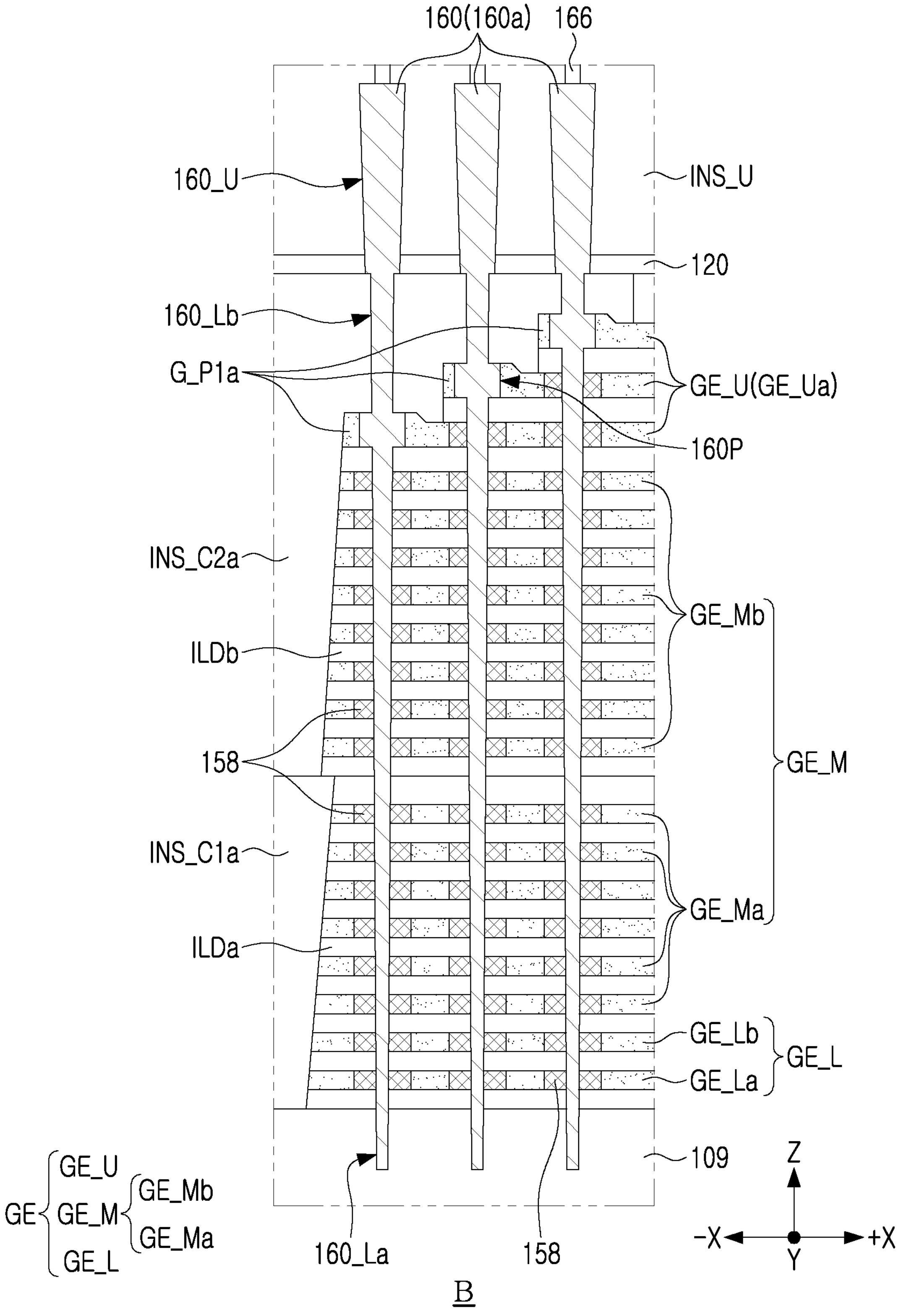
Figure 6C:
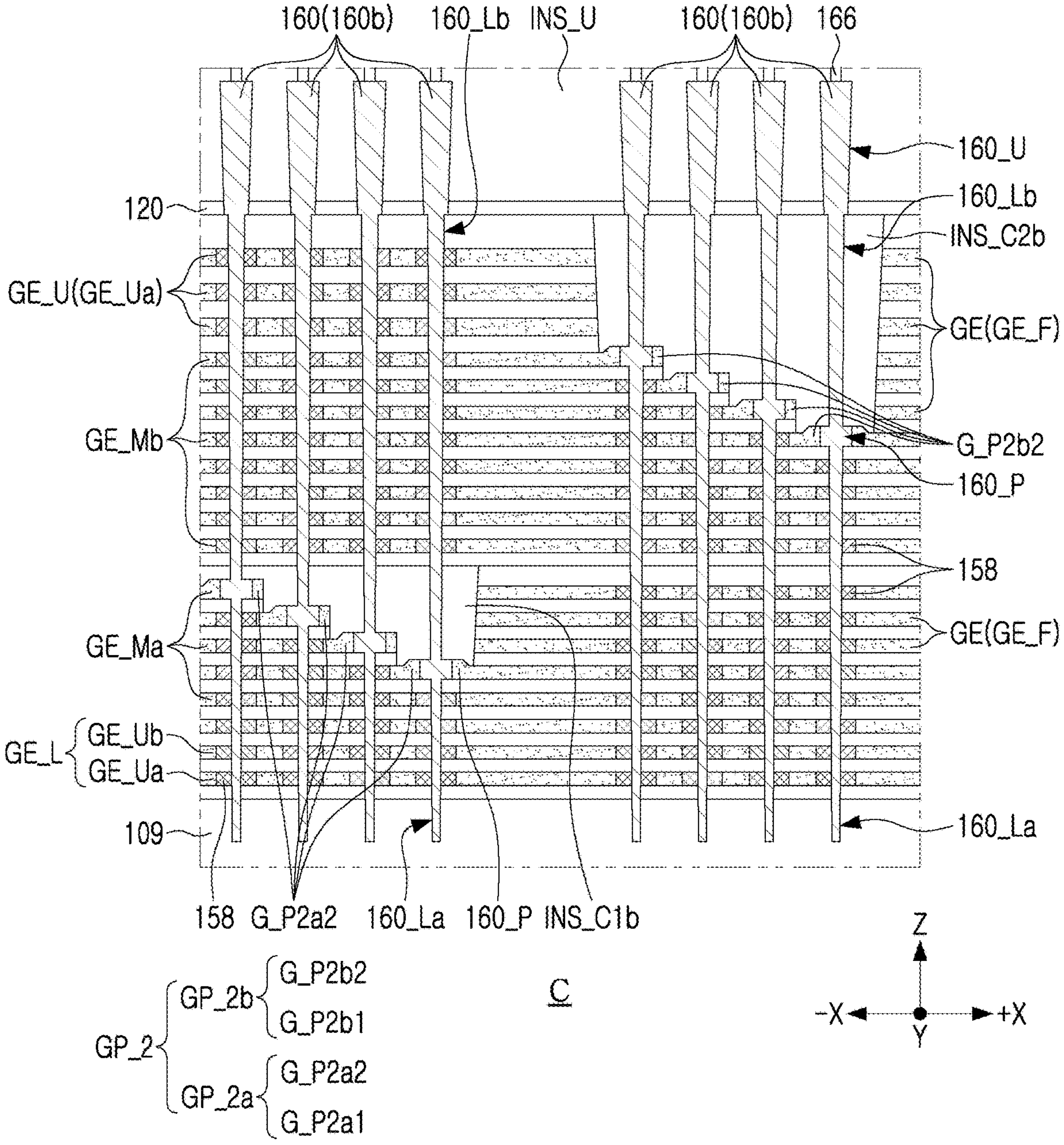
Figure 6D:
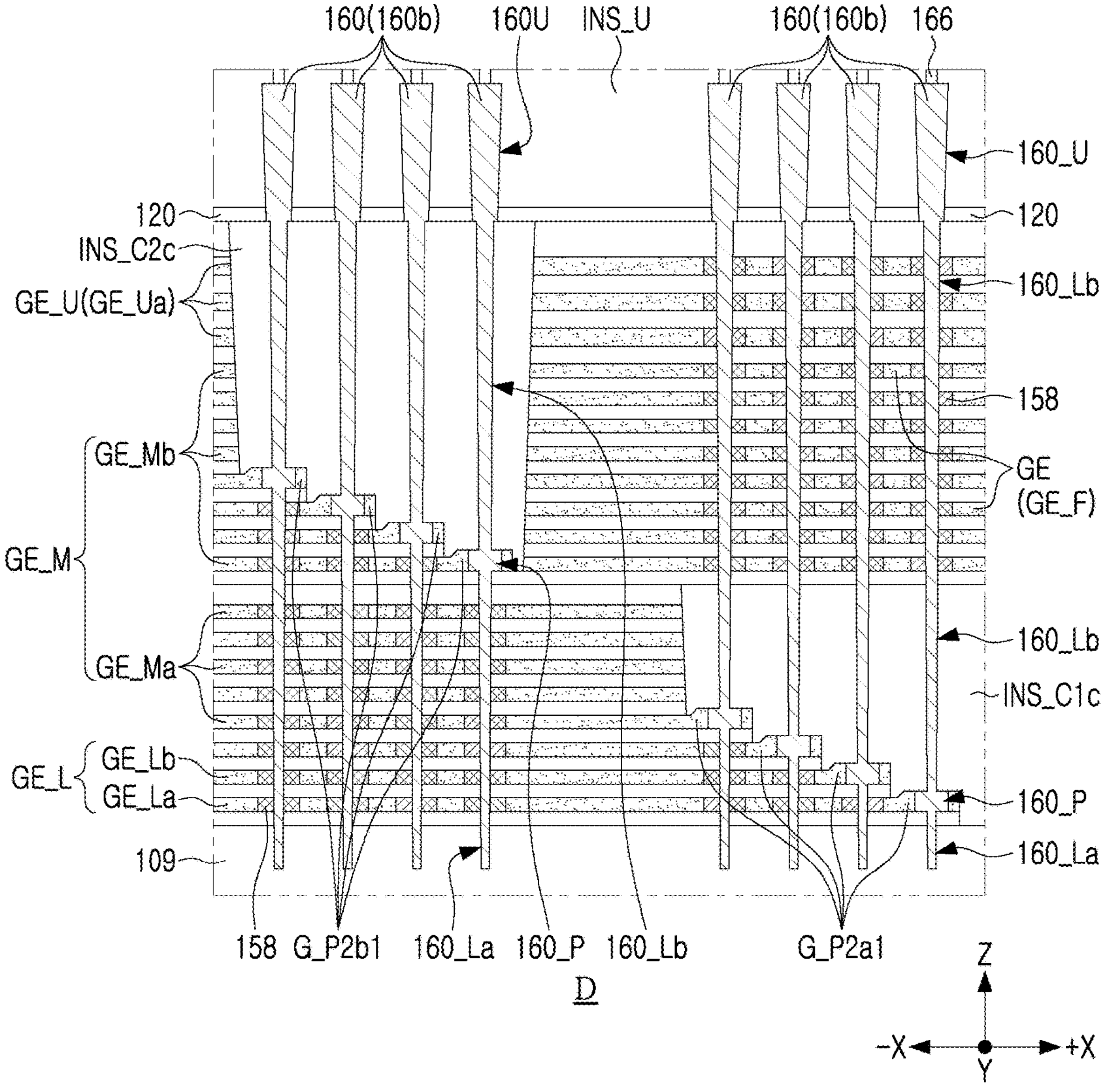

Thereafter, an example of the semiconductor device CH will be described with reference to FIGS. 4, 5, 6A, 6B, 6C, and 6D along with FIGS. 1A to 3B described above. In FIGS. 4, 5, 6A, 6B, 6C, and 6D, FIG. 4 is a top view illustrating an example of the semiconductor device CH, and FIG. 5 is a cross-sectional diagram illustrating a region taken long line I-I' in FIG. 4. FIG. 6A is an enlarged diagram illustrating region "A" in FIG. 5, and FIG. 6B is an enlarged diagram illustrating region "B" in FIG. 5. FIG. 6C is an enlarged diagram illustrating region "B" in FIG. 5, and FIG. 6D is an enlarged diagram illustrating region "D" in FIG. 5.

In the example embodiment of the present inventive concept, the first memory mat MAT1 and the second memory mat MAT2 may have a mirror symmetrical structure, and thus, the structure of the second memory mat MAT2 may be understood from the description of the structure of the first memory mat MAT1 below. Accordingly, in the description below, example embodiments of the present inventive concept will be described based on the structure of the first memory mat MAT1.

Referring to FIGS. 4 to 6D along with FIGS. 1A to 3B, a width in the +X-direction of each of the second and third connection regions R1*b* and R2*b* may be greater than a width in the +X-direction of each of the first and fourth connection regions R1*a* and R2*a*.

The semiconductor device CH may further include separation structures SP disposed between the first memory blocks BLK1 such that they are spaced apart from each other in the Y-direction, and disposed between the second memory blocks BLK2 such that they are spaced apart from each other in the Y-direction. Each of the separation structures SP may be disposed between the first memory blocks BLK1 that are adjacent to each other in the Y-direction, and disposed between the second memory blocks BLK2 that are adjacent to each other in the Y-direction.

The separation structures SP may extend to a region between the second memory blocks BLK2 from a portion disposed between the first memory blocks BLK1.

The first structure ST1 may further include a base 103, a plate pattern 106 on the base 103, and an insulating pattern 109 on a side surface of the plate pattern 106.

The base 103 may include an insulating material. The plate pattern 106 may include at least one of a semiconductor material and a conductive material. For example, at least a portion of the plate pattern 106 may include a conductive material such as doped silicon. For example, at least a portion of the plate pattern 106 may include polysilicon having N-type conductivity. In example embodiments of the present inventive concept, the plate pattern 106 may include a doped poly-silicon layer and a metal layer vertically overlapping the doped silicon layer. The insulating pattern 109 may include an insulating material such as silicon oxide. At least a portion of the plate pattern 106 may be the first common source (CS1 in FIGS. 3A and 3B) described above.

In an example embodiment of the present inventive concept, the plate pattern 106 may be referred to as a source structure or a common source.

Each of the first memory mat MAT1 and the second memory mat MAT2 may include gate electrodes GE. For example, in each of the first and second memory mats MAT1 and MAT2, the first structure ST1 may include gate electrodes GE that are spaced apart from each other in the vertical direction Z. Each of the gate electrodes GE may be formed of, for example, W, Ru, Mo, Nb, Ni, Co, Ti, Ta, TiN, TaN, WN, NbN, TiAl, TiAlN, TiSi, TiSiN, TaSi, TaSiN, RuTiN, NiSi, CoSi, or combinations thereof, but the present inventive concept is not limited thereto. For example, each of the gate electrodes GE may include a single layer or multiple layers formed of the materials mentioned above.

In an example, the gate electrodes GE may include gate electrodes, which are formed of a first material, and one or more gate electrodes, which are formed of the second material that is different from the first material.

In an example, the gate electrodes GE may be formed of the same material.

The gate electrodes GE may include lower gate electrodes GE_L, intermediate gate electrodes GE_M on the lower gate electrodes GE_L, and upper gate electrodes GE_U on the intermediate gate electrodes GE_M.

The lower gate electrodes GE_L may include a first lower gate electrode GE_La and a second lower gate electrode GE_Lb disposed on the first lower gate electrode GE_La.

The first lower gate electrode GE_La may be the first lower gate line (LL1*a* in FIGS. 3A and 3B) described above, and the second lower gate electrode GE_Lb may be the second lower gate line (LL1*a* in FIGS. 3A and 3B) described previously.

The intermediate gate electrodes GE_M may include first intermediate gate electrodes GE_Ma and second intermediate gate electrodes GE_Mb on the first intermediate gate electrodes GE_Ma. The intermediate gate electrodes GE_M may include the first word lines (WL1 in FIGS. 3A and 3B) described above.

The upper gate electrodes GE_U may include first upper gate electrodes GE_Ua and a second upper gate electrode GE_Ub disposed on the first upper gate electrodes GE_Ua. At least one of the first upper gate electrodes GE_Ua may be the first upper gate line (UL1*a* in FIGS. 3A and 3B) described above. For example, among the first upper gate electrodes GE_Ua, the gate electrode disposed on a relatively higher level may be the first upper gate line (UL1*a* in FIGS. 3A and 3B) described above, and the gate electrode disposed on a relatively lower level may be a dummy gate electrode. The second upper gate electrode GE_Ub may be the second upper gate line (UL1*b* in FIGS. 3A and 3B) described above.

In an example, the second upper gate electrode GE_Ub may be a string select gate line of the string select transistor described above, and at least one of the first upper gate electrodes GE_Ua may be an erase control gate line of the erase control transistor described above.

The first structure ST1 may include a stack structure GS. The stack structure GS may include a first stack structure GS1 and a second stack structure GS2 disposed on the first stack structure GS1.

The first stack structure GS1 may include the lower gate electrodes GE_L and the first intermediate gate electrodes GE_Ma. The second stack structure GS2 may include the second intermediate gate electrodes GE_Mb and the upper gate electrodes GE_U.

The first structure ST1 may further include interlayer insulating layers ILDa and ILDb. The interlayer insulating layers ILDa and ILDb may include first interlayer insulating layers ILDa and second interlayer insulating layers ILDb. The first interlayer insulating layers ILDa may be alternately stacked with gate electrodes including the lower gate electrodes GE_L and the first intermediate gate electrodes GE_Ma. The second interlayer insulating layers ILDb may be alternately stacked with gate electrodes including the second intermediate gate electrodes GE_Mb and the first upper gate electrodes GE_Ua.

The gate electrodes GE may be stacked and spaced apart from each other in the vertical direction Z in the first memory cell array region M1, and may extend from the first memory cell array region M1 to the first connection region R1*a* and the second connection region R1*b*.

In the first memory cell array region M1, each of the lower gate electrodes GE_L may have a first thickness T1, and each of the intermediate gate electrodes GE_M may have a second thickness T2. In addition, each of the first upper gate electrodes GE_Ua may have a third thickness T3, and the second upper gate electrode GE_Ub may have a fourth thickness T4.

The third thickness T3 may be greater than at least one of the first thickness T1 and/or the second thickness T2. For example, the third thickness T3 may be greater than each of the first and second thicknesses T1 and T2. For example, the fourth thickness T4 may be greater than the third thickness T3. For example, the fourth thickness T4 may be greater than each of the first, second and third thicknesses T1, T2, and T3.

The lower gate electrodes GE_L and the intermediate gate electrodes GE_M may have gate pads (G_P2*al* in FIG. 6D, G_P2*a*2 in FIG. 6C, and G_P2*b*1 in FIG. 6D, G_P2*b*2 in FIG. 6C) disposed in the second connection region R1*b*. A thickness of each of the gate pads (G_P2*al* in FIG. 6D, G_P2*a*2 in FIG. 6D, G_P2*b*1 in FIG. 6D, and G_P2*b*2 in FIG. 6C) of the lower gate electrodes GE_L and the intermediate gate electrodes GE_M may be greater than each of the first and second thicknesses (T1 and T2 in FIG. 6A).

The upper gate electrodes GE_U may have gate pads (G_P1*a* in FIG. 6B and G_P1*b* in FIG. 5) disposed in the first connection region R1*a*. A thickness of each of the gate pads (G_P1*a* in FIG. 6B) of the first upper gate electrodes GE_Ua may be greater than the third thickness (T3 in FIG. 6A). The gate pad of the second upper gate electrode GE_Ub (G_P1*b* in FIG. 5) may have the fourth thickness (T4 in FIG. 6A).

The gate pads (G_P1*a* in FIG. 6B and G_P1*b* in FIG. 5) of the upper gate electrodes GE_U may be the gate pads P1*b* of the first and second upper gate lines UL1*a* and UL1*b* described in FIG. 3A.

The gate pads (G_P2*al* in FIG. 6D, G_P2*a*2 in FIG. 6C, G_P2*b*1 in FIG. 6D, G_P2*b*2 in FIG. 6C) of the lower gate electrodes GE_L and the intermediate gate electrodes GE_M may be the first and second lower gate lines LL1*a* and LL1*b*, and the gate pads P1*a* of the first word lines WL1 described in FIG. 3A.

The gate pads of the gate electrodes GE may include first lower gate pads (G_P2*al* in FIG. 6D) having a staircase structure sequentially lowered as the gate pads are further disposed in the +X-direction, second lower gate pads (G_P2*a*2 in FIG. 6C) having a staircase structure sequentially lowered in the +X-direction, first upper gate pads (G_P2*b*1 in FIG. 6D) having a staircase structure sequentially lowered as the gate pads are further disposed in the +X-direction, second upper gate pads (G_P2*b*2 in FIG. 6C) having a staircase structure sequentially lowered as the gate pads are further disposed in the +X-direction, and third upper gate pads (G_P1*a* in FIG. 6B) having a staircase structure sequentially lowered as the gate pads are further disposed in the −X-direction.

The first lower gate pads (G_P2*al* in FIG. 6D) may include gate pads of the first intermediate gate electrodes disposed in a lower portion of the first intermediate gate electrodes GE_Ma, and gate pads of the lower gate electrodes GE_L. The second lower gate pads (G_P2*a*2 in FIG. 6C) may include gate pads of the first intermediate gate electrodes disposed in an upper portion of the first intermediate gate electrodes GE_Ma. The first upper gate pads (G_P2*b*1 in FIG. 6D) may include gate pads of the second intermediate gate electrodes disposed in a lower portion of the second intermediate gate electrodes GE_Mb. The second upper gate pads (G_P2*b*2 in FIG. 6C) may include gate pads of the second intermediate gate electrodes disposed in an upper portion of the second intermediate gate electrodes GE_Mb. The third upper gate pads (G_P1*a* in FIG. 6B) may include gate pads of the first upper gate electrodes GE_Ua.

The second lower gate pads (G_P2*a*2 in FIG. 6C) may be disposed on a level higher than a level of the first lower gate pads (G_P2*al* in FIG. 6D). The first upper gate pads (G_P2*b*1 in FIG. 6D) may be disposed on a level higher than a level of the second lower gate pads (G_P2*a*2 in FIG. 6C). The second upper gate pads (G_P2*b*2 in FIG. 6C) may be disposed on a level higher than a level of the first upper gate pads (G_P2*b* in FIG. 6D) 1. The third upper gate pads (G_P1*a* in FIG. 6B) may be disposed on a level higher than a level of the second upper gate pads (G_P2*b*2 in FIG. 6C).

The first lower gate pads (G_P2*al* in FIG. 6D), the second lower gate pads (G_P2*a*2 in FIG. 6C), the first upper gate pads (G_P2*b*1 in FIG. 6D), and the second upper gate pads (G_P2*b*2 in FIG. 6C) might not overlap each other in the vertical direction Z.

The first lower gate pads (G_P2*al* in FIG. 6D) may be disposed in a position more spaced apart from the first memory cell array region M1 further than the second lower gate pads (G_P2*a*2 in FIG. 6C). The first upper gate pads (G_P2*b*1 in FIG. 6D) may be disposed in a position more spaced apart from the first memory cell array region M1 than the second upper gate pads (G_P2*b*2 in FIG. 6C).

In example embodiments of the present inventive concept, a position in which the first lower gate pads (G_P2*al* in FIG. 6D), the second lower gate pads (G_P2*a*2 in FIG. 6C), the first upper gate pads (G_P2*b*1 in FIG. 6D), and the second upper gate pads (G_P2*b*2 in FIG. 6C) are spaced apart from the first memory cell array region M1 is not limited to the example illustrated in FIG. 5, and may vary.

Figure 4:
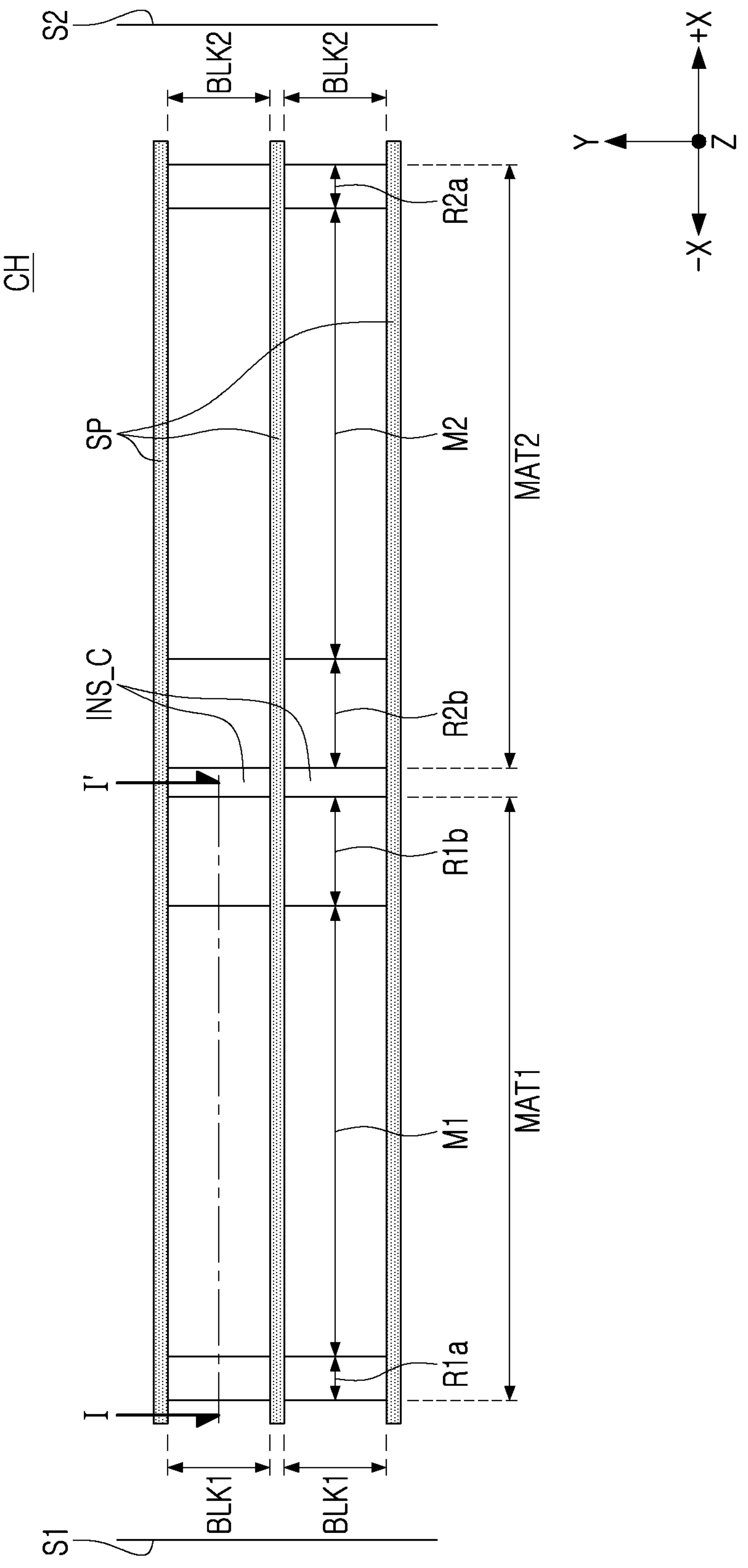
FIGS. 4, 5, 6A, 6B, 6C, and 6D are diagrams illustrating a semiconductor device according to an example embodiment of the present inventive concept.

The first structure ST1 may further include an insulating capping structure (INS_C in FIG. 4). The insulating capping structure (INS_C in FIG. 4) may be disposed between the first memory mat MAT1 and the second memory mat MAT2.

The insulating capping structure (INS_C in FIG. 4) may include a first lower insulating capping pattern (INS_C1*c* in FIG. 6D), a second lower insulating capping pattern (INS_C1*b* in FIG. 6C), a first upper insulating capping pattern (INS_C2*c* in FIG. 6D), and a second upper insulating capping pattern (INS_C2*b* in FIG. 6*c*).

The first lower insulating capping pattern (INS_C1*c* in FIG. 6D) and the second lower insulating capping pattern (INS_C1*b* in FIG. 6C) may be disposed on a level that is lower than a level of the second stack structure GS2. For example, the first lower insulating capping pattern (INS_C1*c* in FIG. 6*d*) and the second lower insulating capping pattern (INS_C1*b* in FIG. 6*c*) may be disposed on a level lower than a level of the lowermost second intermediate gate electrode among the second intermediate gate electrodes GE_Mb.

The first lower insulating capping pattern (INS_C1*c* in FIG. 6D) may be disposed on the first lower gate pads (G_P2*al* in FIG. 6D), and may penetrate gate electrodes and interlayer insulating layers on a level higher than a level of the first lower gate pads (G_P2*al* in FIG. 6D) in the vertical direction Z. In addition, the first lower insulating capping pattern (INS_C1*c* in FIG. 6D) may penetrate the first lower gate electrode GE_La. Accordingly, end portions of the lower gate electrodes GE_L and the first intermediate gate electrodes GE_Ma disposed in the +X-direction may be adjacent to the first lower insulating capping pattern (INS_C1*c* in FIG. 6D).

The second lower insulating capping pattern (INS_C1*b* in FIG. 6C) may be disposed on the second lower gate pads (G_P2*a*2 in FIG. 6C), and may penetrate gate electrodes and interlayer insulating layers on a level higher than a level of the second lower gate pads (G_P2*a*2 in FIG. 6C) in the vertical direction Z.

The first upper insulating capping pattern (INS_C2*c* in FIG. 6D), and the second upper insulating capping pattern (INS_C2*b* in FIG. 6C) may be disposed on a level higher than a level of the uppermost first intermediate gate electrode among the first intermediate gate electrodes GE_Ma.

The first upper insulating capping pattern (INS_C2*c* in FIG. 6D) may be disposed on the first upper gate pads (G_P2*b*1 in FIG. 6D), and may cover the first upper gate pads (G_P2*b*1 in FIG. 6D) in the vertical direction Z. In addition, the first upper insulating capping pattern (INS_C2*c* in FIG. 6D) penetrate the second intermediate gate electrodes GE_Mb and the first upper gate electrodes GE_Ua.

The second upper insulating capping pattern (INS_C2*b* in FIG. 6C) may be disposed on the second upper gate pads (G_P2*b*2 in FIG. 6C), and may penetrate gate electrodes and interlayer insulating layers on a level higher than a level of gate pads of the second upper gate pads (G_P2*b*2 in FIG. 6C) in the vertical direction Z.

The gate electrodes GE that are in the first memory mat MAT1 may be spaced apart from the gate electrodes GE that are in the second memory mat MAT2.

The lower gate electrodes GE_L, the intermediate gate electrodes GE_M, and the first upper gate electrodes GE_Ua that are in the first memory mat MAT1 may be spaced apart from the lower gate electrodes GE_L, the intermediate gate electrodes GE_M, and the first upper gate electrodes GE_Ua that are in the second memory mat MAT2 by the first lower insulating capping pattern (INS_C1*c* in FIG. 6D), the second lower insulating capping pattern (FIG. 1INS_C1*b* in 6C), the first upper insulating capping pattern (INS_C2*c* in FIG. 6D), and the second upper insulating capping pattern (INS_C2*b* in FIG. 6C).

Among the gate electrodes GE, the lower gate electrodes GE_L, the intermediate gate electrodes GE_M, and the first upper gate electrodes GE_Ua in the first memory mat MAT1 and gate electrodes GE_F disposed between the lower gate electrodes GE_L, the intermediate gate electrodes GE_M, and the first upper gate electrodes GE_Ua in the second memory mat MAT2 may be dummy gate electrodes that are electrically isolated. For example, in FIGS. 6C and 6D, the dummy gate electrodes GE_F may be gate electrodes GE disposed on the right side of the second lower insulating capping pattern (INS_C1*b* in FIG. 6C), gate electrodes GE disposed on the right side of the first upper insulating capping pattern (INS_C2*c* in FIG. 6D), and gate electrodes GE disposed on the right side of the second upper insulating capping pattern (INS_C2*b* in FIG. 6C).

The first structure ST1 may further include external capping insulating structures (INS_C1*a* and INS_C2*a* in FIG. 6B).

The external capping insulating structure (INS_C1*a*, INS_C2*a* in FIG. 6B) may be disposed to at least partially surround external side surfaces of the lower gate electrodes GE_L, the intermediate gate electrodes GE_M, and the first upper gate electrodes GE_Ua of the first and second memory mats MAT1 and MAT2. For example, a portion of the external capping insulating structure (INS_C1*a*, INS_C2*a* in FIG. 6B) may be disposed on the external side surfaces of the lower gate electrodes GE_L, the intermediate gate electrodes GE_M, and the first upper gate electrodes GE_Ua and may cover the third upper gate pads (G_P1*a* in FIG. 6B).

The insulating capping structure (INS_C in FIG. 4) may include a first lower insulating capping pattern (INS_C1*c* in FIG. 6D), a second lower insulating capping pattern (INS_C1*b* in FIG. 6C), a first upper insulating capping pattern (INS_C2*c* in FIG. 6D), and a second upper insulating capping pattern (INS_C2*b* in FIG. 6C).

The external capping insulating structure (INS_C1*a*, INS_C2*a* in FIG. 6B) may include a first external capping insulating structure (INS_C1*a* in FIG. 6B) and a second external capping insulating structure (INS_C2*a* in FIG. 6B).

The first external capping insulating structure (INS_C1*a* in FIG. 6B) may be disposed on the insulating pattern 109, and may be disposed on external side surfaces of the lower gate electrodes GE_L, the intermediate gate electrodes GE_M, and the first interlayer insulating layers ILDa.

The second external capping insulating structure (INS_C2*a* in FIG. 6B) may be disposed on the first external capping insulating structure (INS_C1*a* in FIG. 6B), and may be disposed on external side surfaces of the first upper gate electrodes GE_Ua and the second interlayer insulating layers ILDb. In addition, the second external capping insulating structure (INS_C2*a* in FIG. 6B) may cover the third upper gate pads (G_P1*a* in FIG. 6B).

Upper surfaces of the external capping insulating structure (INS_C1*a*, INS_C2*a* in FIG. 6*b*), the first upper insulating capping pattern (INS_C2*c* in FIG. 6*d*), and the second upper insulating capping pattern (INS_C2*b* in FIG. 6*c*) may be disposed on a level higher than a level of an uppermost first upper gate electrode among the first upper gate electrodes GE_Ua.

Upper surfaces of the external capping insulating structure (INS_C1*a*, INS_C2*a* in FIG. 6B), the first upper insulating capping pattern (INS_C2*c* in FIG. 6D), and the second upper insulating capping pattern (INS_C2*b* in FIG. 6C) may be substantially coplanar with an upper surface of an uppermost second interlayer insulating layer among the second interlayer insulating layers ILDb.

The first structure ST1 may further include a buffer insulating layer 120 that is disposed on upper surfaces of the external capping insulating structure (INS_C1*a*, INS_C2*a* in FIG. 6B), the first upper insulating capping pattern (INS_C2*c* in FIG. 6D), and the second upper insulating capping pattern (INS_C2*b* in FIG. 6C), and an upper surface of the uppermost second interlayer insulating layer among the second interlayer insulating layers ILDb. The buffer insulating layer 120 may be an etch stop layer. For example, the buffer insulating layer 120 may include an insulating material such as SiN, SiCN, or SiBN. The second upper gate electrode GE_Ub may be disposed on a level higher than a level of the buffer insulating layer 120.

The first structure ST1 may further include vertical memory structures VS penetrating the gate electrodes GE. For example, the vertical memory structures VS may be disposed in the first and second memory cell array regions M1 and M2.

Each of the vertical memory structures VS may include a first vertical memory structure VS_L, a second vertical memory structure VS_U, and a connection structure VS_C.

The first vertical memory structure VS_L may penetrate the lower gate electrodes GE_L, the intermediate gate electrodes GE_M, the first upper gate electrodes GE_Ua, the first interlayer insulating layers ILDa, and the second interlayer insulating layers ILDb, and may be in contact with the plate pattern 106.

The first vertical memory structure VS_L may include a first insulating core region 116, a first channel layer 114 that is disposed on a side surface of the first insulating core region 116 and connected to the plate pattern 106, and a data storage structure 112 that is disposed on an external side surface of the first channel layer 114.

The first vertical memory structure VS_L may further include a first pad pattern 118 that is disposed on the first insulating core region 116 and connected to the first channel layer 114.

The first insulating core region 116 may include an insulating material such as silicon oxide.

The first channel layer 114 may cover a side surface and a lower surface of the first insulating core region 116. The first channel layer 114 may include a semiconductor material such as polysilicon, single crystal silicon, or oxide semiconductor. A portion of the plate pattern 106 in contact with the first channel layer 114 may include at least doped silicon. For example, the plate pattern 106 may include polysilicon having N-type conductivity. In example embodiments of the present inventive concept, the plate pattern 106 may include polysilicon with N-type conductivity and polysilicon with P-type conductivity.

The data storage structure 112 may include a first dielectric layer 112*a*, a second dielectric layer 112*c*, and a data storage layer 111*b* that is disposed between the first and second dielectric layers 112*a* and 112*b*. The second dielectric layer 112*c* may be in contact with the first channel layer 114.

The first dielectric layer 112*a* may be a blocking dielectric layer. The first dielectric layer 112*a* may include at least one of silicon oxide and/or high-K dielectric. The second dielectric layer 112*c* may be a tunneling dielectric layer. The second dielectric layer 112*c* may include, for example, silicon oxide or silicon oxide doped with impurities.

The data storage layer 112*b* may include a material which may store data by trapping charges, for example, silicon nitride. The data storage layer 112*b* may include regions which may store data in a semiconductor device such as a flash memory device.

In an example embodiment of the present inventive concept, the data storage structure 112 may include the data storage layer 112*b* which may trap charges and may store data, but the present inventive concept is not limited thereto. For example, the data storage structure 112 may be a data storage structure used in a ferroelectric memory which may store data using remnant polarization by dipoles.

The first pad pattern 118 may be disposed on a level higher than a level of the first upper gate electrodes GE_Ua. The first pad pattern 118 may include, for example, polysilicon. For example, the first pad pattern 118 may include doped polysilicon.

The first vertical memory structure VS_L may include a lower vertical portion VS_La, an upper vertical portion VS_Lc disposed on the lower vertical portion VS_La, and a bonding portion VS_Lb disposed between the lower vertical portion VS_La and the upper vertical portion VS_Lc.

In the first vertical memory structure VS_L, the bonding portion VS_Lb may be disposed on a level higher than a level of the uppermost first intermediate gate electrode among the first intermediate gate electrodes GE_Ma, and on a level lower than a level of the lowermost second intermediate gate electrode among the second intermediate gate electrodes GE_Mb.

The bonding portion VS_Lb may have a side surface that is bent from a side surface of the lower vertical portion VS_La and a side surface of the upper vertical portion VS_Lc. For example, the side surface of the bonding portion VS_Lb might not be even.

The connection structure VS_C may penetrate the buffer insulating layer 120 and may be connected to the first pad pattern 118 and the first channel layer 114. The connection structure VS_C may include, for example, polysilicon. A vertical central axis of the connection structure VS_C and A vertical central axis of the first vertical memory structure VS_L might not be aligned.

A vertical central axis of the second vertical memory structure VS_U might not be aligned with a vertical central axis of the first vertical memory structure VS_L.

The second vertical memory structure VS_U may penetrate the second upper gate electrode GE_Ub and may be connected to the connection structure VS_C.

The second vertical memory structure VS_U may include a second insulating core region 126, a second channel layer 124 that is disposed on a side surface of the second insulating core region 126 and connected to the connection structure VS_C, a gate dielectric layer 122 that is disposed on an external side surface of the second channel layer 124, and a second pad pattern 128 that is disposed on the second insulating core region 126.

The second channel layer 124 may include at least one material layer. For example, the second channel layer 124 may include first layer 124*a* and second layer 124*b*. The second layer 124*b* may cover a side surface and a lower surface of the second insulating core region 126 and may be connected to the connection structure VS_C. The first layer 124*a* may be disposed between the second layer 124*b* and the gate dielectric layer 122.

The gate dielectric layer 122 may include at least one of, for example, silicon oxide and high-K dielectric.

The first layer 124*a* and the second layer 124*b* of the second channel layer 124 may include a semiconductor material such as polysilicon, single crystal silicon, or oxide semiconductor. The first layer 124*a* and the second layer 124*b* may be formed of the same semiconductor material as each other, but the present inventive concept is not limited thereto. For example, the first layer 124*a* and the second layer 124*b* may be formed of the same semiconductor material as each other.

In an example embodiment of the present inventive concept, the second channel layer 124 may be formed as a single layer.

The second pad pattern 128 may include, for example, polysilicon. For example, the second pad pattern 128 may include doped polysilicon with N-type conductivity.

The first structure ST1 may further include gate contact plugs 160 and an upper gate contact plug 163.

The gate contact plugs 160 may include first gate contact plugs 160*a* and second contact plugs 160*b*. The first contact plugs 160*a* may be electrically connected to the third upper gate pads (G_P1*a* in FIG. 6B) of the first upper gate electrodes GE_Ua. The second contact plugs 160*b* may be electrically connected to the gate pads of the lower gate electrodes GE_L and the intermediate gate electrodes GE_M (G_P2*al* in FIG. 6D, G_P2*a*2 in FIG. 6C, G_P2*b*1 in FIG. 6D, G_P2*b*2 in FIG. 6C).

The gate contact plugs 160 may include connection plug portions 160P in contact with and connected to the gate pads (G_P2*al* in FIG. 6D, G_P2*a*2 in FIG. 6C, G_P2*b*1 in FIG. 6D, G_P2*b*2 in FIG. 6C), lower plug portions 160_La below the connection plug portions 160P, and first upper plug portions 160_Lb disposed on the connection plug portions 160P. Since the gate pads (G_P2*al* in FIG. 6D, G_P2*a*2 in FIG. 6C, G_P2*b*1 in FIG. 6D, G_P2*b*2 in FIG. 6C) may be disposed on different levels from each other, the connection plug portions 160P in contact with and connected to the gate pads (G_P2*al* in FIG. 6D, G_P2*a*2 in FIG. 6C, G_P2*b*1 in FIG. 6D, G_P2*b*2 in FIG. 6C) may also be disposed on different levels from each other.

Side surfaces of the connection plug portions 160P may be in contact with side surfaces of the gate pads (G_P2*al* in FIG. 6D, G_P2*a*2 in FIG. 6C, G_P2*b*1 in FIG. 6D, G_P2*b*2 in FIG. 6C).

The gate contact plugs 160 may further include second upper plug portions 160_U on the first upper plug portions 160_Lb.

For example, each of the gate contact plugs 160 may include the connection plug portion 160P, the lower plug portion 160_La extending downwardly from the connection plug portion 160P, and the first upper plug portion 160_Lb extending upwardly from the connection portion 160P. Each of the gate contact plugs 160 may include the second upper plug portion 160_U extending upwardly from the first upper plug portion 160_Lb.

In each of the gate contact plugs 160, a width of the connection plug portion 160P may be greater than a width of the lower plug portion 160_La adjacent to the connection plug portion 160P, and may be greater than a width of the first upper plug portion 160_Lb adjacent to the connection plug portion 160P.

In each of the gate contact plugs 160, a width of the second upper plug portion 160_U and a width of the first upper plug portion 160_Lb may be different from each other. For example, the width of the second upper plug portion 160_U adjacent to the first upper plug portion 160_Lb may be greater than the width of the first upper plug portion 160_Lb adjacent to the second upper plug portion 160_U.

The connection plug portions 160P of the first gate contact plugs 160*a*, which is connected to the third upper gate pads (G_P1*a* in FIG. 6B) of the first upper gate electrodes GE_Ua, may be disposed on a level higher than a level of the connection plug portions 160P of the second gate contact plugs 160*b*, which are connected to the gate pads of the lower gate electrodes GE_L and the intermediate gate electrodes GE_M (G_P2*al* in FIG. 6D, G_P2*a*2 in FIG. 6C, G_P2*b*1 in FIG. 6D, G_P2*b*2 in FIG. 6C).

Each of the gate contact plugs 160 may have a lower surface disposed on a level lower than a level of the lowermost gate electrode GE_La among the gate electrodes GE and an upper surface disposed on a level higher than a level of the uppermost gate electrode GE_Ub among the gate electrodes GE.

Each of the gate contact plugs 160 may extend continuously from a lower surface to an upper surface. For example, each of the gate contact plugs 160 may include a conductive layer extending continuously from a level lower than the lowermost gate electrode GE_La of the gate electrodes GE to a level higher than the uppermost gate electrode GE_Ub of the gate electrodes GE.

The first structure ST1 may further include separation insulating layers 158. The separation insulating layers 158 may be disposed between the gate electrodes GE and the gate contact plugs 160 which might not be electrically connected to the gate contact plugs 160. For example, the separation insulating layers 158 may be disposed between the lower plug portions 160_La and the gate electrodes GE, and between the first upper plug portions 160_Lb and the gate electrodes GE. The separation insulating layers 158 may include at least one of, for example, silicon oxide, silicon nitride, and silicon oxynitride.

The upper gate contact plug 163 may be disposed on the gate pad G_P1*b* of the second upper gate electrode GE_Ub. The upper gate contact plug 163 may be in contact with and electrically connected to the gate pad G_P1*b* of the second upper gate electrode GE_Ub. The lower surface of the upper gate contact plug 163 may be in contact with the gate pad G_P1*b* of the second upper gate electrode GE_Ub, and may be disposed on a level higher than a level of the lower surface of the gate pad G_P1*b*.

The bit lines BL described above may be disposed on a level higher than a level of the second upper gate electrode UE_Gb and the gate contact plugs 160.

The first structure ST1 may further include bit line studs BLP disposed between the bit lines BL and the vertical memory structures VS and electrically connected to the bit lines BL and the vertical memory structures VS. Accordingly, the bit lines BL may be electrically connected to the second pad patterns 128 of the vertical memory structures VS through the bit line studs BLP.

The first structure ST1 may include gate studs 166 disposed on the gate contact plugs 160 and electrically connected to the gate contact plugs 160.

The first structure ST1 may further include lower routing wiring structures 169, 172, and 175. The lower routing wiring structures 169, 172, and 175 may include first horizontal wirings 169, first vias 172, and first bonding pads 175. The first bonding pads 175 may be disposed on a level higher than a level of the first horizontal wirings 169 and first vias 172.

The first structure ST1 may further include the first insulating structure INS_U. The first insulating structure INS_U may be disposed on the buffer insulating layer 120 and may have an upper surface coplanar with upper surfaces of the first bonding pads 175.

The second structure ST2 may include a substrate 206, peripheral active regions 209*a* below the substrate 206, and peripheral device isolation region 209*s* forming the peripheral active regions 209*a* below the substrate 206. The substrate 206 may be implemented as a semiconductor substrate.

The second structure ST2 may further include peripheral devices PTR disposed below the substrate 206, upper routing wiring structures 220, 225 and a second insulating structure 230.

The peripheral devices PTR may be included in the peripheral circuit PC described above.

The peripheral devices PTR may include a peripheral transistor including peripheral source/drain regions PTR_SD that are spaced apart from each other in the peripheral active region 209*a*, peripheral channel region PTR_CH between the peripheral source/drain regions PTR_SD, and peripheral gate PTR_G below the peripheral active region 209*a*.

The upper routing wiring structures 220 and 225 may be buried in the upper insulating structure 230 and may be electrically connected to the peripheral devices PTR. The upper routing wiring structures 220 and 225 may include wiring portions 220 including horizontal portions and vertical portions, and second bonding pads 225 having a lower surface substantially coplanar with a lower surface of the second insulating structure 230 below the wiring portions 220. The first bonding pads 175 and the second bonding pads 225 may be bonded to each other through an inter-metal bonding process. The lower routing wiring structures 169, 172, 175, the upper routing wiring structures 220, 225, and the gate contact plugs 160, the gate studs 166, and the upper gate contact plug 163 may be included in the routing wiring structures described above (1115*a* and 1115*b* in FIG. 2)

In the description below, various modified examples of the above-described example embodiment to increase integration density of the semiconductor device CH and to increase reliability will be described with reference to FIGS. 9 to 22. Various modified examples of elements of the above-described example embodiment described below will be described based on modified elements, replaced elements, or added elements. In addition, elements which may be modified or replaced in the various modified examples described below may be combined with each other or with the elements described above and may be included a semiconductor device according to an example embodiment of the present inventive concept.

Figure 7:
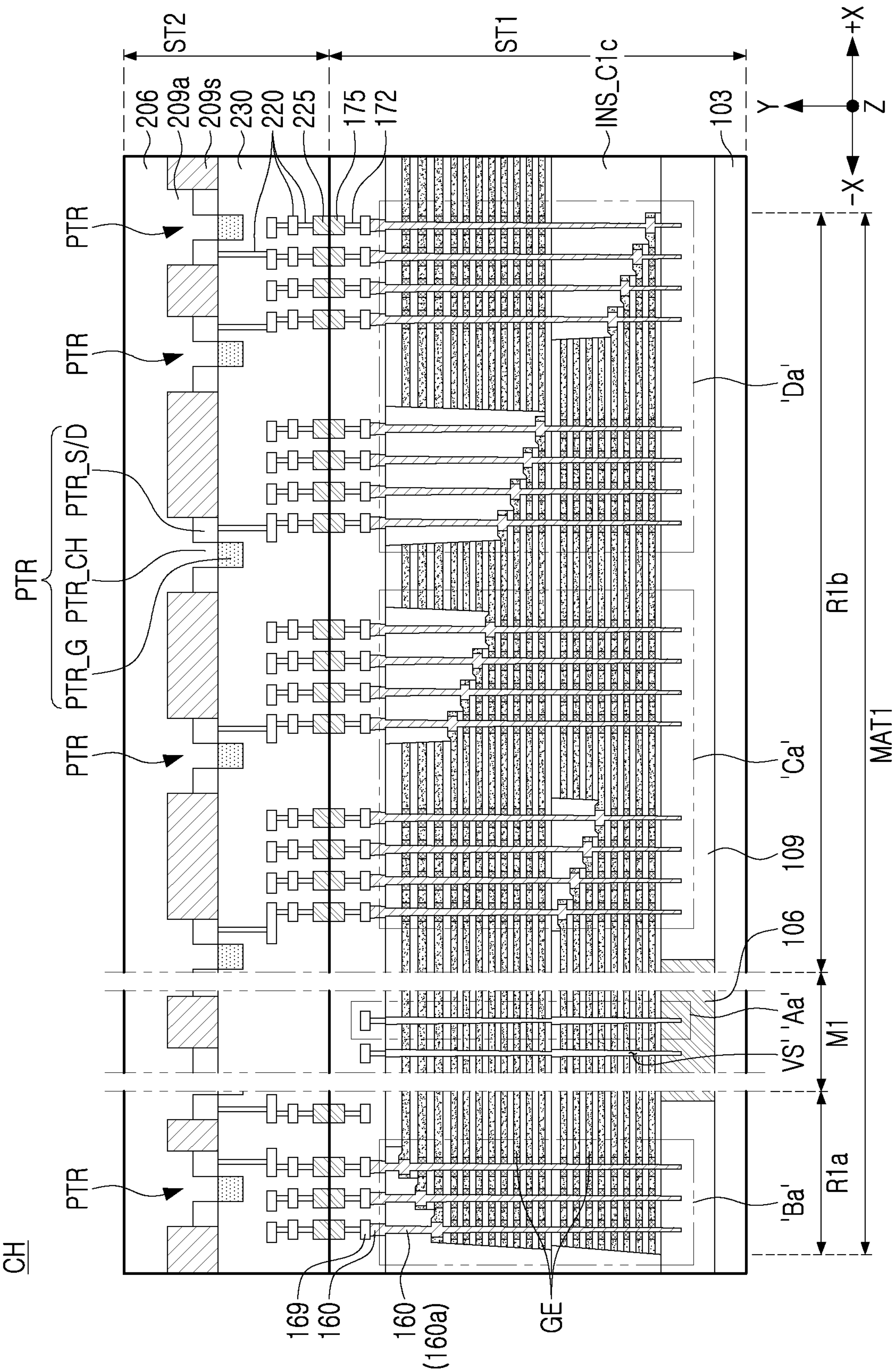
FIGS. 7, 8A, and 8B are diagrams illustrating a semiconductor device according to an example embodiment of the present inventive concept.
Figure 8A:
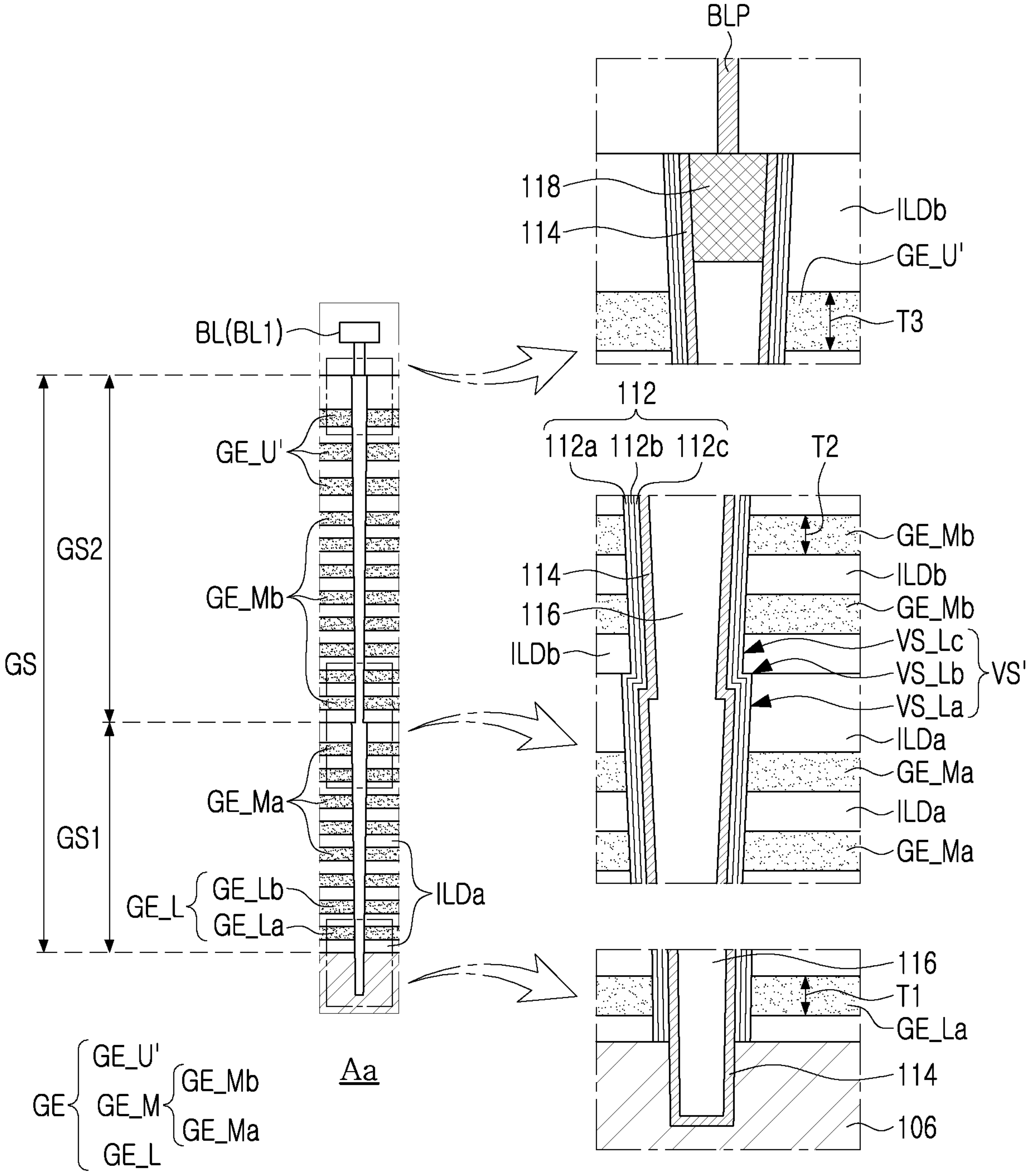
Figure 8B:
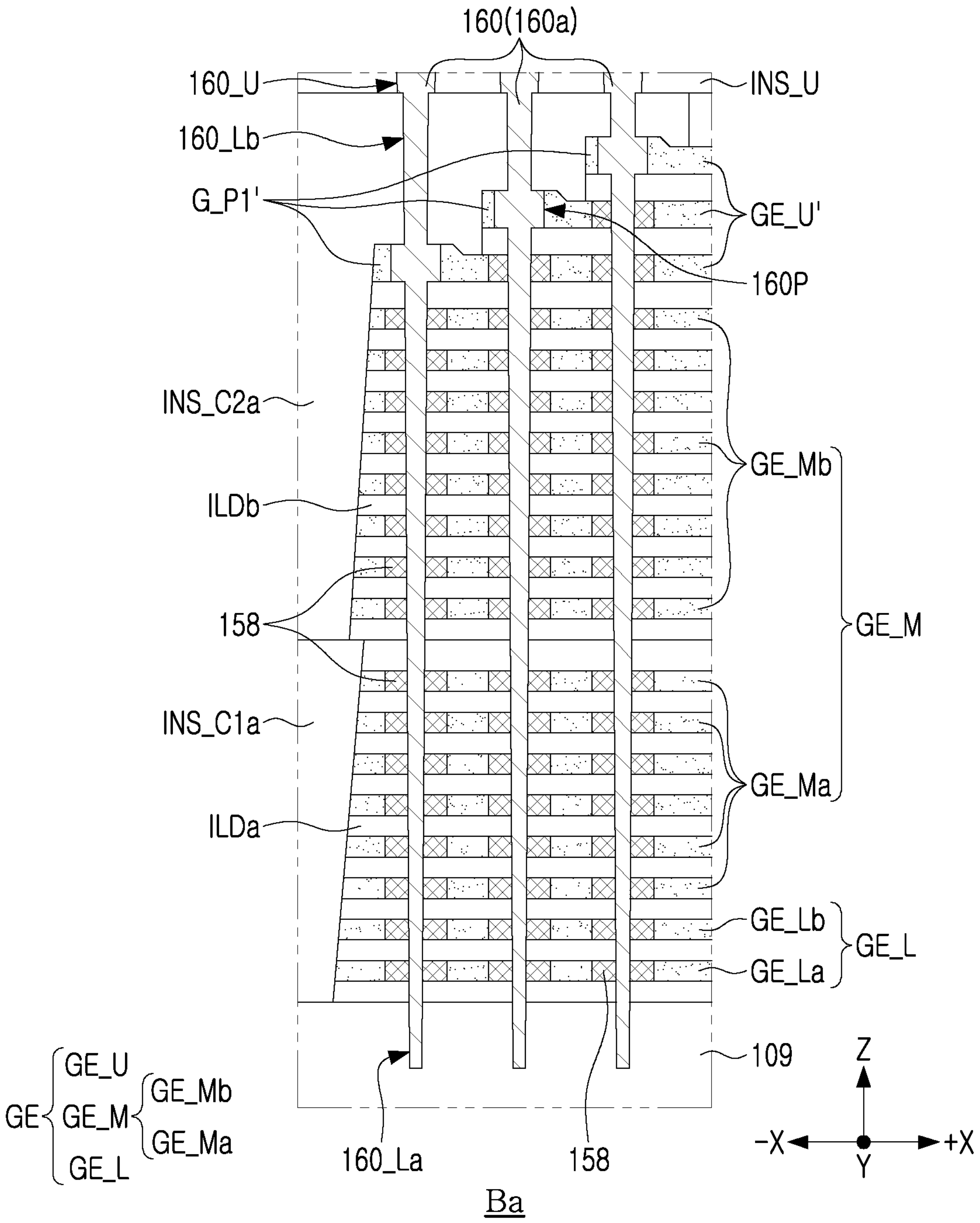

FIG. 7 is a cross-sectional diagram illustrating a region taken along line I-I' in FIG. 4, illustrating a semiconductor device according to an example embodiment of the present inventive concept, FIG. 8A is an enlarged diagram illustrating region "Aa" in FIG. 7, and FIG. 8B is an enlarged diagram illustrating region "Ba" in FIG. 7.

Referring to FIGS. 4, 7, 8A, and 8B, in the semiconductor device CH described above, the second upper gate electrode (GE_Ub in FIGS. 5 and 6A) described with reference to FIGS. 5 to 6D might not be provided. Accordingly, the first upper gate electrodes (GE_Ua in FIGS. 5 to 6D) described above may be referred to as upper gate electrodes GE_U'. Accordingly, the upper gate electrodes GE_U' may have gate pads G_P1' substantially the same as the gate pads (G_P1*a* in FIG. 6B) described above.

In an example embodiment of the present inventive concept, the second upper gate electrode (GE_Ub in FIGS. 5 and 6A) might not be provided, and the upper gate electrodes GE_U' may include a select gate electrode which may be the string select gate line of the string select transistor described above, and an erase control gate electrode which may be the erase control gate line of the erase control transistor described above. For example, among the upper gate electrodes GE_U', the uppermost gate electrode and the second-highest gate electrode may be an erase control gate electrode, which may be the erase control gate line of the erase control transistor described above, and the gate electrode below the erase control gate electrode may be a select gate electrode, which may be the string select gate line of the string select transistor described above.

The vertical memory structures (VS in FIGS. 5 and 6A) described above may be replaced with vertical memory structures VS' as illustrated in FIGS. 7 and 8A. For example, in the vertical memory structures (VS in FIGS. 5 and 6A), the second vertical memory structures VS_U and the connection structures VS_C might not be provided. Accordingly, the cross-sectional structure of the vertical memory structures VS' may be substantially the same as the cross-sectional structure of the first vertical memory structures VS_L in FIG. 6A. The bit line studs BLP described previously may be connected to the first pad patterns 118 of the vertical memory structures VS'.

Figure 9:
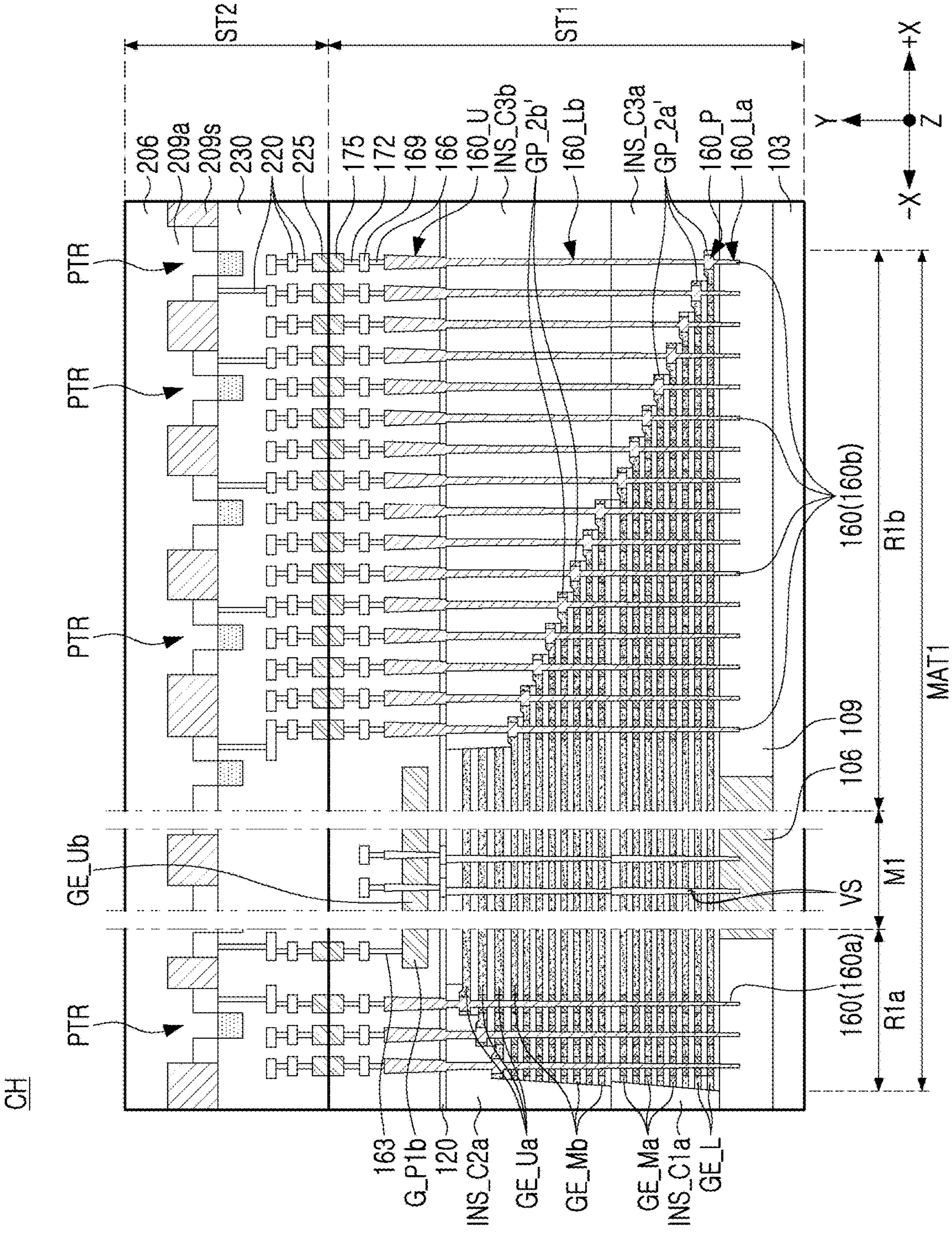
FIG. 9 is a cross-sectional diagram illustrating a semiconductor device according to an example embodiment of the present inventive concept.

FIG. 9 is a cross-sectional diagram illustrating a region taken along line I-I' in FIG. 4, illustrating a semiconductor device according to an example embodiment of the present inventive concept.

In a modified example, referring to FIGS. 4 and 9, the gate pads (G_P2*al* in FIG. 6D, G_P2*a*2 in FIG. 6C, G_P2*b*1 in FIG. 6D, G_P2*b*2 in FIG. 6C) of the second intermediate gate electrodes GE_Mb, the first intermediate gate electrodes GE_Ma and the lower gate electrodes GE_L disposed in the second connection region R1*b* replaced with gate pads GP_2*b*', GP_2*a*' that are arranged in a staircase shape sequentially lowered as the gate pads GP_2*b*', GP_2*a*' are further disposed in the +X-direction, as illustrated in FIG. 9.

The first lower insulating capping pattern (INS_C1*c* in FIG. 6D) and the second lower insulating capping pattern (INS_C1*b* in FIG. 6C) described above may be modified to a lower insulating capping pattern INS_C3*a* covering the gate pads GP_2*a*' of the first intermediate gate electrodes GE_Ma and the lower gate electrodes GE_L as illustrated in FIG. 9.

The first upper insulating capping pattern (INS_C2*c* in FIG. 6D) and the second upper insulating capping pattern (INS_C2*b* in FIG. 6C) described above may be modified to an upper insulating capping pattern INS_C3*b* covering the gate pads GP_2*b*' of the second intermediate gate electrodes GE_Mb.

The upper insulating capping pattern INS_C3*b* may be disposed on the lower insulating capping pattern INS_C3*a* and may be in contact with the lower insulating capping pattern INS_C3*a*.

The connection plug portions 160P of the second gate contact plugs 160*b* described above may be arranged according to the arrangement shape of the gate pads GP_2*b*' and GP_2*a*'. Accordingly, the connection plug portions 160P of the second gate contact plugs 160*b* may be arranged to sequentially lower in the +X-direction.

Figure 10:
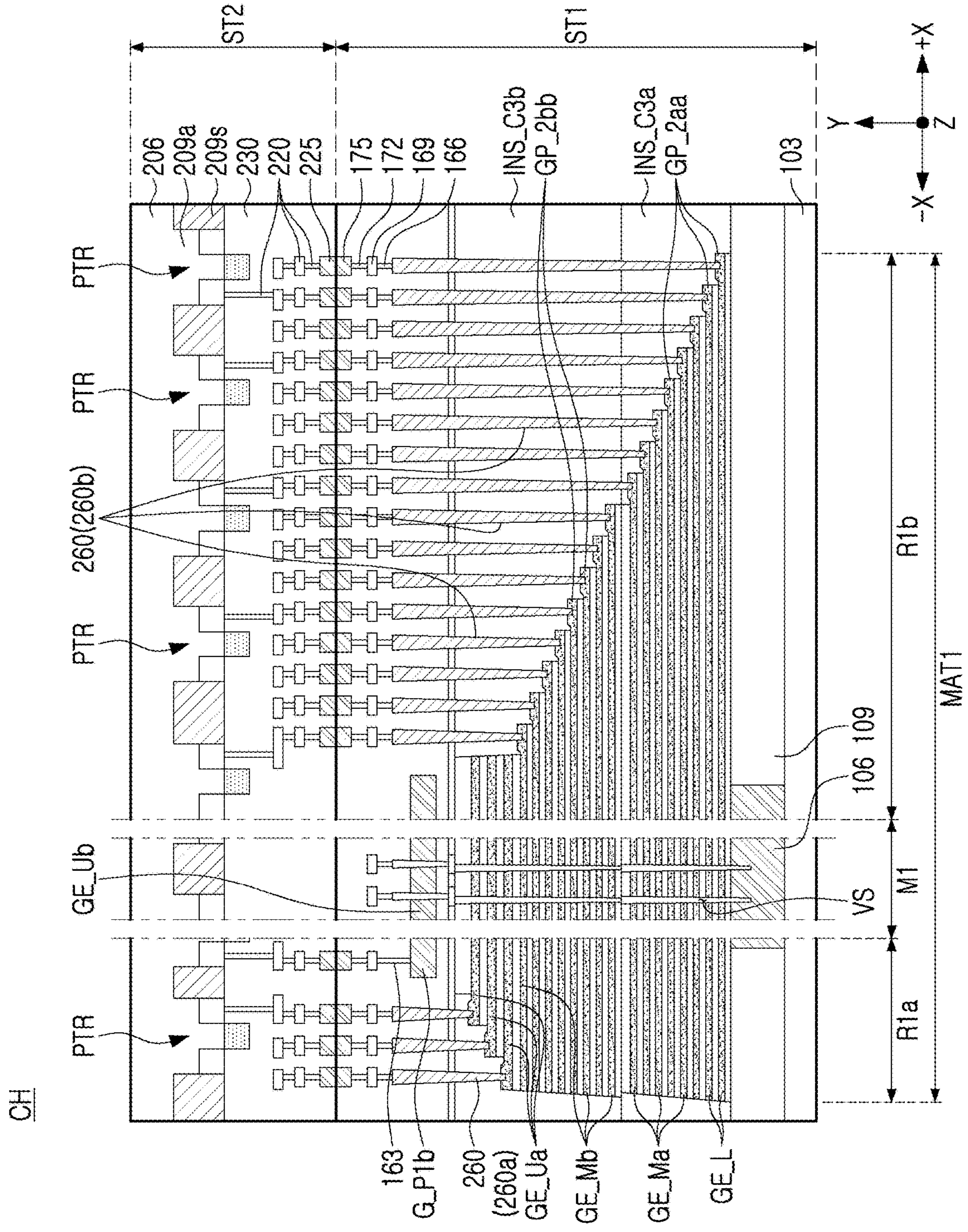
FIG. 10 is a cross-sectional diagram illustrating a semiconductor device according to an example embodiment of the present inventive concept.

FIG. 10 is a cross-sectional diagram illustrating a region taken along line I-I' in FIG. 4, illustrating a semiconductor device according to an example embodiment of the present inventive concept.

Referring to FIGS. 4 and 10, the second intermediate gate electrodes GE_Mb, the first intermediate gate electrodes GE_Ma and the lower gate electrodes GE_L disposed in the second connection region R1*b* may have gate pads GP_2*bb* and GP_2*aa* arranged to be sequentially lowered as the gate pads GP_2*bb* and GP_2*aa* are further disposed in the +X-direction. The first upper gate electrodes GE_Ua may have gate pads GP_1 arranged in a staircase shape lowered as the gate pads GP_1 are further disposed in the −X-direction, such as the gate pads (G_P1*a* in FIG. 6B) described above.

The gate contact plugs (160 in FIG. 9) described above may be modified to gate contact plugs 260 that are not penetrating gate electrodes that are disposed on a level lower than a level of the gate pads in the vertical direction Z. The gate contact plugs 260 may have lower surfaces in contact with gate pads. For example, the first gate contact plugs 160*a* described above may be modified to first gate contact plugs 260*a* disposed on the gate pads GP_1 of the first upper gate electrodes GE_Ua, and the second gate contact plugs 160*b* described above may be modified to the second gate contact plugs 160*b*. The intermediate gate electrodes GE_Mb, the first intermediate gate electrodes GE_Ma and the lower gate electrodes GE_L may be modified to second gate contact plugs 260*b* disposed on the gate pads GP_2*bb* and GP_2*aa*.

Figure 11:
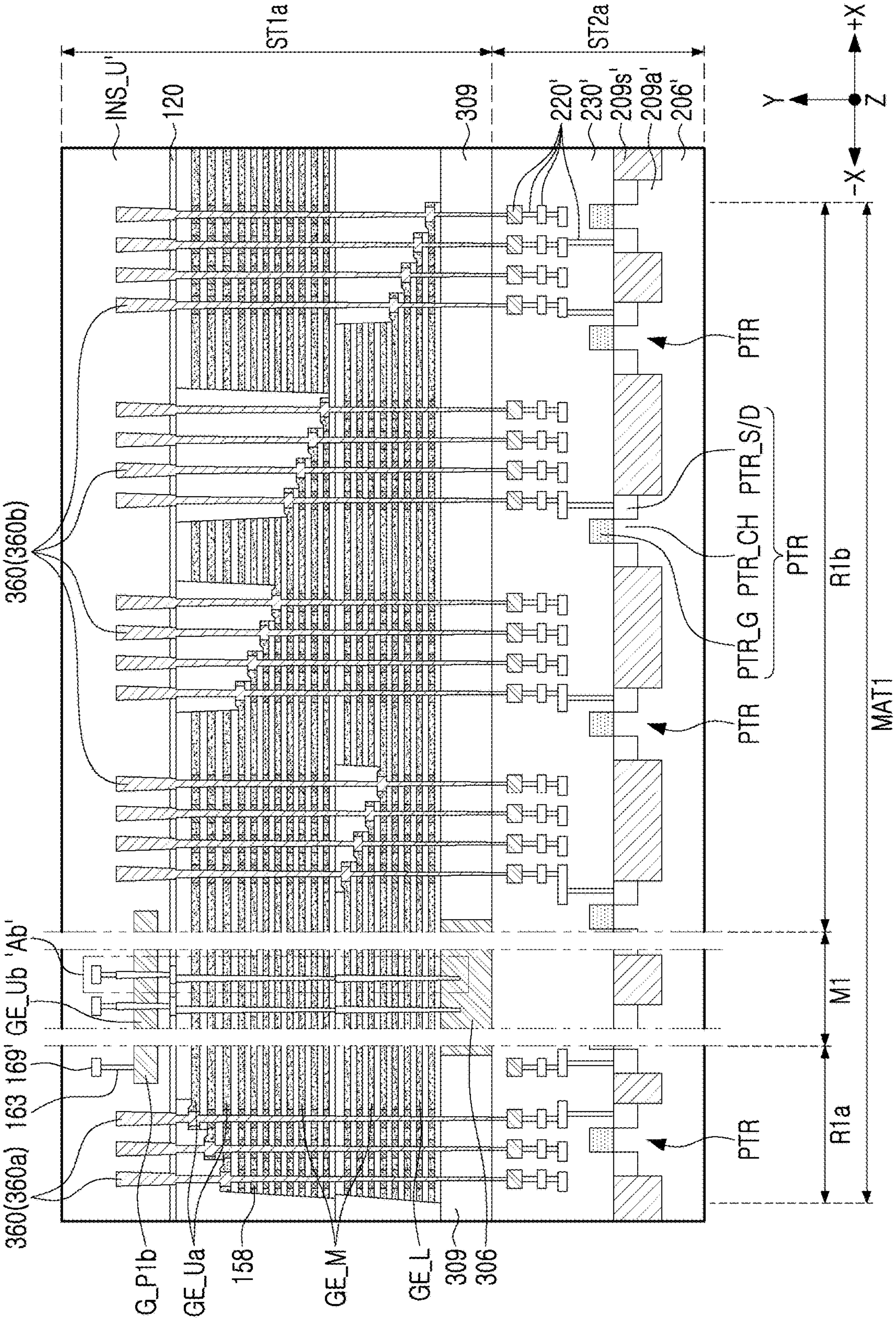
FIGS. 11 and 12 are diagrams illustrating a semiconductor device according to an example embodiment of the present inventive concept.
Figure 12:
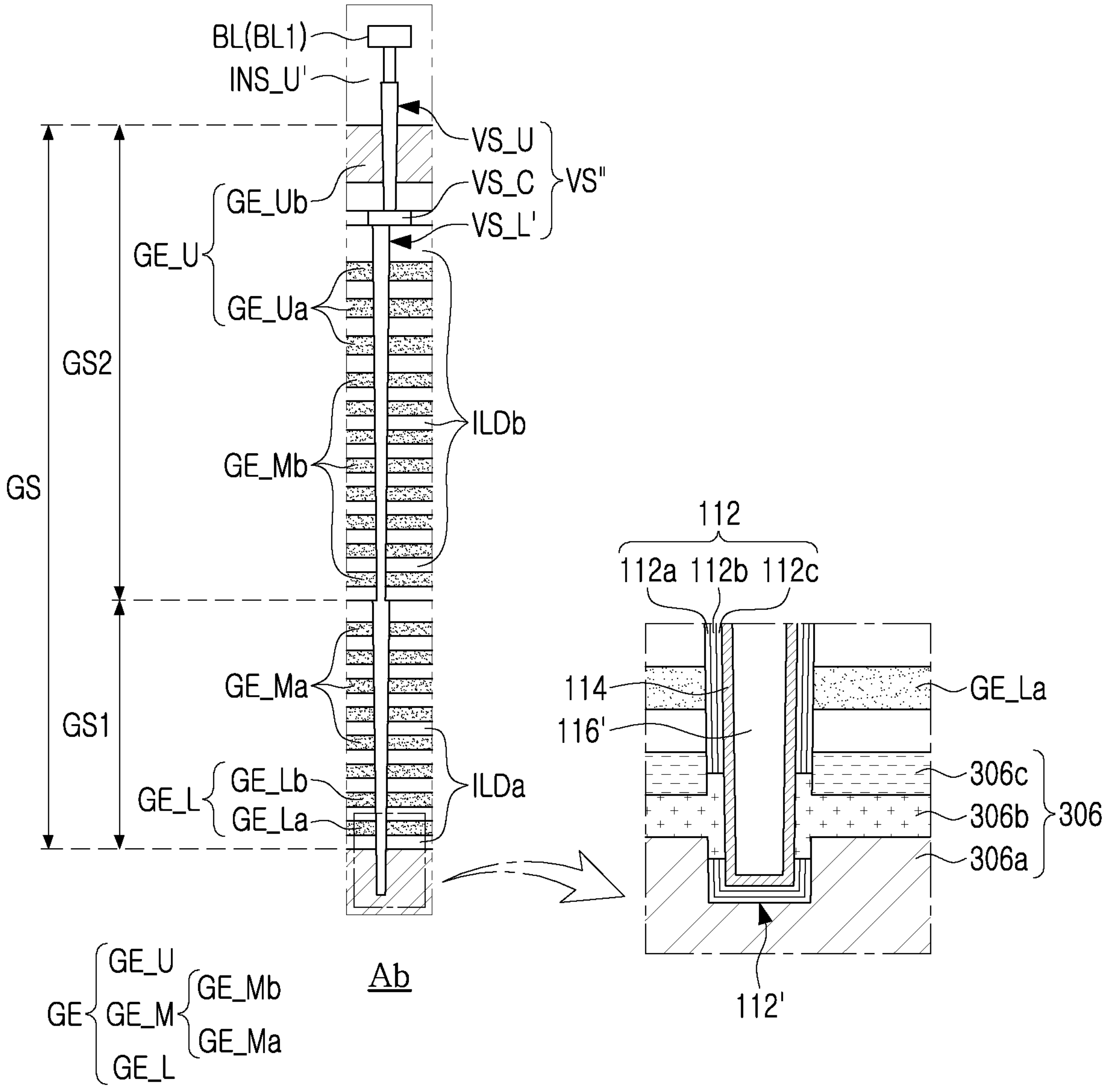

FIG. 11 is a cross-sectional diagram illustrating a region taken along line I-I' in FIG. 4, illustrating a semiconductor device according to an example embodiment of the present inventive concept, and FIG. 12 is an enlarged diagram illustrating region "Ab."

In a modified example, referring to FIGS. 4, 11 and 12, the first structure ST1 and the second structure ST2 described above may be modified to the first structure ST1*a* and the second structure ST2*a* as in FIGS. 11 and 12.

The second structure ST2*a* may be disposed below the first structure ST1*a*.

The second structure ST2*a* may include a substrate 206', peripheral active regions 209*a*' on the substrate 206', a peripheral device isolation region 209*s*' forming the peripheral active regions 209*a*' on the substrate 206', peripheral devices PTR on the substrate 206', an upper routing wiring structure 220' and a second insulating structure 230'. As described above, a peripheral transistor including peripheral source/drain regions that are spaced apart from each other in the peripheral active region 209*a*' PTR_SD, peripheral channel region PTR_CH between the peripheral source/drain regions PTR_SD, and a peripheral gate PTR_G on the peripheral channel region PTR_CH may be included.

The upper routing wiring structure 220' may be buried in the upper insulating structure 230' and may be electrically connected to the peripheral devices PTR. The upper routing wiring structure 220' may include horizontal portions and vertical portions. An upper surface of the upper insulating structure 230' may be disposed on a level higher than a level of the upper surface of the upper routing wiring structure 220'.

The first structure ST1*a* may be disposed on the upper insulating structure 230'.

The first structure ST1*a* may include a plate pattern 306, and an insulating pattern 309 on a side surface of the plate pattern 306. The first structure ST1*a* may include the stack structure GS substantially the same as the example described above. For example, the first structure ST1*a* may include the gate electrodes GE and the interlayer insulating layers ILDa and ILDb as in one of the example embodiments described above. The gate electrodes GE_L, GE_M, GE_Ua, and GE_Ub may be disposed on the plate pattern 306 and the insulating pattern 309. Accordingly, the gate electrodes GE_L, GE_M, GE_Ua, and GE_Ub may have gate pads according to one of the example embodiments described above.

The vertical memory structure VS described above may be modified to vertical memory structure VS" as illustrated in FIG. 12. Accordingly, the first structure ST1*a* may include the vertical memory structure VS".

The vertical memory structure VS" may include a first vertical memory structure VS_L' of which a lower region is modified from the first vertical memory structure VS_L described above. Accordingly, the vertical memory structure VS" may include the first vertical memory structure VS_L', the second vertical memory structure VS_U and the connection structure VS_C described above.

The plate pattern 306 may include a first layer 306*a*, a second layer 306*b* that is disposed on the first layer 306*a*, and a third layer 306*c* that is disposed on the second layer 306*b*. At least one of the first to third layers 306*a*, 306*b*, and 306*c* may include, for example, polysilicon. For example, the second layer 306*b* may include a polysilicon layer having N-type conductivity.

As described above, the first vertical memory structure VS_L' may include the insulating core region 116, the channel layer 114 covering a side surface and a lower surface of the insulating core region 116, and the data storage structure 112 disposed on the external side surface of the channel layer 114. The first vertical memory structure VS_L' may be formed of the same material layers as that of the data storage structure 112 and may further include a dummy data storage structure 112' covering a lower surface of the channel layer 114 and a side surface of the lower region of the channel layer 114. The channel layer 114 may be spaced apart from the first layer 306*a* by the dummy data storage structure 112'.

The second layer 306*b* may pass between the data storage structure 112 and the dummy data storage structure 112' and may be in contact with the channel layer 114.

The first structure ST1*a* may include gate contact plugs 360 configured to be electrically connected to gate pads of the lower, intermediate and first upper gate electrodes GE_L, GE_M, and GE_Ua. The first structure ST1*a* may further include an upper gate contact plug 163 configured to be electrically connected to the gate pad of the second upper gate electrode GE_Ub, and upper gate connection wiring 169' disposed on the upper gate contact plug 163.

The gate contact plugs 360 may be configured to be electrically connected to the upper routing wiring structure 220'. For example, the gate contact plugs 360 may extend downwardly from the gate contact plugs 160 as illustrated in FIGS. 5 and 6B to 6D and may penetrate the insulating pattern 309, and may be electrically connected to the pad portions of the upper routing wiring structure 220'. Accordingly, the gate contact plugs 360 may have a shape extending downwardly from the shape of the gate contact plugs 160 as illustrated in FIGS. 5 and 6B to 6D.

Figure 13:
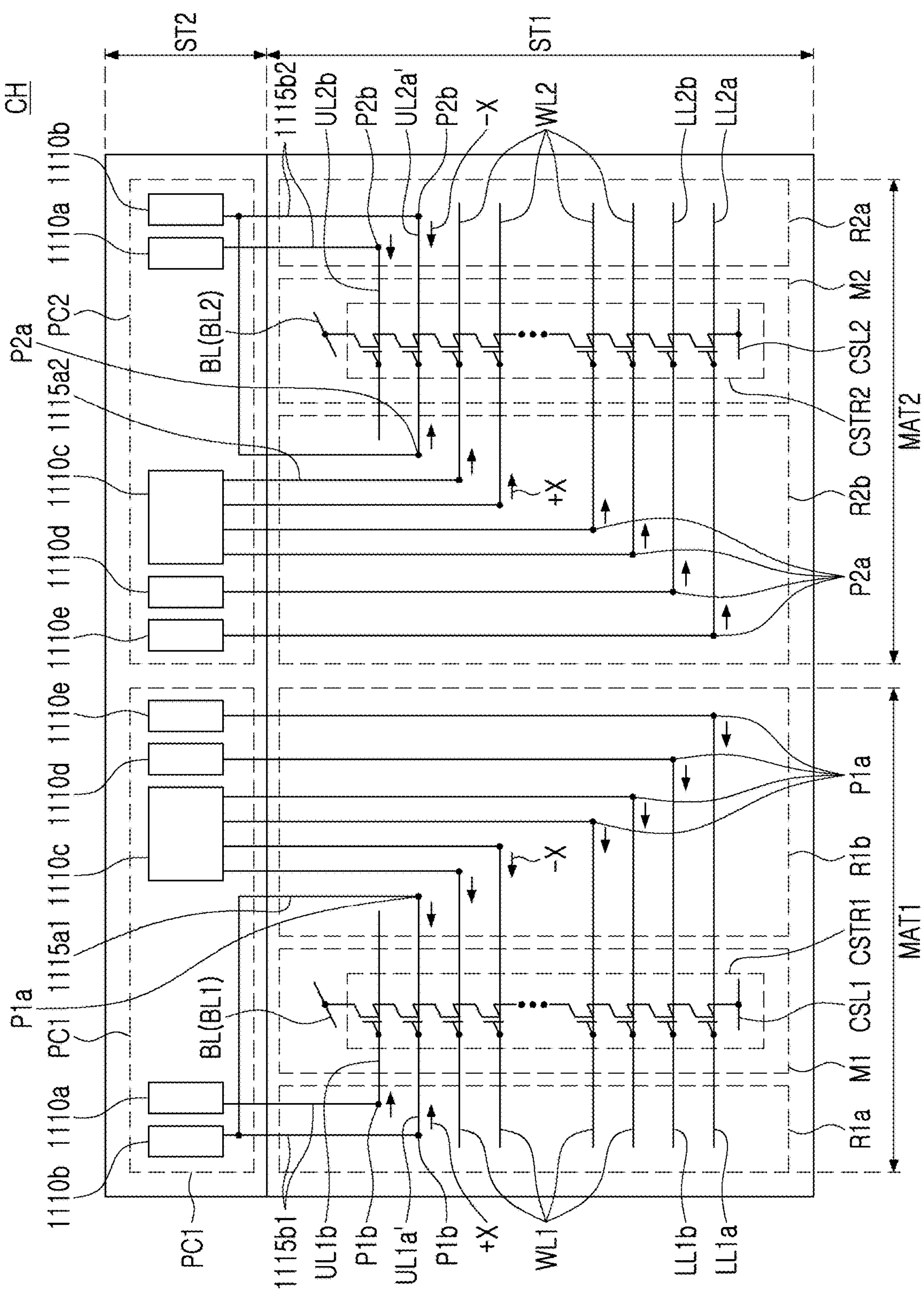
FIGS. 13 and 14 are diagrams illustrating a semiconductor device according to an example embodiment of the present inventive concept.
Figure 14:
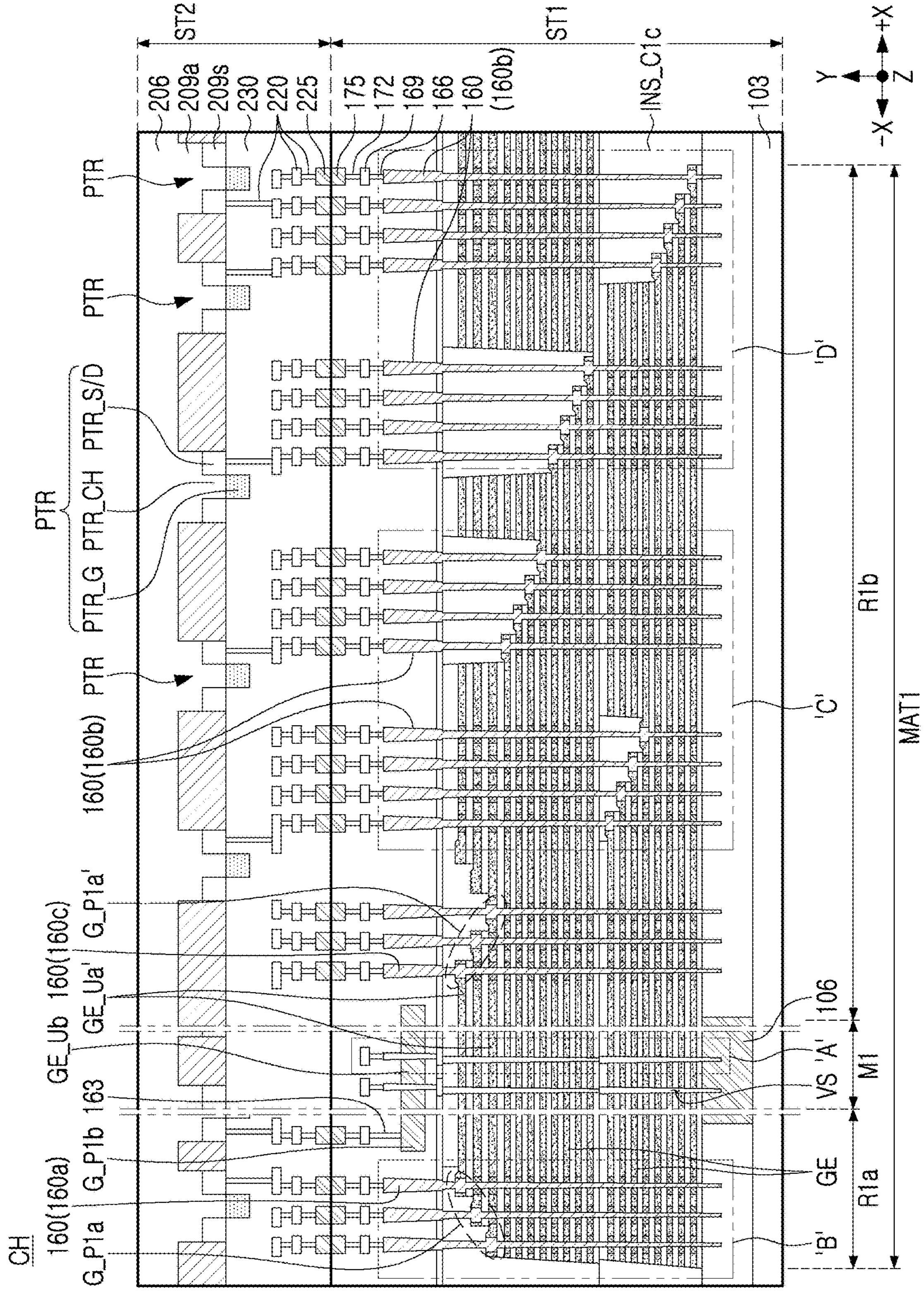

FIG. 13 is a diagram illustrating a semiconductor device according to an example embodiment of the present inventive concept. For example, the diagram of FIG. 13 may be a modified example of the example embodiment in FIG. 3A described above. FIG. 14 is a cross-sectional diagram illustrating a region taken along line I-I' in FIG. 4, illustrating a semiconductor device according to an example embodiment of the present inventive concept.

In the modified example, among FIGS. 13 and 14, referring to FIG. 13, the first upper gate line UL1*a* of the first memory mat MAT1 described in FIG. 3A may be modified to a first upper gate line UL1*a*' having a gate pad P1*b* in the first connection region R1*a* and a gate pad Pla in the second connection region R1*b*. The third upper gate line UL2*a* of the second memory mat MAT2 described in FIG. 3A may be modified to third upper gate line UL2*a*' having a gate pad P2*a* in the third connection region R2*b* and a gate pad P2*b* in the fourth connection region R2*a*.

Accordingly, a voltage may be applied to the first upper gate line UL1*a*' in the +X-direction and the −X-direction through a routing wiring structure 1115*b*1 electrically connected to the gate pad P1*b* in the first connection region R1*a* and a routing wiring structure 1115*a*1 electrically connected to the gate pad P1*b* in the second connection region R1*b*, and a voltage may be applied to the third upper gate line UL2*a* in the +X-direction and the −X-direction through a routing wiring structure 1115*a*2 electrically connected to the gate pad P2*a* in the third connection region R2*b* and a routing wiring structure 1115*b*2 electrically connected to the gate pad P2*b* in the fourth connection region R2*a*. Accordingly, since voltage may be applied more swiftly to the entire first and third upper gate lines UL1*a*' and UL2*a*', performance of transistors including the first and third upper gate lines UL1*a*' and UL2*a*' as gate electrodes may be increased. Referring to FIG. 14 among FIGS. 13 and 14, the first upper gate electrodes (GE_Ua in FIG. 5) described above may be modified to first upper gate electrodes GE_Ua' having gate pads on both sides as illustrated in FIG. 14. For example, the first upper gate electrodes GE_Ua' may have first-side gate pads G_P1*a* disposed in the first connection region R1*a* and second-side gate pads G_P1*a*' disposed in the second connection region R1*b*. The first-side gate pads G_P1*a* may be arranged in a staircase shape sequentially lowered as the first gate pads G_P1*a* are further disposed in the −X-direction. The second-side gate pads G_P1*a*' may be arranged in a staircase shape sequentially lowered as the first gate pads G_P1*a*' are further disposed in the +X-direction. The first upper gate electrodes GE_Ua' may correspond to the first upper gate line UL1*a*' described in FIG. 13. In FIG. 14, regions "A," "B," "C," and "D" may be substantially the same as the enlarged portions in FIGS. 6A, 6B, 6C, and 6D described above.

The gate contact plugs 160 described above may further include third gate contact plugs 160*c* that are connected to the second-side gate pads G_P1*a*' of the first upper gate electrodes GE_Ua'. Accordingly, a voltage may be applied to the first upper gate electrodes GE_Ua' through the first gate contact plugs 160*a*, which are electrically connected to the first-side gate pads G_P1*a* disposed in the first connection region R1*a*, and the third gate contact plugs 160*b*, which are electrically connected to the second-side gate pads G_P1*a*' disposed in the second connection region R1*b*. The first upper gate electrodes GE_Ua' may correspond to the first upper gate line (UL1*a*' in FIG. 13). Accordingly, performance of transistors including the first upper gate electrodes GE_Ua' as the gate electrode may be increased.

Figure 15:
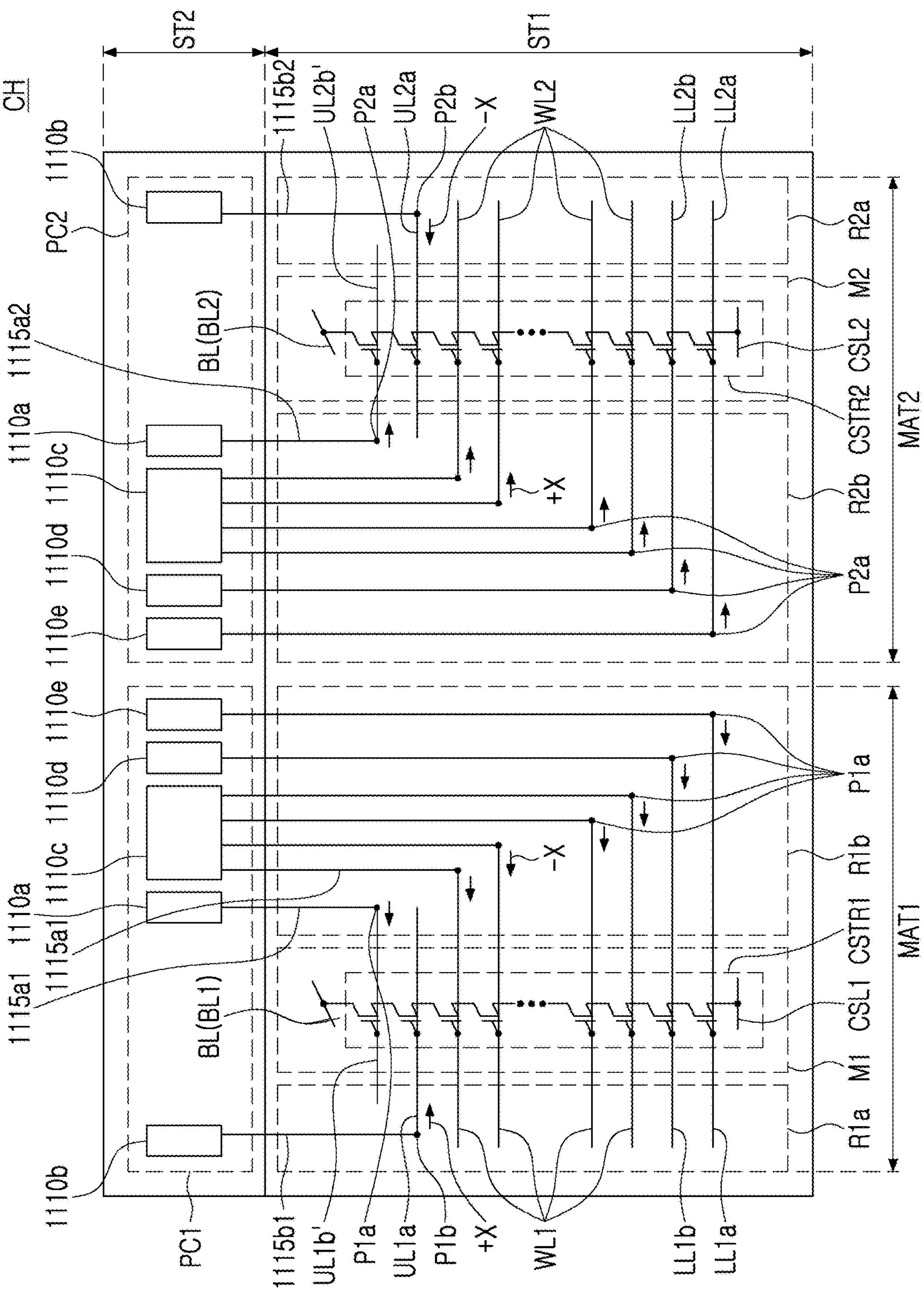
FIG. 15 is a diagram illustrating a semiconductor device according to an example embodiment of the present inventive concept.

FIG. 15 is a diagram illustrating a semiconductor device according to an example embodiment of the present inventive concept. For example, the diagram of FIG. 15 may be a modified example of the example embodiment in FIG. 3A described above.

In the modified example, referring to FIG. 15, the second upper gate line UL1*b* of the first memory mat MAT1 illustrated in FIG. 3A may be modified to a second upper gate line UL1*b*' having a gate pad P1*a* disposed in the second connection region R1*b*. The fourth upper gate line UL2*b* of the second memory mat MAT2 described in FIG. 3A may be modified to a fourth upper gate line UL2*b*' having a gate pad P2*a* disposed in the third connection region R2*b*.

Accordingly, a voltage may be applied to the second upper gate line UL1*b*' in the −X-direction through the routing wiring structure 1115*a*1 electrically connected to the gate pad P1*a* in the second connection region R1*b*, and a voltage may be applied to the fourth upper gate line UL2*b*' in the +X-direction through a routing wiring structure 1115*a*2 electrically connected to the gate pad P2*a* in the third connection region R2*b*. Accordingly, the direction in which a voltage is applied to the first upper gate line UL1*a* and the second upper gate line UL1*b*' may be different, and the direction in which the voltage is applied to the third upper gate line UL2*a* and the fourth upper gate line UL2*b*' may be different. The second upper gate electrode (GE_Ub in FIG. 5) described above, corresponding to the second upper gate line UL1*b*', may be modified to a second upper gate electrode having a gate pad disposed in the second connection region R1*b*.

Figure 16:
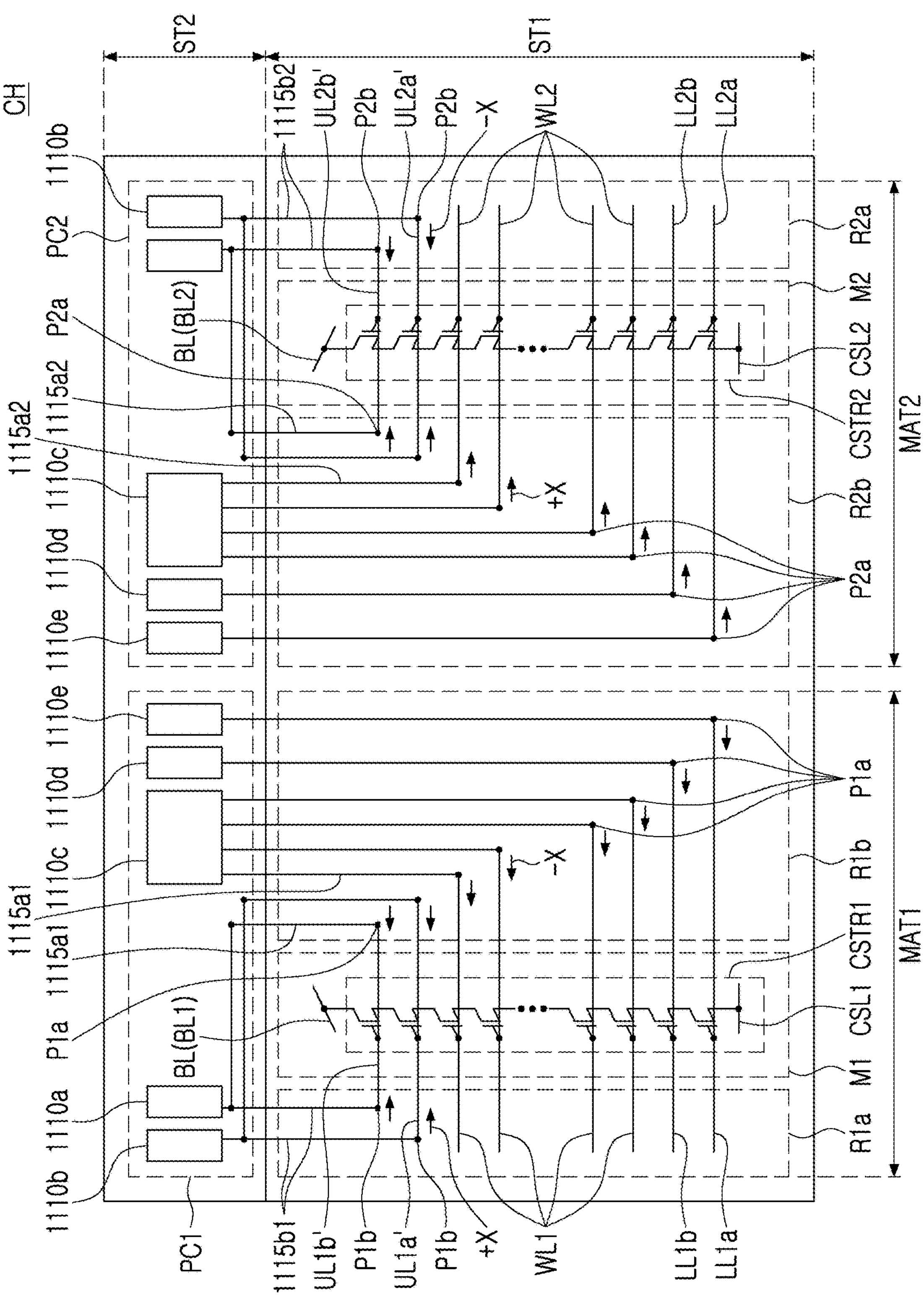
FIGS. 16 and 17 are diagrams illustrating a semiconductor device according to an example embodiment of the present inventive concept.

FIG. 16 is a diagram illustrating a semiconductor device according to an example embodiment of the present inventive concept. For example, the diagram of FIG. 16 may be a modified example of the example embodiment in FIG. 3A described above, and FIG. 17 is a cross-sectional diagram illustrating a region taken long I-I' in FIG. 4, illustrating a semiconductor device according to an example embodiment of the present inventive concept.

Figure 17:
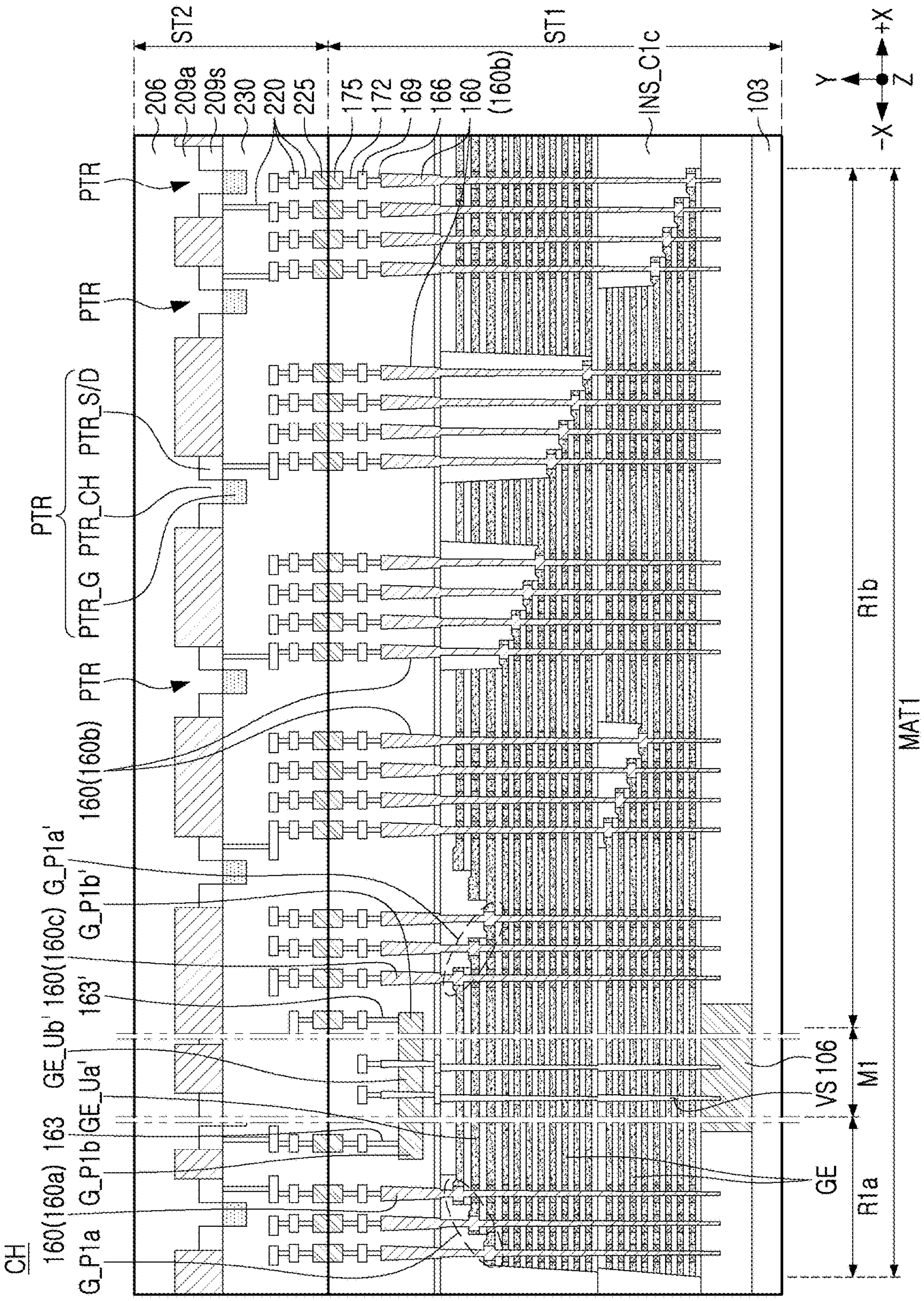

In a modified example, referring to FIG. 16 among FIGS. 16 and 17, the first and second upper gate lines UL1*a* and UL1*b* described in FIG. 3A may be modified to first and second upper gate lines UL1*a*', UL1*b*' having a gate pad P1*b* in the first connection region R1*a* and a gate pad P1*a* in the second connection region R1*b*. The third and fourth upper gate lines UL2*a* and UL2*b* of the second memory mat MAT2 described in FIG. 3A may be modified to third and fourth upper gate lines UL2*a*' and UL2*b*' having a gate pad P2*a* in the third connection region R2*b* and a gate pad P2*b* in the fourth connection region R2*a*.

Accordingly, a voltage may be applied to the first and second upper gate lines UL1*a*' and UL1*b*' in the +X-direction and the −X-direction through routing wiring structures 1115*a*1 and 1115*a*2 electrically connected to the gate pads P1*b* in the first connection region R1*a* and the gate pads P1*a* in the second connection region R1*b*, and a voltage may be applied to the third and fourth upper gate lines UL2*a*' and UL2*b*' in the +X-direction and the −X-direction through routing wiring structures 1115*a*2, 1115*b*2 electrically connected to the gate pads P2*a* in the third connection region R2*b* and the gate pads P2*b* in the fourth connection region R2*a*.

Referring to FIG. 17 together with FIG. 16, as described in FIG. 14, the first upper gate electrodes GE_Ua' may have first-side gate pads G_P1*a* in the first connection region R1*a* and the second-side gate pads G_P1*a*' in the second connection region R1*b*. The second upper gate electrode GE_Ub in FIG. 14 may be modified to a second upper gate electrode GE_Ub' having a first-side gate pad G_P1*b*, which is disposed in the first connection region R1*a*, and a second-side gate pad G_P1*b*', which is disposed in the second connection region R1*b*.

A voltage may be applied to both sides of the second upper gate electrode GE_Ub' through a first upper gate contact plug 163 that is disposed on the first-side gate pad G_P1*b*, which is disposed in the first connection region R1*a*, and a second upper gate contact plug 163' that is disposed on the second-side gate pad G_P1*b*', which is disposed in the second connection region R1*b*.

The first-side gate pads G_P1*a* and G_P1*b* disposed in the first connection region R1*a* may be arranged as a staircase structure sequentially lowered as the gate pads G_P1*a* and G_P1*b* are further disposed in the −X-direction. The second-side gate pads G_P1*a*' and G_P1*b*' disposed in the second connection region R1*b* may be arranged as a staircase structure sequentially lowered the gate pads G_P1*a*' and G_P1*b*' are further disposed in the +X-direction.

The first upper gate electrodes GE_Ua' may correspond to the first upper gate line (UL1*a*' in FIG. 16), and the second upper gate electrode GE_Ub' may correspond to the second upper gate line (UL1*b*' in FIG. 16). Accordingly, performance of transistors including the first upper gate electrodes GE_Ua' and the second upper gate electrode GE_Ub' as gate electrodes may be increased.

Figure 18:
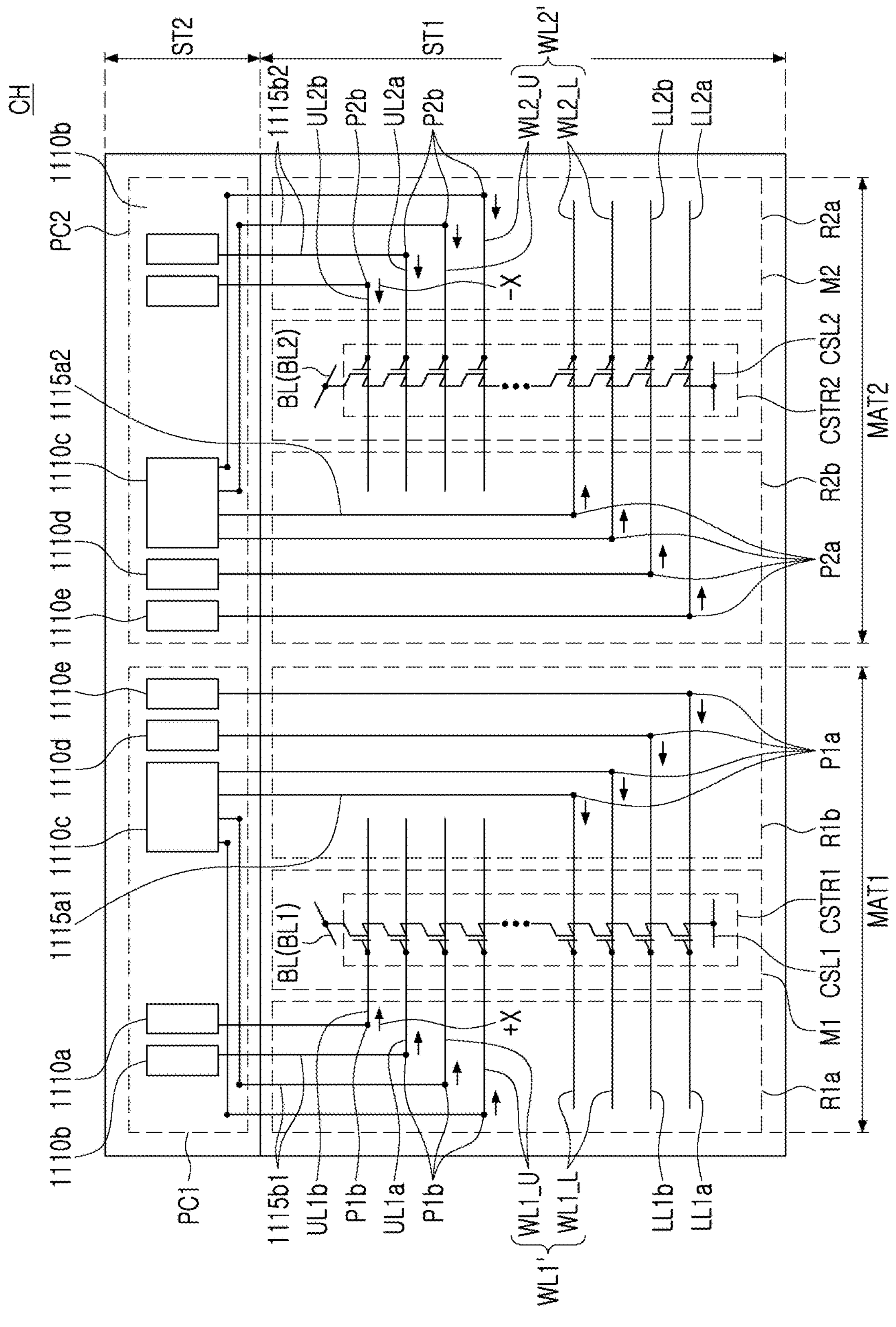
FIGS. 18 and 19 are diagrams illustrating a semiconductor device according to an example embodiment of the present inventive concept.
Figure 19:
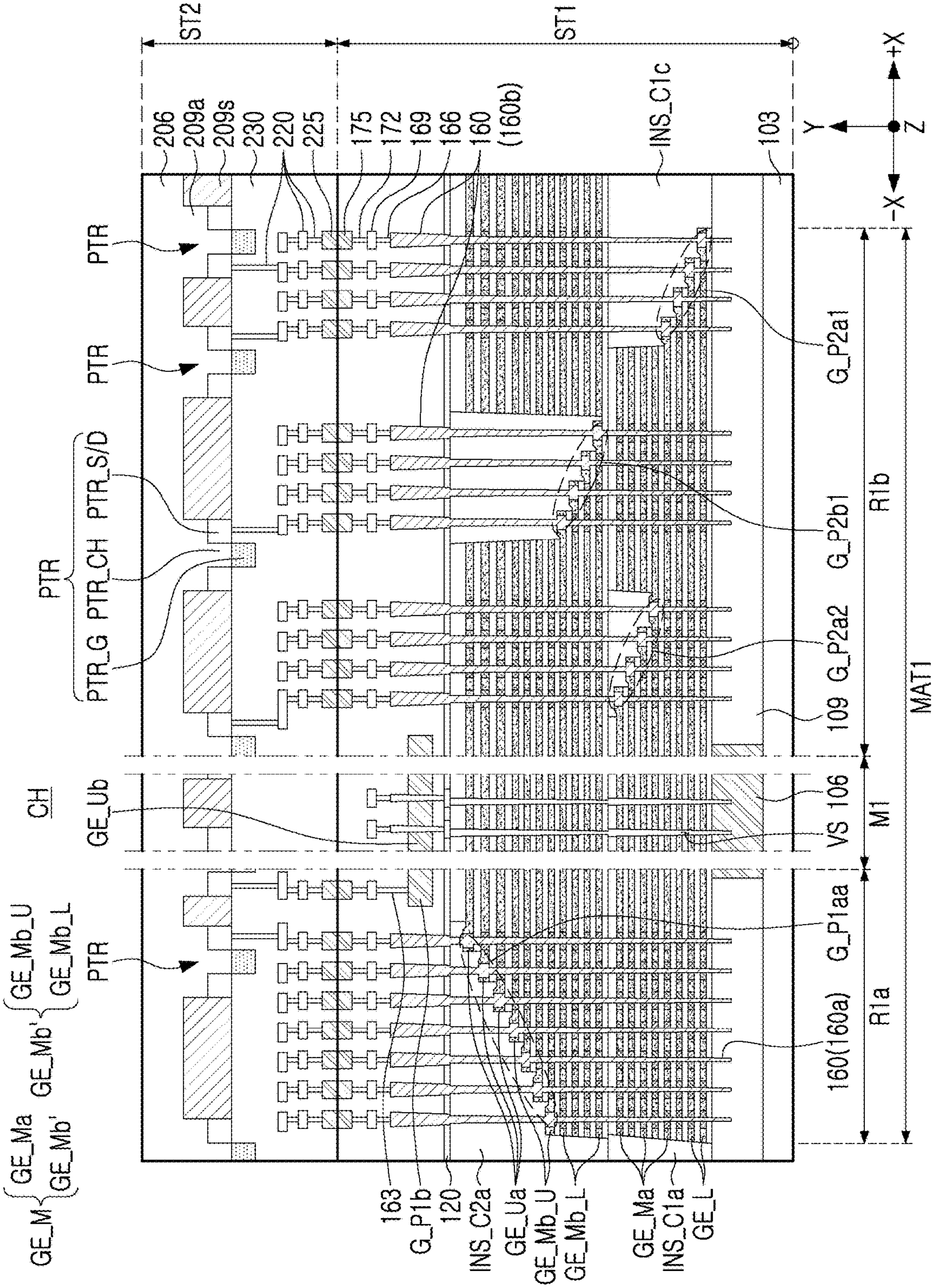

FIG. 18 is a diagram illustrating a semiconductor device according to an example embodiment of the present inventive concept. For example, the diagram of FIG. 18 may be a modified example of the example embodiment in FIG. 3A described above. FIG. 19 is a cross-sectional diagram illustrating a region taken along line I-I' in FIG. 4, illustrating a modified example of a semiconductor device according to an example embodiment of the present inventive concept.

In a modified example, referring to FIG. 18 among FIGS. 18 and 19, the first word lines (WL1 in FIG. 3A) described above may be modified to first lower word lines WL1_L having gate pads P1*a* disposed in the second connection region R1*b* and first upper word lines WL1_U having gate pads P1*b* disposed in the first connection region R1*a*. The first upper word lines WL1_U may be disposed on a level higher than a level of the first lower word lines WL1_L.

A voltage may be applied to the first lower word lines WL1_L in the −X-direction from the second connection region R1*b* toward the first memory cell array region M1, and a voltage may be applied to the first upper word lines WL1_U in the +X-direction from the first connection region R1*a* to the first memory cell array region M1.

The second word lines (WL2 in FIG. 3A) described above may be modified to second lower word lines WL2_L having gate pads P2*a* disposed in the third connection region R2*b* and second upper word lines WL2_U having gate pads P2*b* disposed in the fourth connection region R2*a* WL2'.

A voltage may be applied to the second lower word lines WL2_L in the +X-direction from the third connection region R2*b* toward the second memory cell array region M2, and a voltage may be applied to the −X-direction from the fourth connection region R2*a* to the second memory cell array region M2.

Referring to FIG. 19 together with FIG. 18, as described above, the first intermediate gate electrodes GE_Ma may have gate pads G_P2*al* and G_P2*a*2 disposed in the second connection region R1*b*, as described above.

The second intermediate gate electrodes GE_Mb described above may be modified to second intermediate gate electrodes GE_Mb' including a 2-1 intermediate gate electrodes GE_Mb_L having gate pads G_P2*b*1 disposed in the second connection region R1*b* and 2-2 intermediate gate electrodes GE_Mb_U having gate pads disposed in the first connection region R1*a*.

The second intermediate gate electrodes GE_Mb' and the first upper gate electrodes GE_Ua may have gate pads G_P1*a*a arranged in a staircase shape sequentially lowered as the gate pads G_P1*a*a are further disposed in the −X-direction. The gate pads G_P1*a*a may be electrically connected to first gate contact plugs 160*a*.

In an example embodiment of the present inventive concept, the first intermediate gate electrodes GE_Ma and the 2-1 intermediate gate electrodes GE_Mb_L may be the first lower word lines WL1_L described in FIG. 18, and the 2-2 intermediate gate electrodes GE_Mb_U may be the first upper word lines WL1_U described in FIG. 18.

Figure 20:
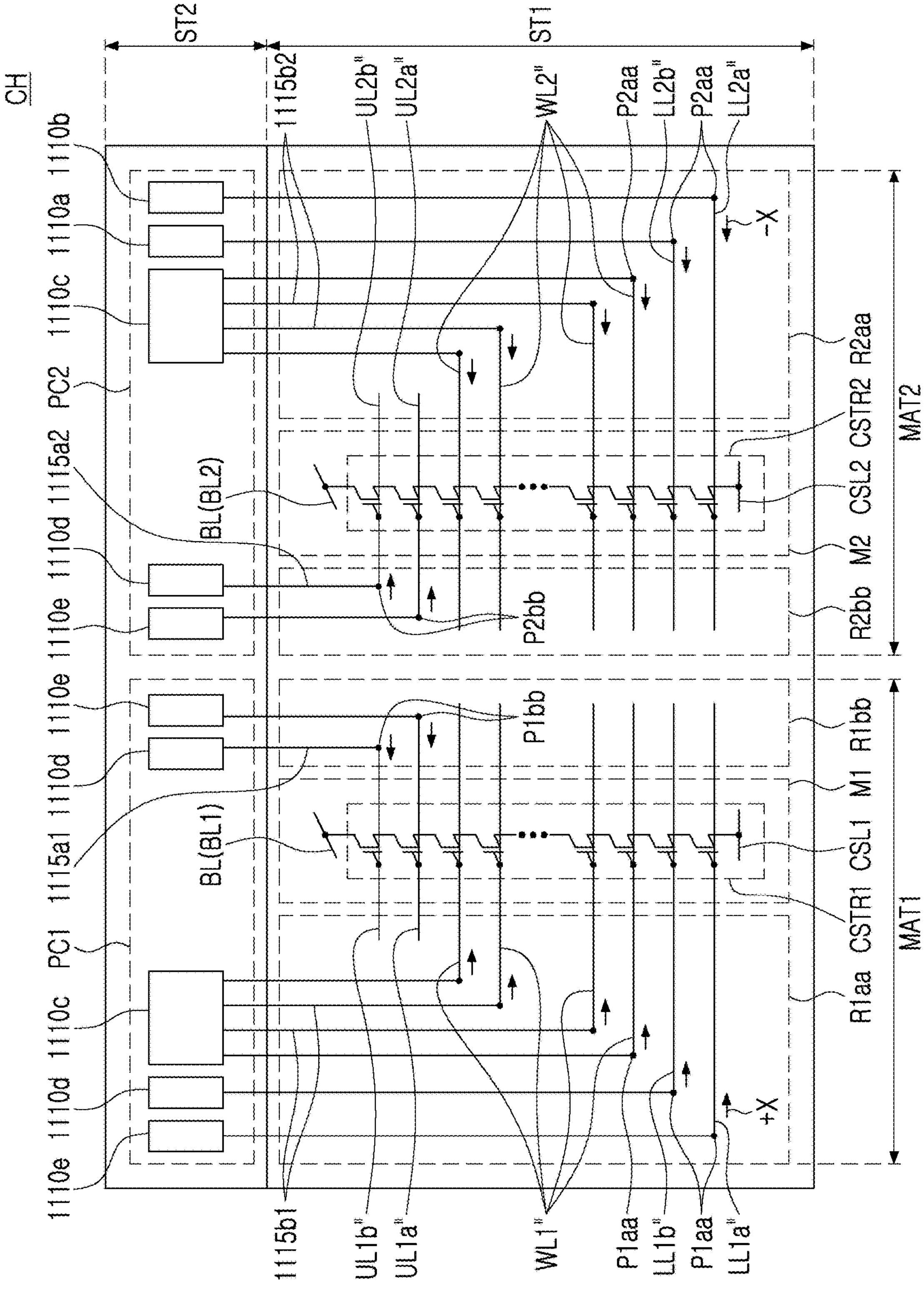
FIGS. 20, 21, and 22 are diagrams illustrating a semiconductor device according to an example embodiment of the present inventive concept.
Figure 21:
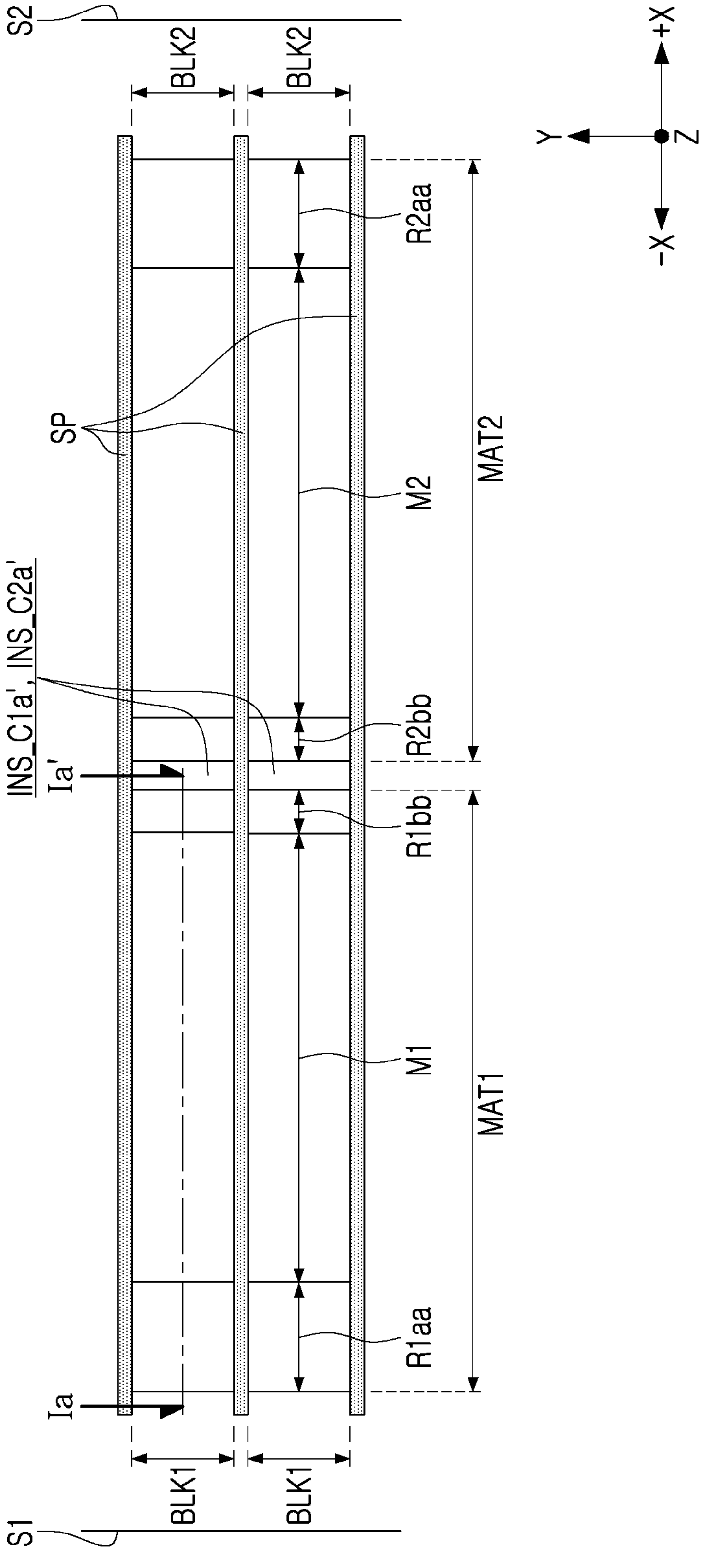
Figure 22:
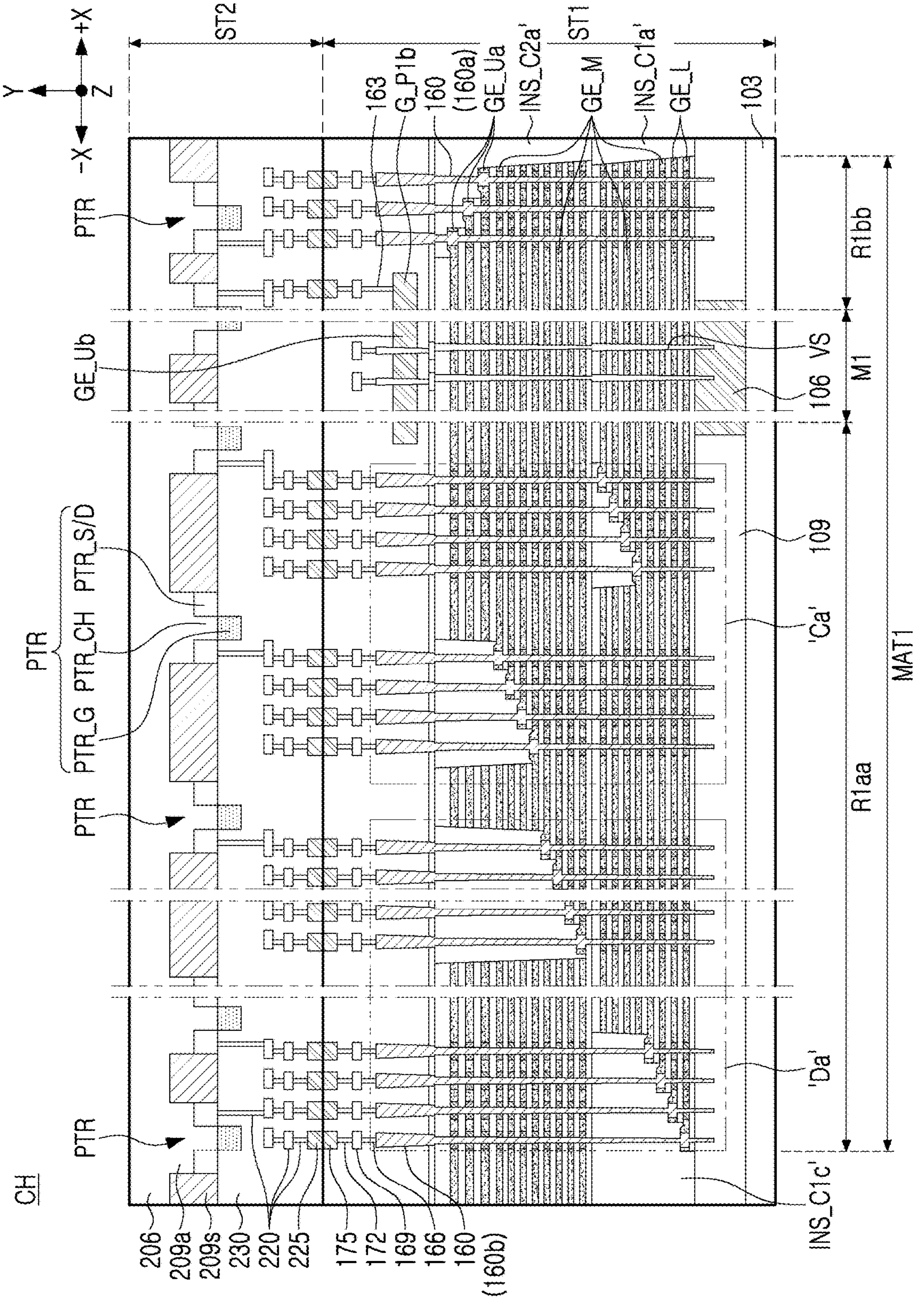

FIG. 20 is a diagram illustrating a semiconductor device according to an example embodiment of the present inventive concept. For example, the diagram of FIG. 20 may be a modified example of the example embodiment in FIG. 3A described above. FIG. 21 is a diagram illustrating a semiconductor device according to an example embodiment of the present inventive concept. For example, the diagram of FIG. 21 may be a modified example of the example embodiment in FIG. 4 described above. FIG. 22 is a cross-sectional diagram illustrating a region taken along Ia-Ia' in FIG. 21, illustrating a modified example of the cross-sectional structure in FIG. 5.

In a modified example, referring to FIG. 20 among FIGS. 20, 21 and 22, the first connection region R1*a* described above may be modified to the first connection region R1*aa* having an increased width in the +X-direction, and the second connection region R1*b* described above may be modified to a second connection region R1*bb* having a reduced width in the +X-direction. Further, the third connection region R2*b* described above may be modified to a third connection region R2*bb* having a reduced width in the +X-direction, and the fourth connection region R2*a* described above may be modified to a fourth connection region R2*aa* having an increased width in the +X-direction. A width of each of the first and fourth connection regions R1*aa* and R2*aa* may be greater than a width of each of the second and third connection regions R1*bb* and R2*bb* in the +X-direction.

The first and second lower gate lines LL1*a* and LL1*b* described in FIG. 3A may be modified to first and second lower gate lines LL1*a*" and LL1*b*" having gate pads P1*aa* disposed in the first connection region R1*aa*.

The first word lines WL1 described in FIG. 3A may be modified to first word lines WL1" having gate pads P1*aa* disposed in the first connection region R1*aa*.

The first and second upper gate lines UL1*a* and UL1*b* described in FIG. 3A may be modified to first and second upper gate lines UL1*a*" and UL1*b*" having gate pads P1*bb* disposed in the second connection region R1*bb*.

The third and fourth lower gate lines LL2*a* and LL2*b* described in FIG. 3A may be modified to third and fourth lower gate lines LL2*a*" and LL2*b*" having gate pads P2*aa* disposed in the fourth connection region R2*aa*.

The second word lines WL2 described in FIG. 3A may be modified to second word lines WL2" having gate pads P2*aa* disposed in the fourth connection region R2*aa*.

The third and fourth upper gate lines UL2*a* and UL2*b* described in FIG. 3A may be modified to third and fourth upper gate lines UL2*a*" and UL2*b*" having gate pads P2*bb* disposed in the third connection region R2*bb*.

Referring to FIGS. 21 and 22 along with FIG. 20, the first connection region R1*a* described above may be modified to the first connection region R1*aa* having an increased width in the +X-direction. In addition, the second connection region described above R1*b* may be modified to the second connection region R1*bb* having a reduced width in the +X-direction, and the third connection region R2*b* described above may be modified to a third connection region R2*bb* having a reduced width in the +X-direction. Further, the fourth connection region R2*a* may be modified to a fourth connection region R2*aa* having an increased width in the +X-direction.

In the +X-direction, a width of each of the first and fourth connection regions R1*aa* and R2*aa* may be greater than a width of each of the second and third connection regions R1*bb* and R2*bb*.

In the example embodiment of the present inventive concept, with reference to FIGS. 21 and 22, a cross-sectional structure of the second memory mat MAT2 in the +X-direction may be substantially the same as the cross-sectional structure in FIG. 5 described above. The cross-sectional structure in FIG. 23 may be substantially the same as the cross-sectional structure in FIG. 5, which may be mirror-symmetrical in the +X-direction or the −X-direction. Accordingly, in the first memory mat MAT1, gate pads of the lower gate electrodes GE_L and the intermediate gate electrodes GE_M may be disposed in the first connection region R1*aa*, and gate pads of the upper gate electrodes GE_Ua and GE_Ub may be disposed in the second connection region R1*bb*.

In FIG. 21, the lower gate electrodes GE_L may correspond to the first and second lower gate lines LL1*a*" and LL1*b*" in FIG. 20. Further, the intermediate gate electrodes GE_M may correspond to the first word lines WL1" in FIG. 20, and the first and second upper gate electrodes GE_Ua and GE_Ub may correspond to the first and second upper gate lines UL1*a*" and UL1*b*" in FIG. 20.

In FIG. 22, a region "Ca" may have the same structure formed by modifying the enlarged diagram of the portion in FIG. 6C to be mirror-symmetrical in the +X-direction, and region "Da" may the same structure formed by modifying the enlarged diagram of the portion in FIG. 6D to be mirror-symmetrical in the +X-direction.

The first external capping insulating structure (INS_C1*a* in FIG. 6B) and the second external capping insulating structure (INS_C2*a* in FIG. 6B) described above may be modified to the first capping insulating structure INS_C1*a*' and the second capping insulating structure INS_C2*a*' disposed between the first memory mat MAT2 and the second memory mat MAT2.

Figure 23:
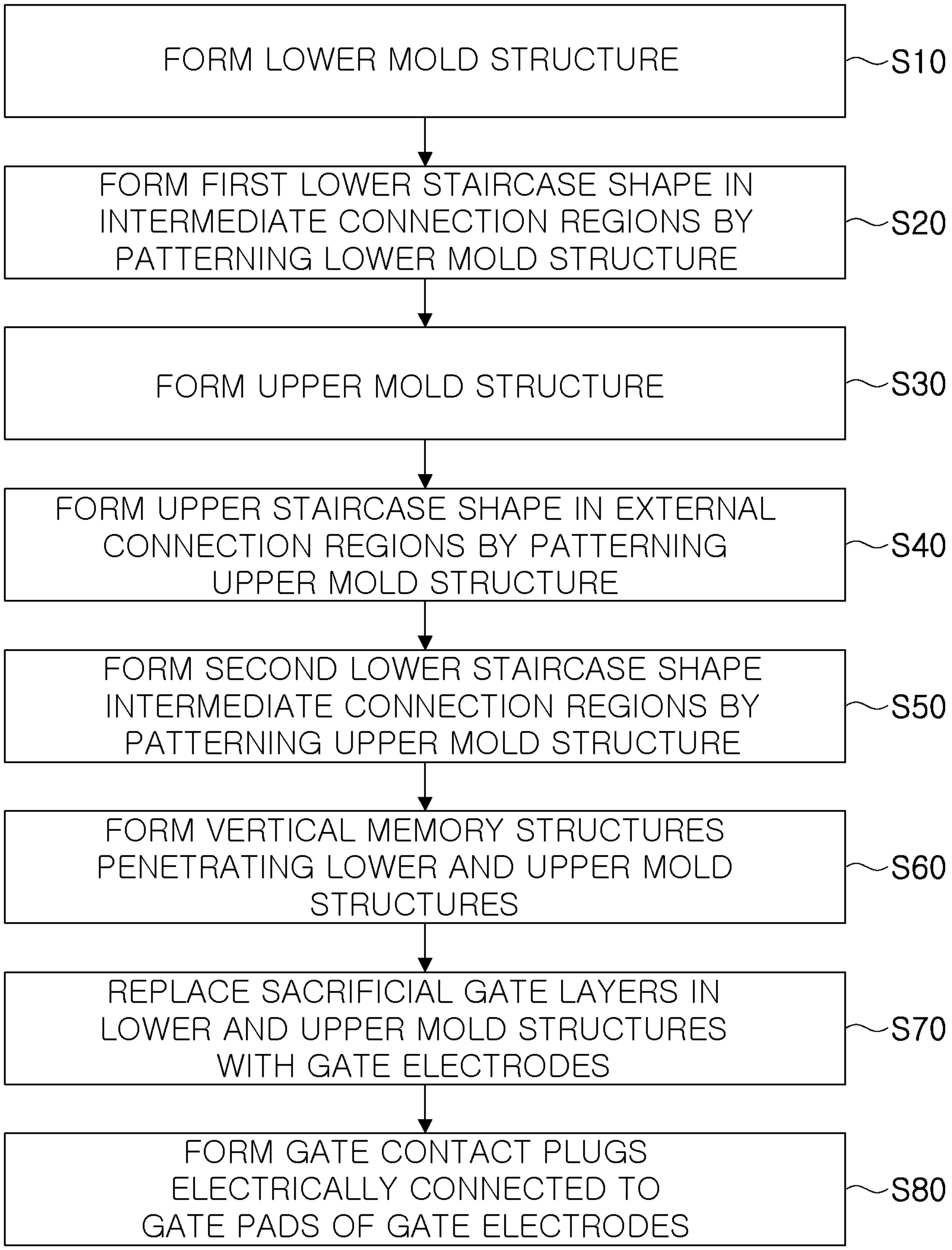
FIG. 23 is a flowchart illustrating a method of manufacturing a semiconductor device according to an example embodiment of the present inventive concept.

Thereafter, an example of a method of manufacturing a semiconductor device according to an example embodiment of the present inventive concept will be described with reference to FIG. 23. FIG. 23 is a flowchart illustrating a method of manufacturing a semiconductor device according to an example embodiment of the present inventive concept.

Referring to FIG. 23, a lower mold structure may be formed (S10). The lower mold structure may include first interlayer insulating layers and first sacrificial gate layers alternately stacked. By patterning the lower mold structure, a first lower staircase shape may be formed in intermediate connection regions (S20).

The intermediate connection regions may be the second and third connection regions R1*b* and R2*b* described above.

The first lower staircase shape may be the staircase shape of the gate pads (G_P2*a*2 in FIG. 6C and G_P2*al* in FIG. 6D) of the lower and first intermediate gate electrodes (GE_L, GE_Ma in FIGS. 6C and 6D) described in the aforementioned example embodiments.

An upper mold structure may be formed (S30). The upper mold structure may include second interlayer insulating layers and second sacrificial gate layers alternately stacked on each other. By patterning the upper mold structure, an upper staircase shape may be formed in external connection regions (S40).

The external connection regions may be the first and fourth connection regions R1*a* and R2*a* described above.

The upper staircase shape may be the staircase shape of the gate pads (G_P1*a* in FIG. 6B) of the first upper gate electrodes GE_Ua described in the aforementioned example embodiments.

By patterning the upper mold structure, a second lower staircase shape may be formed in the intermediate connection regions (S50).

The second lower staircase shape may be the staircase shape of the gate pads (G_P2*a*2 in FIG. 6C and G_P2*al* in FIG. 6D) of the lower and first intermediate gate electrodes (GE_L, GE_Ma in FIGS. 6C and 6D) described in the aforementioned example embodiments.

Vertical memory structures penetrating the lower and upper mold structures may be formed (S60).

In an example, the vertical memory structures may be the vertical memory structures (VS' in FIGS. 7 and 8A) as in FIGS. 7 and 8A.

In another example, when the vertical memory structures are vertical memory structures (VS in FIGS. 5 and 6A) as in FIGS. 5 and 6A, the forming the vertical memory structures may include forming the first vertical memory structure (VS_L in FIG. 6A) penetrating the lower and upper mold structures, and forming a buffer insulating layer (120 in FIGS. 5 and 6A to 6D) on the upper mold structure. The forming of the vertical memory structures may further include penetrating the buffer insulating layer (120 in FIGS. 5 and 6A to 6D) and forming a connection structure (VS_C in FIG. 6A) connected to the first vertical memory structure (VS_L in FIG. 6A), and forming a second upper gate electrode (GE_Ub in FIGS. 5 and 6A) on 120 of the buffer insulating layer (FIGS. 5 and 6A to 6D). The forming of the vertical memory structures may additionally include forming a second vertical memory structure (VS_U in FIG. 6A) penetrating the second upper gate electrode (GE_Ub in FIGS. 5 and 6A).

The sacrificial gate layers in the lower and upper mold structures may be replaced with gate electrodes (S70).

The gate electrodes may be the gate electrodes (FIGS. 7, 8A and 8B) as in FIGS. 7, 8A and 8B or the lower, intermediate, and first gate electrodes GE_L, GE_M, GE_Ua as in FIGS. 5 and 6A to 6D. The forming the gate electrodes (FIGS. 7, 8A and 8B) or the lower, intermediate, and first gate electrodes GE_L, GE_M, and GE_Ua as in FIGS. 5 and 6A to 6D may include forming separation trenches penetrating the lower and upper mold structures and exposing sacrificial gate layers in the lower and upper mold structures, and forming void spaces by removing the sacrificial gate layers exposed by the separation trenches. The forming the gate electrodes (FIGS. 7, 8A and 8B) or the lower, intermediate, and first gate electrodes GE_L, GE_M, and GE_Ua as in FIGS. 5 and 6A to 6D may further include forming the gate electrodes (FIGS. 7, 8A and 8B) in the void spaces, and forming separation structures (SP in FIG. 4) in the separation trenches.

When the gate electrodes are the lower, intermediate, and first gate electrodes GE_L, GE_M, GE_Ua as in FIGS. 5 and 6A to 6D, after forming the lower, intermediate, and first gate electrodes GE_L, GE_M, and GE_Ua, the buffer insulating layer (120 in FIGS. 5 and 6A to 6D), the connection structure (VS_C in FIG. 6A), the second upper gate electrode (GE_Ub in FIGS. 5 and 6A), and the second vertical memory structure (VS_U in FIG. 6A) described above may be formed.

Gate contact plugs electrically connected to the gate pads of the gate electrodes may be formed (S80). The gate contact plugs may be the gate contact plugs 160 described in the aforementioned example embodiments.

Figure 24:
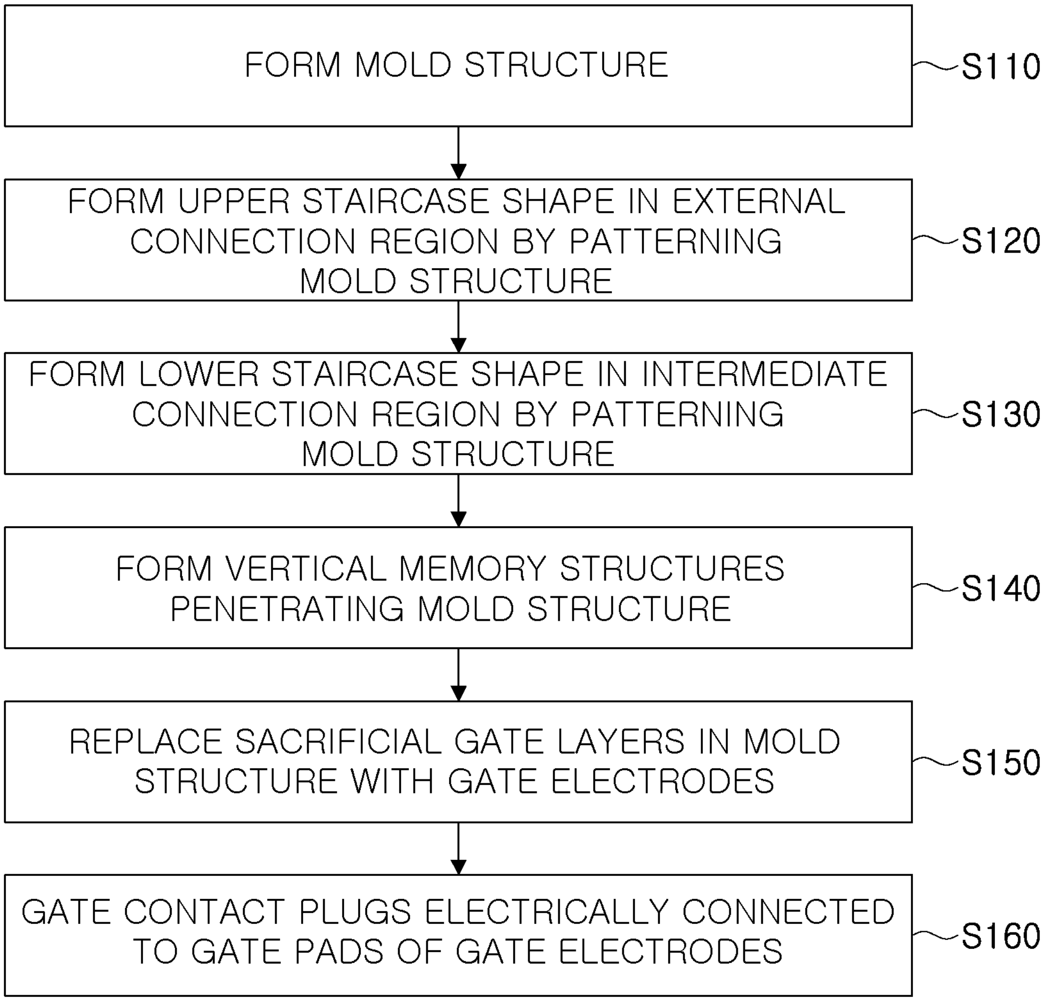
FIG. 24 is a flowchart illustrating a method of manufacturing a semiconductor device according to an example embodiment of the present inventive concept.

Thereafter, an example of a method of manufacturing a semiconductor device according to an example embodiment of the present inventive concept will be described with reference to FIG. 24. FIG. 24 is a flowchart illustrating a method of manufacturing a semiconductor device according to an example embodiment of the present inventive concept.

Referring to FIG. 24, a lower mold structure may be formed (S110). The mold structure may include interlayer insulating layers and sacrificial gate layers alternately stacked on each other. By patterning the mold structure, an upper staircase shape may be formed in the external connection region (S120).

The external connection regions may be the first and fourth connection regions R1*a* and R2*a* described above. The upper staircase shape may be the staircase shape of the gate pads of the first upper gate electrodes (GE_Ua in FIGS. 9 and 10) described in the aforementioned example embodiments.

By patterning the mold structure, a lower staircase shape may be formed in the intermediate connection region (S130).

The intermediate connection region may be the second and third connection regions R1*b* and R2*b* described above.

The lower staircase shape may be the staircase shape of the gate pads (G_P2*a*', G_P2*b*' in FIG. 9 and G_P2*aa*, G_P2*bb* in FIG. 10) of the lower and first intermediate gate electrodes (GE_La and GE_Ma in FIGS. 9 and 10).

By patterning the upper mold structure, a second lower staircase shape may be formed in the intermediate connection regions (S50).

The second lower staircase shape may be the staircase shape of the gate pads (G_P2*a*2 in FIG. 6C and G_P2*al* in FIG. 6D) of the lower and first intermediate gate electrodes (GE_L, GE_Ma in FIGS. 6C and 6D) described in the aforementioned example embodiments.

Vertical memory structures penetrating the mold structure may be formed by the same process as in FIG. 23 (S140).

The sacrificial gate layers in the mold structure may be replaced with gate electrodes by the same process as in FIG. 23 (S150).

Gate contact plugs electrically connected to gate pads of the gate electrodes may be formed by the same process as in FIG. 23 (S160).

According to the aforementioned example embodiments of the present inventive concept, a semiconductor device including connection regions in which gate pads are disposed on both sides of the memory cell array region and a data storage system including the same may be provided. By disposing connection regions on both sides of the memory cell array region, the space for disposing gate pads may be reduced and optimized, thereby increasing integration density of the semiconductor device.

In addition, by disposing the first connection region where the gate pads of the upper gate electrodes are disposed on one side of the memory cell array region, and disposing the second connection region in which the gate pads of the word lines are disposed on the other side of the memory cell array region, peripheral circuits electrically connected to the upper gate electrodes and word lines may be effectively disposed, and a distance between the upper gate electrodes and the word lines, and the peripheral circuits may be reduced, thereby increasing a signal transmission speed. Accordingly, performance of semiconductor devices may be increased.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor device, comprising:

a first structure having a first side surface and a second side surface opposing each other, and including a first memory block and a second memory block sequentially arranged in a first direction from the first side surface to the second side surface; and a second structure including a peripheral circuit and overlapping the first structure, wherein the first memory block has a first connection region, a first memory cell array region, and a second connection region sequentially arranged in the first direction, wherein the second memory block has a third connection region, a second memory cell array region, and a fourth connection region sequentially arranged in the first direction, wherein the first memory block includes first gate electrodes that are spaced apart from each other and extend from the first connection region to the second connection region passing through the first memory cell array region, wherein the second memory block includes second gate electrodes that are spaced apart from each other and extend from the third connection region to the fourth connection region passing through the second memory cell array region, wherein the first gate electrodes of the first memory block include:

first word lines having first word line pads that are disposed in the second connection region; and a first upper gate line having a first upper gate pad that is disposed in the first connection region and disposed on the first word lines, wherein the second gate electrodes of the second memory block include:

second word lines having second word line pads that are disposed in the third connection region; and a second upper gate line having a second upper gate pad that is disposed in the fourth connection region and disposed on the second word lines, and wherein the first structure includes:

first word line contact plugs connected to the first word line pads;

a first upper gate contact plug connected to the first upper gate pad;

second word line contact plugs connected to the second word line pads; and a second upper gate contact plug connected to the second upper gate pad.

2. The semiconductor device of claim 1, wherein the first word line contact plugs penetrate the first word line pads and are in contact with the first word line pads, wherein the first upper gate contact plug penetrates the first upper gate pad and is in contact with the first upper gate pad, wherein the second word line contact plugs penetrate the second word line pads and are in contact with the second word line pads, and wherein the second upper gate contact plug penetrates the second upper gate pad and is in contact with the second upper gate pad.

3. The semiconductor device of claim 1, wherein the first upper gate line further has a first inner upper gate pad disposed in the second connection region, wherein the second upper gate line further has a second inner upper gate pad disposed in the third connection region, wherein the first structure further includes:

a first inner upper gate contact plug connected to the first inner upper gate pad; and a second inner upper gate contact plug connected to the second inner upper gate pad.

4. The semiconductor device of claim 1, wherein the first gate electrodes further include a third upper gate line that is disposed on the first upper gate line, wherein the second gate electrodes further include a fourth upper gate line that is disposed on the second upper gate line, wherein the first structure further includes:

a third upper contact plug connected to the third upper gate line; and a fourth upper contact plug connected to the fourth upper gate line.

5. The semiconductor device of claim 4, wherein the third upper gate line includes a third upper gate pad that is disposed in the first connection region and in contact with the third upper contact plug, wherein the fourth upper gate line includes a fourth upper gate pad that is disposed in the fourth connection region and in contact with the fourth upper contact plug, and wherein the first structure includes:
a third upper contact plug connected to the third upper gate pad; and
a fourth upper contact plug connected to the fourth upper gate pad.

6. The semiconductor device of claim 4, wherein the third upper gate line includes a third upper gate pad that is disposed in the second connection region and in contact with the third upper contact plug, and
wherein the fourth upper gate line includes a fourth upper gate pad that is disposed in the third connection region and in contact with on the fourth upper contact plug.

7. The semiconductor device of claim 4, wherein each of the first and second word lines has a first thickness, and
wherein each of the first upper gate line and the second upper gate line has a second thickness that is greater than the first thickness.

8. The semiconductor device of claim 7, wherein each of the third upper gate line and the fourth upper gate line has a third thickness that is greater than the second thickness.

9. The semiconductor device of claim 1, wherein the first gate electrodes include third word lines disposed on a level higher than a level of the first word lines and disposed on a level lower than a level of the first upper gate line,
wherein the second gate electrodes further include fourth word lines disposed on a level higher than a level of the second word lines, and disposed on a level lower than a level of the second upper gate line,
wherein the third word lines have third word line pads disposed in the first connection region,
wherein the fourth word lines have fourth word line pads disposed in the fourth connection region, and
wherein the first structure further includes:
third word line contact plugs connected to the third word line pads; and
fourth word line contact plugs connected to the fourth word line pads.

10. The semiconductor device of claim 1, wherein the first gate electrodes of the first memory block further include a first lower gate line that is disposed on a level lower than a level of the first word lines,
wherein the second gate electrodes of the second memory block further include a second lower gate line disposed on a level lower than a level of the second word lines,
wherein the first lower gate line has a first lower gate pad disposed in the second connection region,
wherein the second lower gate line has a second lower gate pad that is disposed in the third connection region, and
wherein the first structure further includes:
a first lower gate contact plug connected to the first lower gate pad; and
a second lower gate contact plug connected to the second lower gate pad.

11. The semiconductor device of claim 1, further comprising:
a capping insulating structure disposed between the first memory block and the second memory block,
wherein a portion of the capping insulating structure covers the first word line pads, and
wherein the first word line contact plugs penetrate a portion of the capping insulating structure and are in contact with the first word line pads.

12. A semiconductor device, comprising:
a first structure having a first side surface and a second side surface opposing each other, and including a first connection region, a first memory cell array region, a second connection region, a third connection region, a second memory cell array region, and a fourth connection region sequentially arranged from the first side surface in a first direction toward the second side surface; and
a second structure including a peripheral circuit and overlapping the first structure,
wherein the first structure includes:
first-side conductive layers disposed in the first connection region, the first memory cell array region, and the second connection region, the first-side conductive layers extending from the first connection region to the second connection region passing through the first memory cell array region;
a first vertical memory structure penetrating the first-side conductive layers in the first memory cell array region;
second-side conductive layers disposed in the third connection region, the second memory cell array region, and the fourth connection region, wherein the second-side conductive layers extending from the third connection region to the fourth connection region passing through the second memory cell array region; and
a second vertical memory structure penetrating the second-side conductive layers in the second memory cell array region,
wherein the first-side conductive layers include:
a first lower conductive group having first lower pads that are arranged in a staircase shape in the second connection region; and
a first upper conductive group disposed on a level higher than a level of the first lower conductive group and having first upper pads that are arranged in a staircase shape in the first connection region,
wherein the second-side conductive layers include:
a second lower conductive group disposed at a same level as the first lower conductive group and having second lower pads that are arranged in a staircase shape in the third connection region; and
a second upper conductive group disposed at a same level as the first upper conductive group and having second upper pads that are arranged in a staircase shape in the fourth connection region.

13. The semiconductor device of claim 12, wherein, among the first-side conductive layers, a number of first-side conductive layers of the first lower conductive group is greater than a number of first-side conductive layers of the first upper conductive group.

14. The semiconductor device of claim 12, wherein, among the first-side conductive layers, the first-side conductive layers of the first lower conductive group include first lower word lines, which have first lower word line pads, and second lower word lines, which are disposed on a level higher than a level of the first lower word lines and have second lower word line pads, and
wherein the first structure further includes dummy conductive layers disposed at a same level as the second lower word lines and vertically overlapping the first lower word line pads.

15. The semiconductor device of claim 12, further comprising:
first gate contact plugs connected to the first and second lower pads; and
second gate contact plugs connected to the first and second upper pads.

16. The semiconductor device of claim 12, wherein a thickness of at least one of the first-side conductive layers of the first lower conductive group is greater than a thickness of at least one of the first-side conductive layers of the first upper conductive group.

17. The semiconductor device of claim 12, wherein the first upper conductive group has third upper pads arranged in a staircase shape in the second connection region, and wherein the second upper conductive group has fourth upper pads arranged in a staircase shape in the third connection region.

18. A data storage system, comprising:

a semiconductor device including an input/output pad; and a controller electrically connected to the semiconductor device through the input/output pad and controlling the semiconductor device, wherein the semiconductor device includes:

a first structure having a first side surface and a second side surface opposing each other, and including a first memory block and a second memory block sequentially arranged in a first direction; and a second structure including a peripheral circuit and overlapping the first structure, wherein the first memory block has a first connection region, a first memory cell array region, and a second connection region sequentially arranged in the first direction, wherein the second memory block has a third connection region, a second memory cell array region, and a fourth connection region sequentially arranged in the first direction, wherein the first memory block includes first gate electrodes that are spaced apart from each other in a vertical direction and extend from the first connection region to the second connection region passing through the first memory cell array region, wherein the second memory block includes second gate electrodes that are spaced apart from each other in the vertical direction and extend from the third connection region to the fourth connection region passing through the second memory cell array region, wherein the first gate electrodes of the first memory block include:

first word lines having first word line pads that are disposed in the second connection region; and a first upper gate line having a first upper gate pad that is disposed in the first connection region and disposed on the first word lines, wherein the second gate electrodes of the second memory block includes:

a second word lines having second word line pads that are disposed in the third connection region; and a second upper gate line having a second upper gate pad that is disposed in the fourth connection region and disposed on the second word lines, wherein the first structure includes:

first word line contact plugs connected to the first word line pads;

a first upper gate contact plug connected to the first upper gate pad;

second word line contact plugs connected to the second word line pads; and a second upper gate contact plug connected to the second upper gate pad.

19. The data storage system of claim 18, wherein the first upper gate line further includes a first inner upper gate pad that is disposed in the second connection region, wherein the second upper gate line further includes a second inner upper gate pad that is disposed in the third connection region, and wherein the first structure further includes:

a first inner upper gate contact plug connected to the first inner upper gate pad; and a second inner upper gate contact plug connected to the second inner upper gate pad.

20. The data storage system of claim 18, wherein a thickness of each of the first and second upper gate lines is greater than a thickness of each of the first and second word lines.

* * * * *